United States Patent
Kimura et al.

[11] Patent Number: 6,069,379
[45] Date of Patent: *May 30, 2000

[54] SEMICONDUCTOR DEVICE AND METHOD OF MANUFACTURING THE SAME

[75] Inventors: Hiroshi Kimura; Tadashi Nishimura; Takahiro Tsuruda; Kazutami Arimoto; Tadato Yamagata; Kazuyasu Fujishima, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/968,897

[22] Filed: Nov. 6, 1997

Related U.S. Application Data

[63] Continuation of application No. 08/568,720, Dec. 7, 1995, abandoned.

[30] Foreign Application Priority Data

Dec. 8, 1994 [JP] Japan .................................... 6-305046
Feb. 10, 1995 [JP] Japan .................................... 7-022615

[51] Int. Cl.[7] ...................... H01L 27/108; H01L 29/76; H01L 29/94; H01L 31/119
[52] U.S. Cl. ........................ 257/296; 257/306; 257/408
[58] Field of Search ................... 257/298, 327, 257/306, 548, 296, 297; 438/634, 639, 618, 637, 675

[56] References Cited

U.S. PATENT DOCUMENTS

| | | | |
|---|---|---|---|
| 4,207,618 | 6/1980 | White, Jr. et al. | 365/222 |
| 4,433,468 | 2/1984 | Kawamata | 257/382 |
| 4,512,073 | 4/1985 | Hsu | 257/307 |
| 4,656,732 | 4/1987 | Teng et al. | 257/774 |
| 4,794,563 | 12/1988 | Maeda | 257/303 |
| 4,961,165 | 10/1990 | Ema | 257/297 |
| 4,994,893 | 2/1991 | Ozaki et al. | 257/306 |
| 5,045,899 | 9/1991 | Arimoto | 257/306 |
| 5,047,817 | 9/1991 | Wakamiya et al. | 257/306 |
| 5,066,995 | 11/1991 | Young et al. | 257/384 |

(List continued on next page.)

FOREIGN PATENT DOCUMENTS

| | | | |
|---|---|---|---|
| 3-49259 | 3/1991 | Japan . | |
| 04002134 | 1/1992 | Japan . | |
| 4-68539 | 3/1992 | Japan . | |
| 5-75060 | 3/1993 | Japan . | |
| 05102417 | 4/1993 | Japan | 257/303 |

OTHER PUBLICATIONS

.5μmIsolation Technology Using Advanced PolySilicon Pad LOCOS (APPL), by Toshiyuki Nishihara et al., *IEEE*, 1988.

Selective Oxide Etching to Silicon Nitride: by K. Harashima et al., Proceedings of Spring Seminar of the Japan Society of Applied Physics, 1994.

"Monthly Semiconductor World 1993.10", by Jeffrey Marks et al.

T. Fukasa et al., "A Margin–Free Contact process Using An Al(2)O(3) Etch–Stop Layer For High Density Devices", IEDM Tech. Dig., pp. 837–840, 1992, Dec. 1992.

M. Fukumoto et al., "Double Self–aligned Contact Technology for Shielded Bit line Type Stacked Capacitor cell of 16 MDRAM", IEICE Transactions, vol. E74, No. 4, pp. 818–826, Apr. 1991.

*Primary Examiner*—Olik Chaudhuri
*Assistant Examiner*—Phan X. Cao
*Attorney, Agent, or Firm*—McDermott, Will & Emery

[57] ABSTRACT

In a semiconductor device and a method of manufacturing the same, an isolating and insulating film is provided at an end neighboring to a second impurity region with a groove extended to a semiconductor substrate. This removes a crystal defect existed at the end of the isolating and insulating film, and thus prevents leak of a current at this portion from a storage node. Consequently, provision of the groove at the edge portion of the isolating oxide film neighboring to the impurity region removes a crystal defect at this region, and thus eliminates a possibility of leak of a current.

5 Claims, 52 Drawing Sheets

U.S. PATENT DOCUMENTS

| | | | |
|---|---|---|---|
| 5,082,797 | 1/1992 | Chan et al. | 257/306 |
| 5,113,234 | 5/1992 | Furuta et al. | 257/408 |
| 5,181,090 | 1/1993 | Maruo | 257/344 |
| 5,208,470 | 5/1993 | Lee et al. | 257/296 |
| 5,235,199 | 8/1993 | Hamamoto et al. | 257/306 |
| 5,241,200 | 8/1993 | Kuroda | 257/298 |
| 5,254,865 | 10/1993 | Koshimaru | 257/344 |
| 5,396,096 | 3/1995 | Akamatsu et al. | 257/344 |
| 5,426,326 | 6/1995 | Ohyu et al. | 257/327 |
| 5,498,887 | 3/1996 | Ohki et al. | 257/344 |
| 5,656,853 | 8/1997 | Ooshi | 257/296 |
| 5,840,621 | 11/1998 | Kasai | 438/618 |

SEMICONDUCTOR DEVICE AND METHOD OF MANUFACTURING THE SAME

This application is continuation of application Ser. No. 08/568,720 filed Dec. 7, 1995, abandoned.

BACKGROUND OF THE INVENTION

1. Field of the Invention

The present invention relates to a semiconductor device and a method of manufacturing the same, and more particularly, to a semiconductor device having a notch located at an end of an isolating and insulating film neighboring to an impurity region as well as a method of manufacturing the same.

2. Description of the Background Art

In recent years, demands for semiconductor memory devices have been rapidly increased owing to remarkable spread of information equipments such as computers. In connection with function, devices having a large scale storage capacity and allowing fast operation have been demanded. In compliance with these demands, technologies have been developed for improving degree of integration, response and reliability of the semiconductor memory devices.

Dynamic random access memories (DRAMs) have been known as a kind of semiconductor memory devices which enable random input and output of storage information. In general, the DRAM is formed of a memory cell array, which is a storage region storing a large number of storage information, and a peripheral circuitry required for external input and output.

The memory cell array is provided with a plurality of memory cells each storing unit storage information and arranged in a matrix form. The memory cell is formed of one MOS (Metal Oxide Semiconductor) transistor and one capacitor connected thereto, and hence is of a so-called one-transistor and one-capacitor type. Since this type of memory cell has a simple structure, the degree of integration of memory cell array can be increased easily, and hence is widely used in a DRAM of a large capacity. FIG. 81 is a cross section of this memory cell, and FIG. 82 is a plan of the same. FIG. 81 shows a section taken along line 81—81 in FIG. 82, and FIG. 82 shows a view taken along line 82—82 in FIG. 81.

The structure shown in FIGS. 81 and 82 is of a buried bit line stacked type memory cell in which a bit line is buried.

Referring to FIGS. 81 and 82, the structure of memory cell will be described below. A p type semiconductor substrate 1 made of, e.g., silicon is provided at its main surface with an element isolating oxide film 2 made of, e.g., $SiO_2$ for defining an active region. At the active region, there are formed the memory cells each including one transfer gate transistor 100 and one stacked type capacitor 200 paired to each other.

Transfer gate transistor 100 includes first and second impurity regions 5 and 6 formed at the main surface of semiconductor substrate 1 and forming source/drain regions, and also includes a gate oxide film 3 formed on the main surface of semiconductor substrate 1 and made of, e.g., $SiO_2$, and a gate electrode (word line) 4 made of, e.g., polycrystalline silicon and formed on the main surface with gate oxide film 3 therebetween. First impurity region 5 has a two-layer structure including a high concentration impurity region 5a and a low concentration impurity region 5b. Second impurity region 6 is formed of a high concentration impurity region. Gate electrode 4 is covered with a side wall insulating film 8 made of, e.g., $SiO_2$.

Semiconductor substrate 1 is covered with a first interlayer oxide film 9 made of, e.g., $SiO_2$ and having a film thickness of about 8000 Å. A storage node contact hole 10 exposing second impurity region 6 and a bit line contact hole 11 exposing first impurity region 5 are formed at first interlayer oxide film 9. In bit line contact hole 11, there is formed a bit line 7 connected to first impurity region 5. Bit line 7 is formed of a doped polycrystalline silicon film 7a of about 1000 Å in thickness and a tungsten silicide film 7b of about 1000 Å in thickness.

On first interlayer oxide film 9, there is formed a second interlayer oxide film 13 of about 10000 Å in thickness having storage node contact hole 10 and made of, e.g., $SiO_2$. In storage node contact hole 10, there is formed a storage node (lower electrode) 12 made of, e.g., polycrystalline silicon and having a portion of about 6000 Å in thickness located on second interlayer oxide film 13. Over the surface of storage node 12, there is formed a dielectric film 14, on which a cell plate (upper electrode) 15 is formed. Storage node 12, dielectric film 14 and cell plate 15 form stacked type capacitor 200. Above cell plate 15, there are formed interconnection layers 17 with a third interlayer oxide film 16 therebetween.

Then, a method of manufacturing the memory cell thus constructed will be described below with reference to FIGS. 84 to 95.

Referring first to FIG. 83, element isolating oxide film 2 is formed at predetermined regions on the main surface of semiconductor substrate 1 by the LOCOS method. Then, as shown in FIG. 84, gate electrodes 4 of a predetermined configuration are formed at predetermined regions on semiconductor substrate 1 with gate oxide films 3 made of, e.g., $SiO_2$ therebetween.

Referring to FIG. 85, a resist film 20, which exposes a predetermined region between parallel gate electrodes 4, is formed on semiconductor substrate 1. Using resist film 20 as a mask, n type impurity such as phosphorus is implanted into semiconductor substrate 1 with an implantation dose of about $2.3 \times 10^{13}$ cm$^2$ and an implantation energy of about 35 keV to form low concentration impurity region 5b.

Referring to FIG. 86, $SiO_2$ is deposited on semiconductor substrate 1 and anisotropic etching is effected thereon, so that side wall 8 is formed over gate electrode 4. Using side wall 8 as a mask, n type impurity such as phosphorus is implanted into the main surface of semiconductor substrate 1 with an implantation dose of about $4 \times 10^{13}$ cm$^2$ and an implantation energy of about 40 keV to form high concentration impurity regions 5a and 6 as shown in FIG. 87. Thereby, first impurity region 5 formed of high concentration impurity region 5a and low concentration impurity region 5b as well as second impurity region 6 formed of the high concentration impurity region are completed.

Referring to FIG. 88, first interlayer oxide film 9 made of, e.g., $SiO_2$ and having a thickness of about 8000 Å is deposited over semiconductor substrate 1 by the CVD method.

Referring to FIG. 89, a resist film 22 having an opening located above first impurity region 5 is formed on first interlayer oxide film 9. Using resist film 22 as a mask, bit line contact hole 11 is formed by the self-align contact method.

Referring to FIG. 90, after removing resist film 22, doped polycrystalline silicon film 7a and tungsten silicide film 7b each having a thickness of about 1000 Å are deposited in bit line contact hole 11 and are patterned into a predetermined configuration to form bit line 7.

Referring to FIG. 91, second interlayer oxide film 13 of about 10000 Å in thickness made of, e.g., $SiO_2$ is formed on first interlayer oxide film 9. Then, a resist film 23 having openings each located above second impurity region 6 is formed on second interlayer oxide film 13. Using resist film 23 as a mask, storage node contact hole 10 is formed at first and second interlayer oxide films 9 and 13 by the self-align contact method.

Referring to FIG. 92, after removing resist film 23, polycrystalline silicon or the like is deposited in storage node contact hole 10 to form storage node 12 having the portion of about 6000 Å in thickness located on second interlayer oxide film 13.

Referring to FIG. 93, dielectric film 14 and cell plate 15 are deposited over storage node 12. Thereby, stacked type capacitor 200 formed of storage node 12, dielectric film 14 and cell plate 15 is completed. Referring to FIG. 94, third interlayer oxide film 16 made of, e.g., $SiO_2$ is then formed on cell plate 15, and interconnection layers 17 having a predetermined configuration are formed on third interlayer oxide film 16, whereby the memory cell shown in FIG. 81 is completed.

The DRAM described above stores data by storing electric charges in the capacitor. When data of, e.g., "H" is stored, a problem may arise in connection with leak of a current from the storage node, so that refresh operation must be performed periodically in the DRAM. Although it is preferable that a cycle of the refresh operation of the DRAM is long, there is nowadays a tendency that the cycle becomes short due to a tendency that the capacity of capacitor in the memory cell decreases in accordance with increase of the degree of integration of the DRAM. Therefore, it is necessary to prevent the leak of current from the storage node in order to maintain the long cycle of refresh operation even if the degree of integration of the DRAM is high.

Referring to FIG. 95, description will be given on a leak path of the current from the storage node in the structure of the memory cell described above.

The current may leak from storage node 12 via the following paths:

(1) Through second impurity region 6 to semiconductor substrate 1.

(2) Through second impurity region 6 under gate electrode 4 to first impurity region 5.

(3) To cell plate 15.

Among these paths, the path (1) through second impurity region 6 to semiconductor substrate 1 is the predominant path. The leak to semiconductor substrate 1 is the same as that caused when a reverse bias is applied to a pn junction. However, in the steps of forming isolating oxide film 2 and implanting impurity into first and second impurity regions 5 and 6, so-called crystal defects are generated at semiconductor substrate 1. If the crystal defects are generated at the pn junction, a new leak path is formed at this region. As a result, the electric charges stored in the capacitor are discharged through this new leak path, resulting in failure in data holding by the DRAM.

In particular, many crystal defects 2b are generated at an edge portion of isolating oxide film 2, i.e., a so-called bird's beak 2a. Crystal defects 2b can be removed by a heat treatment aimed at removal of the crystal defects after the step of implanting impurity. However, the process must be performed at a lower temperature as the degree of integration of DRAM increases, so that it is difficult to remove completely the crystal defects.

SUMMARY OF THE INVENTION

An object of the present invention is to provide a semiconductor memory device and a method of manufacturing the same, in which a groove is formed at an edge portion of an isolating oxide film neighboring to a drain region, so that crystal defects are removed from this region, preventing a possibility of leak of a current.

It is one object of the present invention to provide a semiconductor device and a method of manufacturing the same, in which a groove is formed at an edge portion of an isolating oxide film neighboring to a drain region, so that crystal defects are removed from this region, preventing a possibility of leak of a current.

It is another object of the present invention to prevent generation of junction leak current while preventing narrow channel effect, and to improve the refreshing characteristics and soft error resistance.

It is a still another object of the present invention to prevent occurrence of short-circuit between the conductive layers owing to the overlay errors and dimensional errors of the pattern at the time of photolithography.

It is a still another object of the present invention to prevent generation of junction leak current while improving junction break down voltage.

A semiconductor device in accordance with one aspect of the present invention includes a semiconductor substrate, an isolating and insulating film, a first conductive layer, an impurity region, an insulating layer, and a second conductive layer. The semiconductor substrate has a main surface. The isolating and insulating film is provided to define the active region of the main surface of the semiconductor substrate. The first conductive layer is formed on the main surface with an insulating film therebetween. The impurity region is formed to reach a predetermined depth at the main surface between the isolating and insulating film and the first conductive layer. The insulating layer is formed on the main surface of the semiconductor substrate and has an opening which reaches the impurity region. The second conductive layer is electrically connected to the impurity region via the opening. The isolating and insulating film has a notch portion at its end portion at the side of impurity region, and the end surface provided by the notch portion of the isolating and insulating film reaches the semiconductor substrate. The end surface of the isolating and insulating film is covered with the insulating layer.

In the semiconductor device according to one aspect of the present invention, provision of the notch portion at the end portion of the isolating and insulating film at the side of the impurity region prevents generation of defects in crystal in the vicinity of the end portion of isolating and insulating film such that leakage of the current from the impurity region to the semiconductor substrate owing to these defects of crystal can be prevented.

As a result, leak current is reduced in the semiconductor device employing this structure so that the operation of the semiconductor device can be improved in its reliability.

In addition, the end surface of the isolating and insulating film is covered with an insulating layer. Thus, opening is not provided in the vicinity of the end surface of the isolating and insulating film. Accordingly, occurrence of short-circuit between the impurity region and the semiconductor substrate is prevented by the second conductive layer formed at the opening.

A semiconductor device in accordance with another aspect of the present invention includes a semiconductor substrate, an isolating and insulating film, a pair of impurity regions, a gate electrode, an insulating layer, a capacitor lower electrode, and a bit line. The semiconductor substrate has a main surface. The isolating and insulating film is provided to define the active region of the main surface of the semiconductor substrate. The pair of impurity regions are formed at the active region with a predetermined space therebetween so as to sandwich a channel region, and form source and drain regions. The gate electrode is formed on the channel region with a gate insulating film therebetween. The insulating layer covers the semiconductor substrate and has a first opening to expose one of the pair of impurity regions and a second opening to expose the other one of the pair of impurity region. Capacitor lower electrode is electrically connected to one impurity region through the first opening. The bit line is electrically connected to the impurity region through the second opening. The isolating and insulating film has a notch portion in its end portion at the side of the impurity region, and the end surface provided by the notch portion of the isolating and insulating film reaches the semiconductor substrate. The end surface of the isolating and insulating film is covered by an insulating layer.

In the semiconductor device in accordance with another aspect of the present invention, provision of a notch portion at the end portion of the isolating and insulating film at the side of impurity region eliminates defects of crystal in the vicinity of the end portion of the isolating and insulating film such that leakage of current to the semiconductor substrate through the impurity region of a second conductive type owing to these defects of crystal can be prevented.

As a result, leak current from the lower electrode is reduced in the semiconductor device employing this structure so that cycle of refresh operation in the DRAM can be made longer and the reliability of the operation of the semiconductor device can be further improved.

In addition, the end surface of the isolating and insulating film is covered with the insulating layer. Accordingly, the first opening is not provided in the vicinity of the end surface of the isolating and insulating film. Thus, occurrence of short-circuit between impurity region and the semiconductor substrate owing to the capacitor lower electrode formed within the first opening can be prevented.

A method of manufacturing a semiconductor device in accordance with one aspect of the present invention includes the following steps.

First, an isolating and insulating film is formed by LOCOS to define an active region in a predetermined region of a main surface of a semiconductor substrate. Then, a first conductive layer having a predetermined shape is formed at the predetermined region of the active region with an insulating film therebetween. Using the first conductive layer and the isolating and insulating film as a mask, an impurity region is formed by introducing impurity to the predetermined region of the active region. A resist film covering the semiconductor substrate and having an opening for exposing a predetermined region in the end portion of isolating and insulating film which is in contact with the impurity region is formed. Using this resist film as a mask, the exposed region of the end portion of the isolating and insulating film is removed and the end surface reaching the semiconductor substrate is formed at the isolating and insulating film. Then, an insulating layer covering the end surface of the isolating and insulating film and having an opening which reaches the impurity region is formed on the main surface of the semiconductor substrate. Thereafter, a second conductive layer which is electrically connected to the impurity region through the opening is formed.

In accordance with the method of manufacturing the semiconductor device according to one aspect of the present invention, the step for removing the predetermined region of the end portion of the isolating and insulating film is provided. By thus removing the side portion of the isolating and insulating film, defects of crystal in the vicinity of the end portion of the isolating and insulating film is eliminated at the same time. Accordingly, manufacture of the semiconductor device in which leakage of current from the impurity region to the semiconductor substrate owing to these defects of crystal can be prevented, is made possible.

As a result, leak current is reduced in the semiconductor memory device manufactured by this method so that the operation of the semiconductor device can be improved in its reliability.

Also, the insulating layer is formed so as to cover the end surface of the isolating and insulating film. Accordingly, opening is not formed in the vicinity of the end surface of the isolating and insulating film. Thus, occurrence of short-circuit between the impurity region and the semiconductor substrate due to the second conductive layer formed within the opening is prevented.

A semiconductor device in accordance with a still another aspect of the present invention includes a semiconductor substrate of a first conductivity type, an element isolation insulating layer, an impurity region for element isolation of the first conductivity type, a first impurity region of a second conductivity type, an insulating layer, a second impurity region of the second conductivity type, a side wall insulating layer, and a conductive layer. The semiconductor substrate has a main surface and has a first impurity concentration. The element isolation insulating layer is formed at the main surface of the semiconductor substrate. The impurity region for element isolation is in contact with the underside of element isolation insulating layer. The first impurity region is formed at the main surface of the semiconductor substrate and is spaced apart from impurity region for element isolation with a predetermined region therebetween. The insulating layer is formed on the main surface of the semiconductor substrate and has a hole reaching a portion of the surface of the first impurity region and the predetermined region. The second impurity region is formed to have a portion which overlaps the first impurity region and the predetermined region located at the bottom surface of the hole and to be in contact with impurity region for element isolation. This second impurity region has a second impurity concentration which is higher than the first impurity concentration. The side wall insulating layer covers the side wall of the hole. The conductive layer is electrically connected to the first and second impurity regions through the hole.

The method of manufacturing the semiconductor device according to a still another aspect of the present invention includes the following steps.

First, an element isolation insulating layer and an impurity region for element isolation of a first conductivity type which is in contact with the underside of the element isolation insulating layer are formed at the main surface of a semiconductor substrate of the first conductivity type having a first impurity concentration. A first impurity region of a second conductivity type is formed at the main surface of the semiconductor substrate being spaced apart from the impurity region for element isolation with a predetermined region therebetween. Then, an insulating layer having a hole reaching a portion of a surface of the first impurity region and the predetermined region is formed at the main surface of the semiconductor substrate. Thereafter, a second impurity region of the second conductivity type having a second impurity concentration higher than the first impurity concentration is formed to have a portion which overlaps the first impurity region and the predetermined region located at the bottom surface of the hole while being in contact with the impurity region for element isolation. A side wall insulating layer is formed so as to cover the side wall of the hole. Then, a conductive layer is formed which is electrically connected to the first and second impurity regions through the hole.

In the semiconductor device and the method of manufacturing the same according to the present invention, the second impurity region which is in contact with the first impurity region which is to be the source/drain region is formed so as to be in contact with the impurity region for element isolation. Accordingly, there is no distribution of the region of the semiconductor substrate having a relatively low impurity concentration between this second impurity region and the impurity region for element isolation. Thus, a depletion layer of pn junction portion formed by the second impurity region and the impurity region for element isolation is kept from extending widely toward the side of impurity region for element isolation upon its operation. Therefore, leak current which is generated by the presence of crystal defects within the depletion layer is reduced.

In addition, since leak current can be reduced in DRAM, the charge holding characteristics of the capacitor is made satisfactory. Accordingly, the refreshing characteristics and the soft error resistance can be made satisfactory.

Furthermore, since impurity region for element isolation is in contact with the second impurity region of an opposite conductivity type, diffusion of the impurity region for element isolation into the element formation region is also suppressed so as to prevent the narrow channel effect.

The semiconductor device according to one preferred aspect of the present invention further includes a pair of second conductive layers. The insulating layer has first and second insulating layers. The pair of second conductive layers are formed so that they extend parallel to one another on the first insulating layer with a hole therebetween. The second insulating layer is formed on the first insulating layer so as to cover the pair of second conductive layers.

The method of manufacturing the semiconductor device in accordance with one preferred aspect of the present invention further includes the step of forming the pair of second conductive layers. The insulating layer has first and second insulating layers. The pair of second conductive layers are formed to extend parallel to one another on the first insulating layer. A second insulating layer is formed on the pair of second insulating layers. A hole is formed to pass between the pair of the second conductive layers so as to reach a portion of a surface of a first impurity region and a predetermined region.

In the semiconductor device according to one preferred aspect of the present invention and the method of manufacturing the same, a hole is formed to pass between the pair of second conductive layers extending parallel to one another. Accordingly, the position of the hole may be offset due to overlay error of the mask or dimensional error of the pattern at the time of photolithography for forming the hole. In such a case, the side wall of the second conductive layer may be exposed from the side wall of the hole and the conductive layer such as a storage node formed to fill in the hole thereafter and the second conductive layer may become short. However, in this semiconductor device, a side wall insulating layer is formed to cover the side wall of the hole. Thus, even if the side wall of the second conductive layer is exposed from the side wall of the hole, it is covered by the side wall insulating layer. Accordingly, occurrence of the short circuit between the conductive layer formed after the formation of the side wall insulating layer and a second conductive layer is prevented.

A semiconductor device according to another preferred aspect of the present invention further includes a third impurity region of the second conductivity type formed at the main surface of the semiconductor substrate so as to cover the region which is in contact with the conductive layer at the bottom surface of the hole while being electrically connected to the first impurity region. The third impurity region has a third impurity concentration which is higher than the second impurity concentration.

A method of manufacturing a semiconductor device according to another preferred aspect of the prevent invention further includes the step of forming a third impurity region of a second conductivity type having a third impurity concentration which is higher than the second impurity concentration at the main surface of the semiconductor substrate such that it is in contact with the first impurity region by introducing ions through the hole with the side wall insulating layer formed on its side wall. A conductive layer is formed to be in contact with the third impurity region.

In the semiconductor device according to another preferred aspect of the present invention and the method of manufacturing the same, a third impurity region with a relatively high impurity concentration is formed at the region where the conductive layer and the semiconductor substrate are in contact with each other. Accordingly, contact resistance between the conductive layer and the first impurity region which is to be the source/drain region is reduced.

In addition, since this third impurity region is provided, the concentration at the second impurity region can be set relatively low. Thus, junction breakdown voltage at the junction portion between the second impurity region and impurity region for element isolation can be improved. Accordingly, contact resistance with the conductive layer can be reduced while improving the junction breakdown voltage.

A semiconductor device according to yet another preferred aspect of the present invention further includes an etch stopping insulating layer formed on a pair of second conductive layers. The etch stopping insulating layer is formed of a material which differs from that of the first and second insulating layers. The second insulating layer is formed so as to cover the pair of second conductive layers and the etch stopping insulating layer.

A method of manufacturing a semiconductor device according to yet another aspect of the present invention further includes the step of forming on a pair of second conductive layers an etch stopping insulating layer of a material which differs from that of the first and second insulating layers.

In the semiconductor device according to yet another preferred aspect of the present invention and the method of manufacturing the same, an etch stopping insulating layer is formed on the second conductive layer. This etch stopping insulating layer is formed of a material which differs from that of the insulating layer. Accordingly, when the insulating layer is etched to form a hole, the etch stopping insulating layer is hardly etched. Thus, even when the hole is formed above the second conductive layer owing to an overlay error of the mask or the like, exposure of the upper surface of the conductive layer covered with the etch stopping insulating layer from the hole is prevented. Therefore, occurrence of short-circuit between the conductive layer formed to be in contact with the underlying layer through this hole and the second conductive layer is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
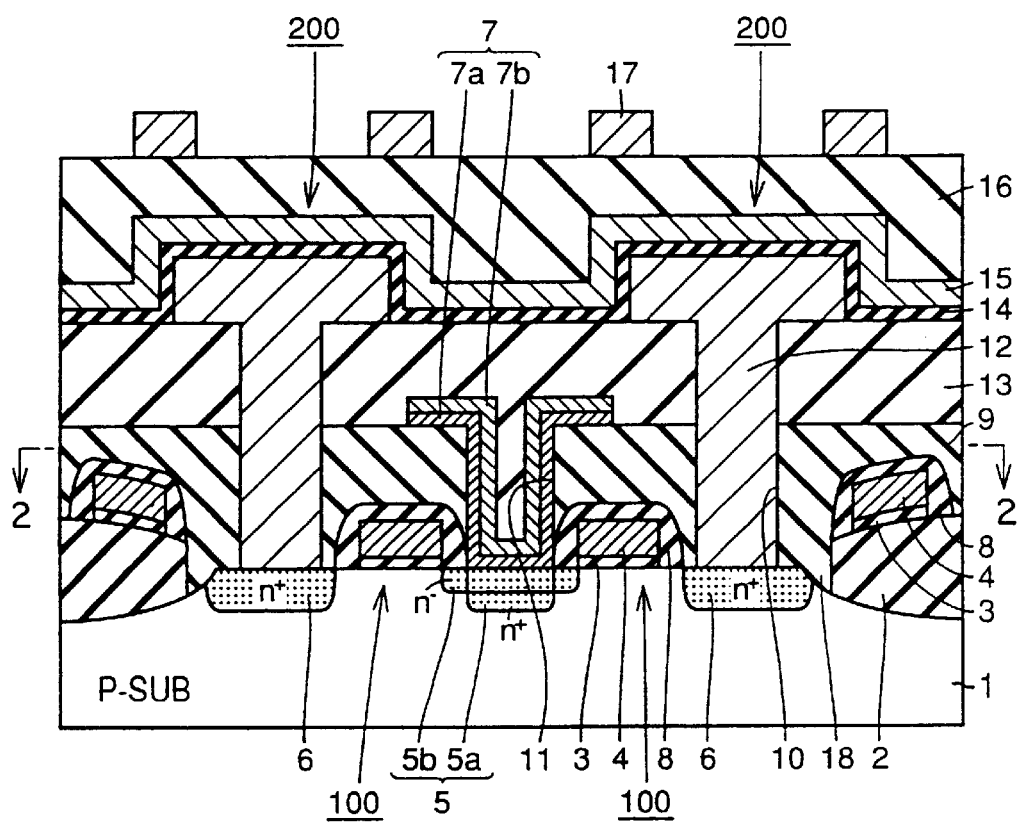
FIG. 1 is a cross section showing a semiconductor device of Embodiment 1 of the invention.
Figure 2:
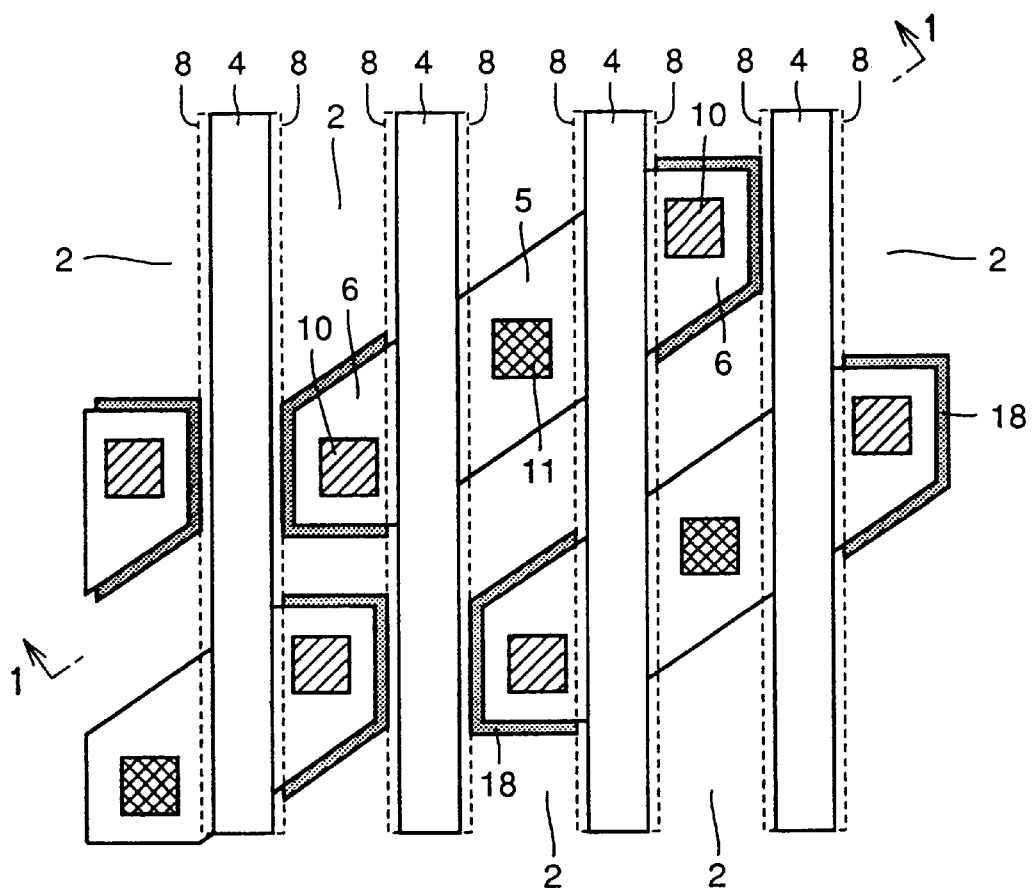
FIG. 2 is a plan showing the semiconductor device of Embodiment 1 of the invention.

A first embodiment of the invention will be described below with reference to FIGS. 1 and 2. FIG. 1 is a cross section of a memory cell of the embodiment, and FIG. 2 is a plan of the same. FIG. 1 shows a section taken along line 1—1 in FIG. 2, and FIG. 2 shows a view taken along line 2—2 in FIG. 1.

Since the sectional structure of the memory cell shown in FIG. 1 is substantially the same as that of the memory cell shown in FIG. 45, the structure will not be detailed below except for distinctive portions of this embodiment.

The memory cell of this embodiment is provided with a groove 18 which is located at an end of each isolating oxide film 2 neighboring to a second impurity region 6 of a transfer gate transistor 100. Groove 18 is filled with a first interlayer oxide film 9.

Owing to provision of groove 18 at a predetermined position in the end of isolating oxide film 2, a pn junction, which is formed of p type semiconductor substrate 1 and an $n^+$ impurity region, i.e., second impurity region 6, does not extend up to the end of isolating oxide film 2 containing many crystal defects in contrast to the prior art. Therefore, it is possible to eliminate a possibility of leak of a current from a storage node 12 to semiconductor substrate 1 via second impurity region 6.

Therefore, a cycle of the refresh operation of the memory cell can be increased, and the memory cell can have high performance and high reliability.

A method of manufacturing the above memory cell will be described below with reference to FIGS. 3 to 15.

Figure 3:
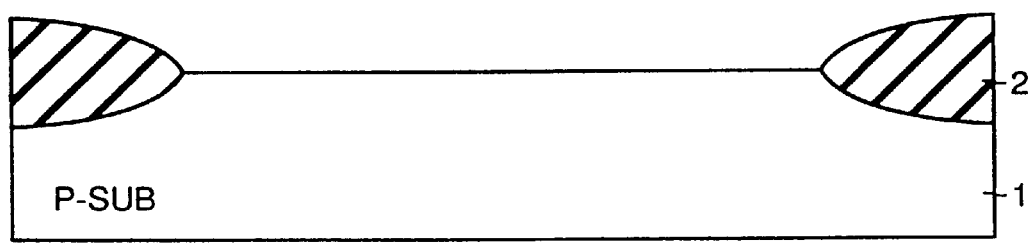
FIGS. 3–15 show 1st to 13th steps in a method of manufacturing the semiconductor device of Embodiment 1 of the invention, respectively.
Figure 4:
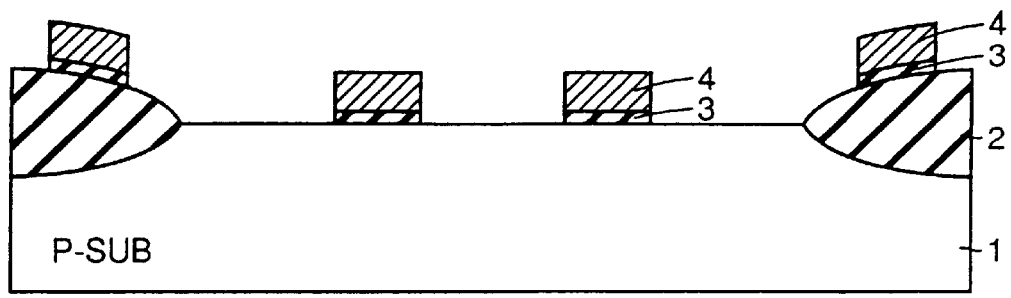

Referring first to FIG. 3, isolating oxide film 2 is formed at a predetermined region of a main surface of p type semiconductor substrate 1 by an LOCOS method. Then, as shown in FIG. 4, gate electrodes 4 made of, e.g., polycrystalline silicon layer and having a predetermined configuration are formed at predetermined regions on semiconductor substrate 1 with gate oxide films 3 made of, e.g., $SiO_2$ therebetween.

Figure 5:
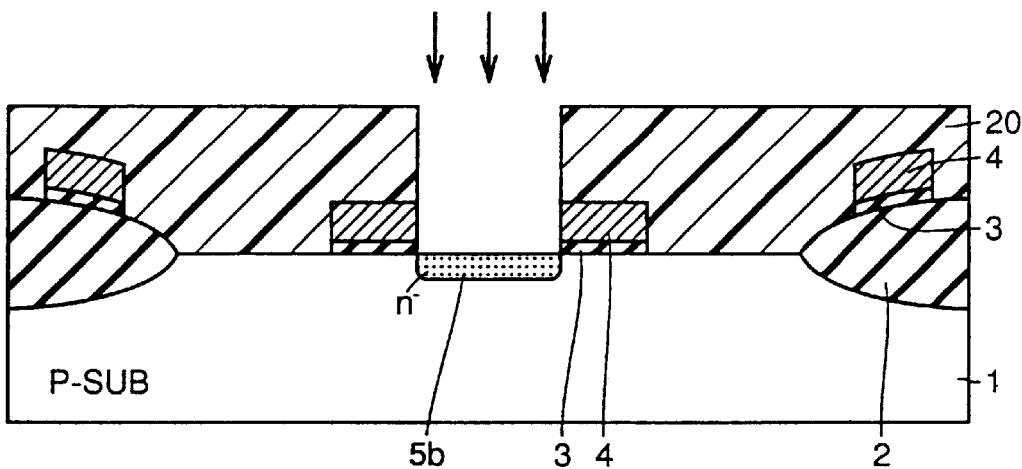

Referring to FIG. 5, processing is performed to form a resist film 20 which exposes a predetermined region between gate electrodes 4 arranged in parallel to each other on semiconductor substrate 1. Using resist film 20 as a mask, n type impurity such as phosphorus is implanted into semiconductor substrate 1 with an implantation dose of about $2.3 \times 10^{13}$ $cm^2$ and an implantation energy of about 35 keV to form low concentration impurity region 5b.

Figure 6:
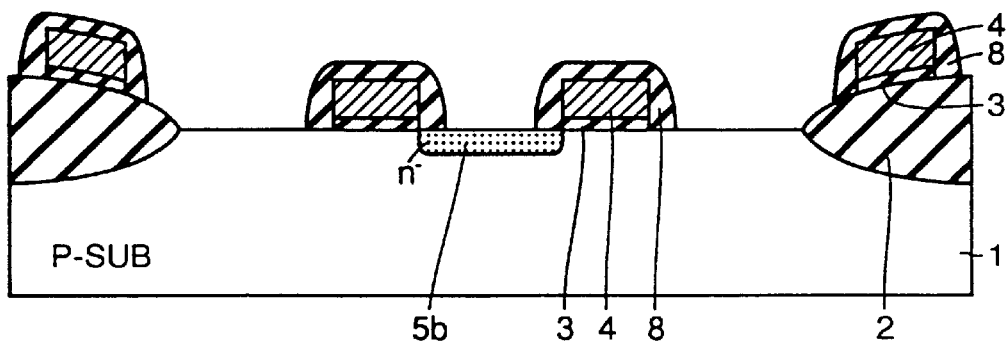
Figure 7:
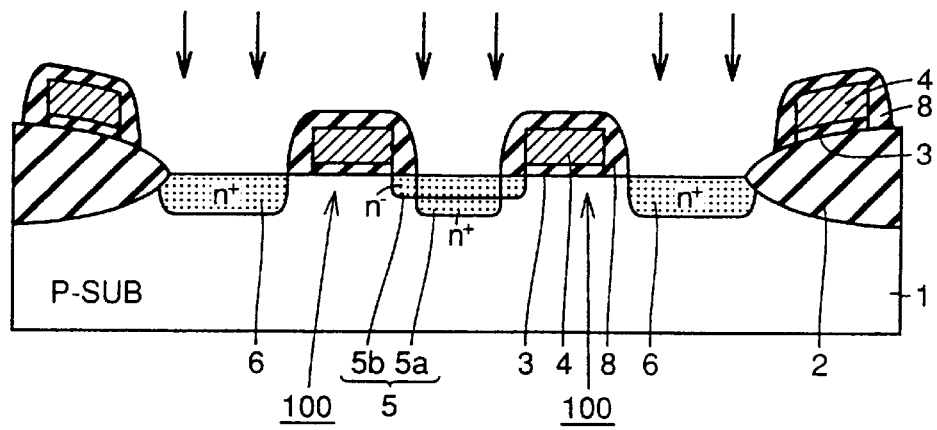

Referring to FIG. 6, $SiO_2$ is deposited on semiconductor substrate 1 and anisotropic etching is effected thereon, so that a side wall 8 is formed over each gate electrode 4. Using side wall 8 as a mask, impurity such as phosphorus is implanted into the main surface of semiconductor substrate 1 with an implantation dose of about $4.0 \times 10^{13}$ $cm^2$ and an implantation energy of about 40 keV to form high concentration impurity regions 5a and 6 as shown in FIG. 7. Thereby, a first impurity region 5 formed of high concentration impurity region 5a and low concentration impurity region 5b as well as second impurity region 6 formed of the high concentration impurity region are completed. Through the steps described above, transfer gate transistor 100 is completed on semiconductor substrate 1.

Figure 8:
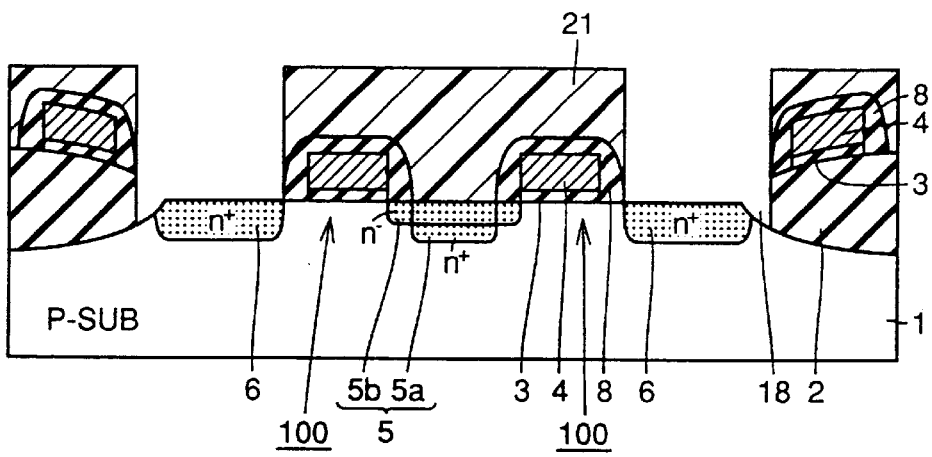

Referring to FIG. 8, a resist film 21 is formed on semiconductor substrate 1. Resist film 21 has an opening which exposes an end of isolating oxide film 2 neighboring to second impurity region 2. Using resist film 21 as a mask, anisotropic etching is performed in a gas atmosphere of $C_4F_8$ so that the end of the isolating oxide film is removed to form groove 18. This step also removes crystal defects which were generated at the end of isolating oxide film 2 during formation of isolating oxide film 2.

Figure 9:
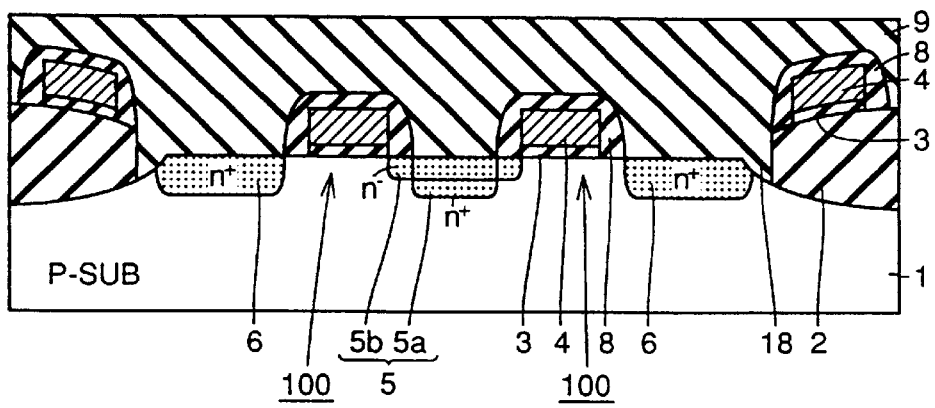

Referring to FIG. 9, first interlayer oxide film 9 made of, e.g., $SiO_2$ and having a thickness of about 8000 Å is deposited over semiconductor substrate 1 by the CVD method.

Figure 10:
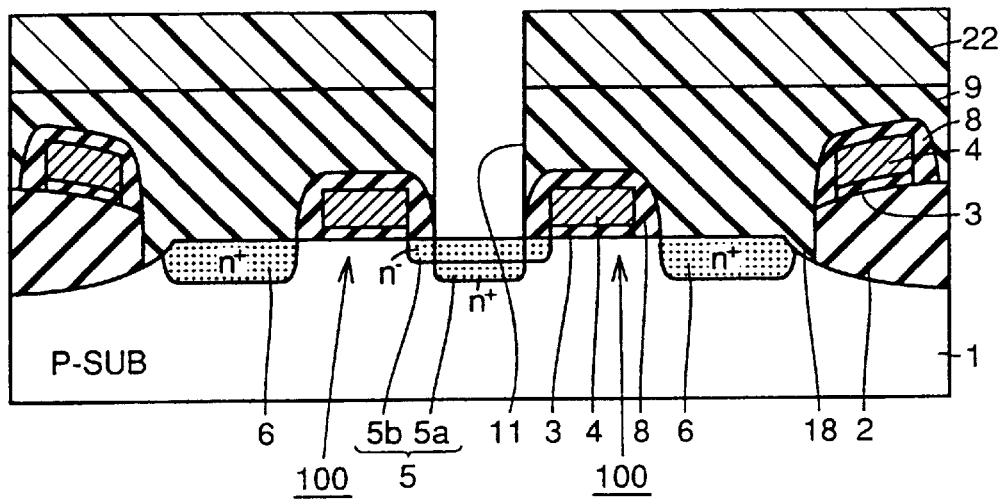

Referring to FIG. 10, a resist film 22 having an opening located above first impurity region 5 is formed on first interlayer oxide film 9. Using resist film 22 as a mask, a bit line contact hole 11 is formed by the self-align contact method.

Figure 11:
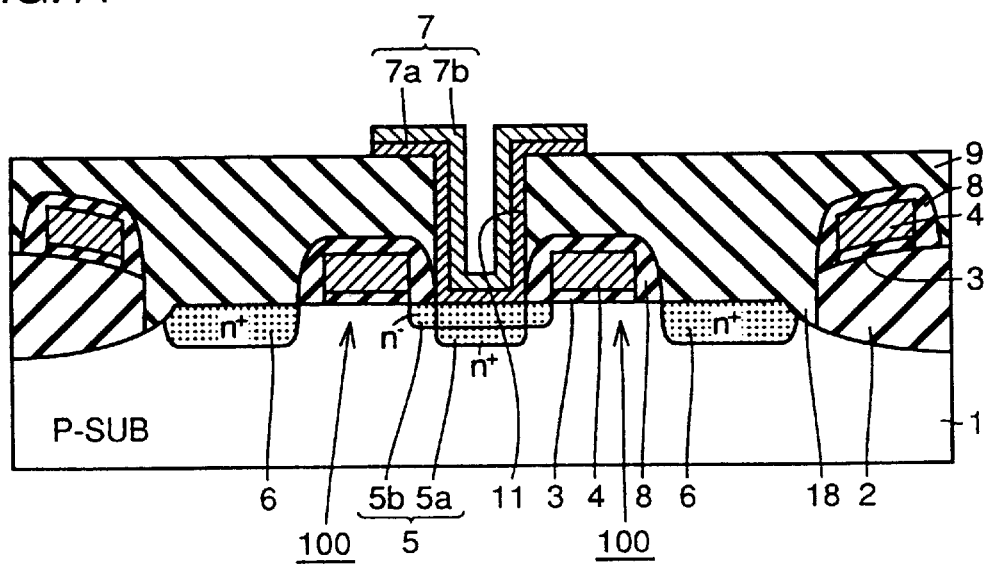

Referring to FIG. 11, after removing resist film 22, a doped polycrystalline silicon film 7a of about 1000 Å in thickness and a tungsten silicide film 7b of about 1000 Å in thickness are deposited in bit line contact hole 11 and are patterned into a predetermined configuration to form bit line 7.

Figure 12:
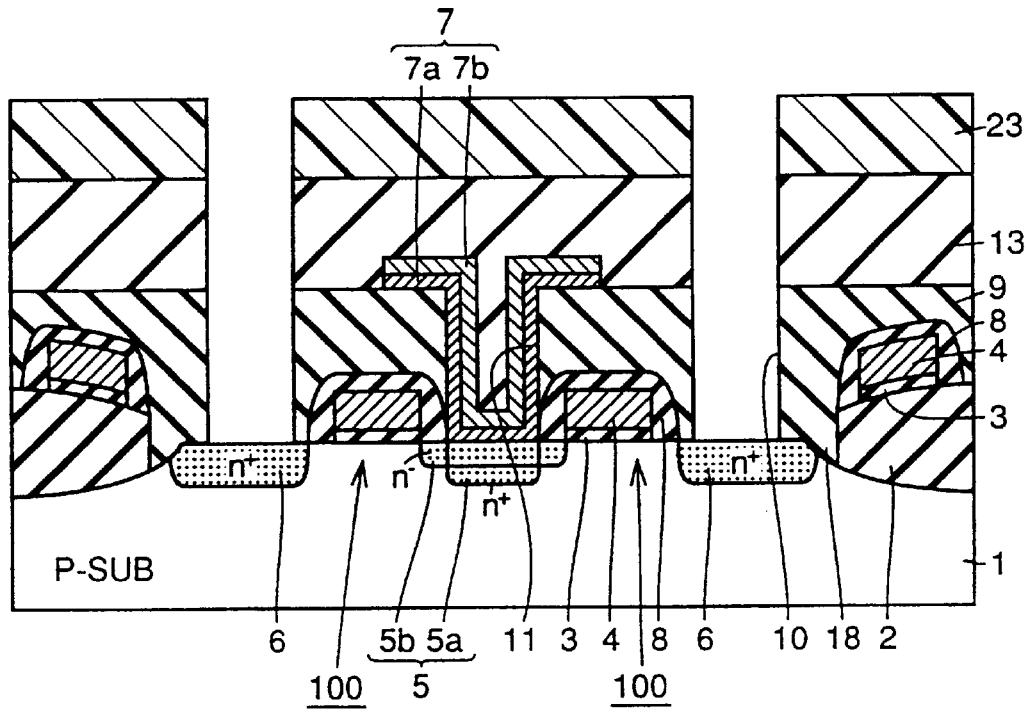

Referring to FIG. 12, a second interlayer oxide film 13 of about 10000 Å in thickness made of, e.g., $SiO_2$ is formed on first interlayer oxide film 9. Thereafter, a resist film 23 having openings each located above second impurity region 6 is formed on second interlayer oxide film 13. Using resist film 23 as a mask, a storage node contact hole 10 is formed at first and second interlayer oxide films 9 and 13 by the self-align contact method.

Figure 13:
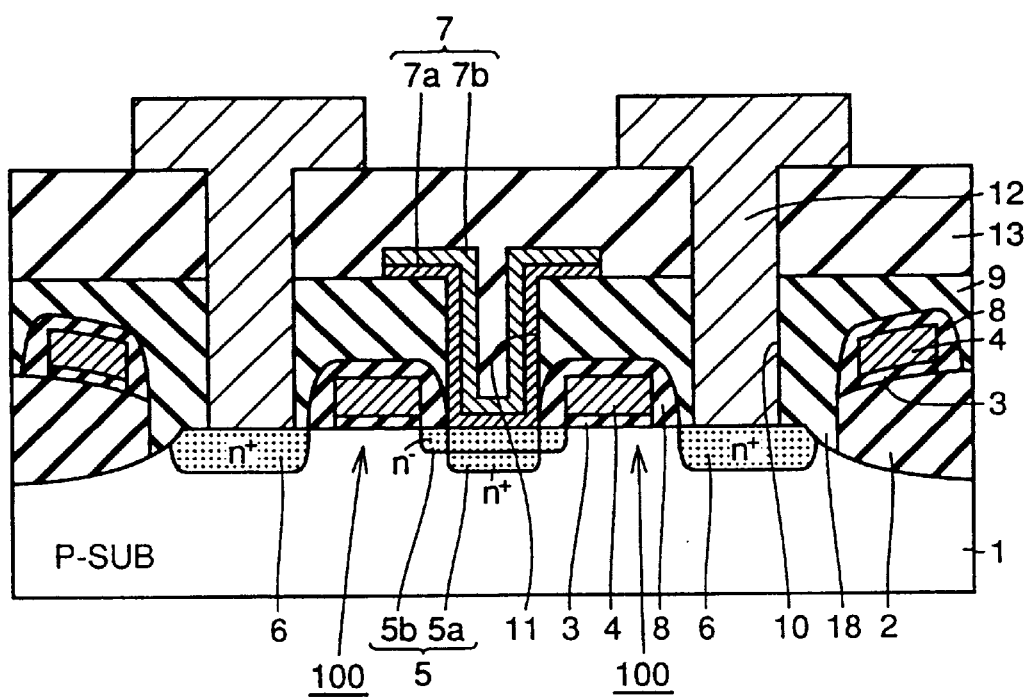

Referring to FIG. 13, after removing resist film 23, polycrystalline silicon or the like is deposited in storage node contact hole 10 to form storage node 12 having the portion of about 6000 Å in thickness located on second interlayer oxide film 13.

Figure 14:
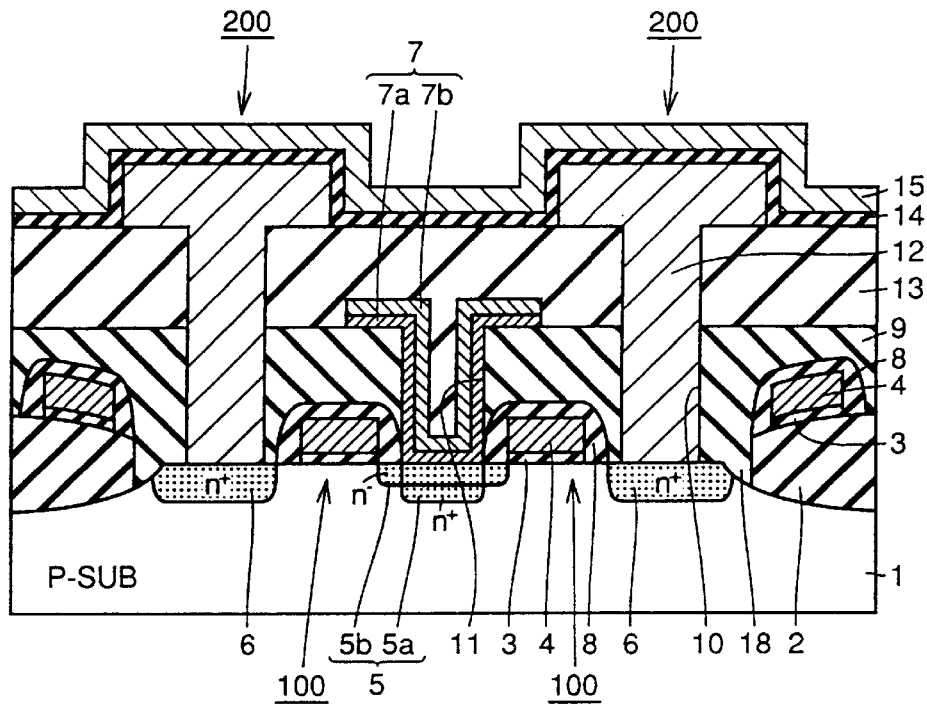

Referring to FIG. 14, a dielectric film 14 and a cell plate 15 are deposited over storage node 12. Thereby, a stacked type capacitor 200 formed of storage node 12, dielectric film 14 and cell plate 15 is completed.

Figure 15:
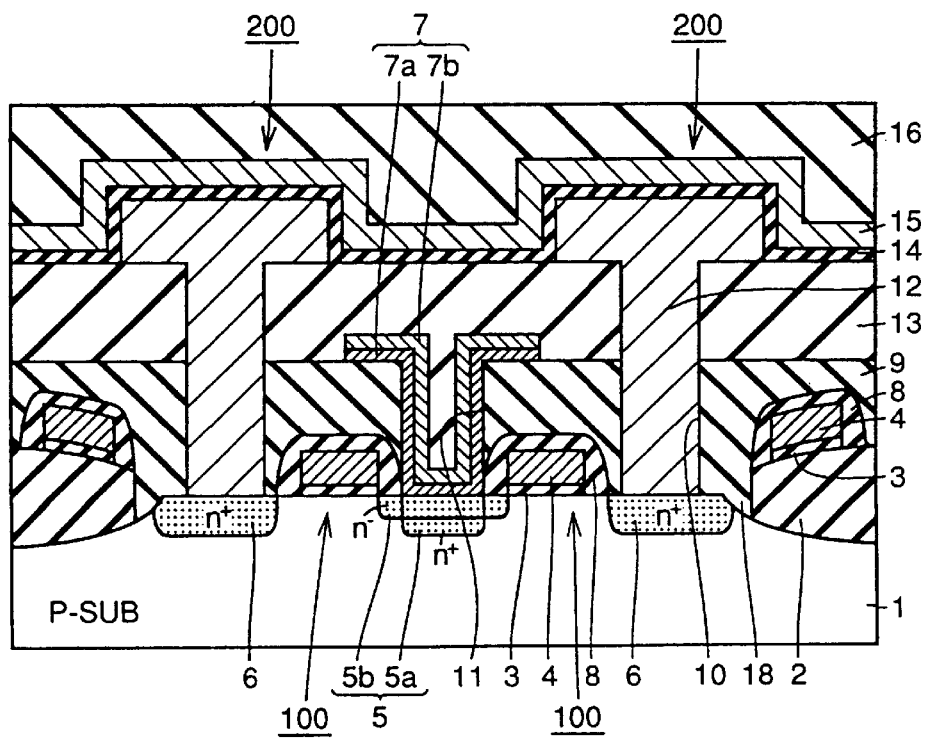

Referring to FIG. 15, a third interlayer oxide film 16 made of, e.g., $SiO_2$ is then formed on cell plate 15, and interconnection layers 17 having a predetermined configuration are formed on third interlayer oxide film 16, whereby the memory cell of the embodiment shown in FIG. 1 is completed.

According to the method of manufacturing the memory cell of this embodiment described above, crystal defects can be removed simultaneously with the formation of groove 18 by removing the end of isolating oxide film 2 neighboring to second impurity region 6. Consequently, the memory cell structure can reduce crystal defects in the pn junction formed of p type semiconductor substrate 1 and the $n^+$ impurity region, i.e., second impurity region 6 in contrast to the prior art, in which many crystal defects are generated in the end of isolating oxide film 2.

Embodiment 2

Figure 16:
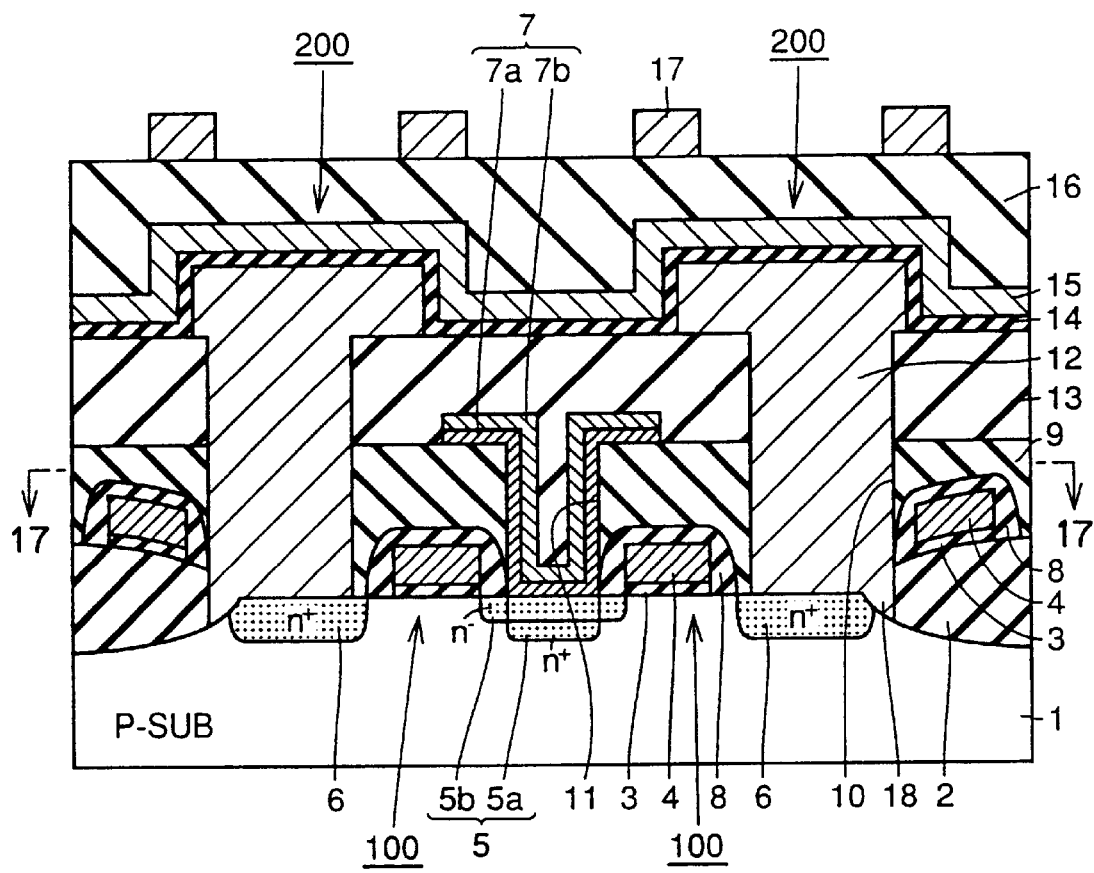
FIG. 16 is a cross section showing a semiconductor device of Embodiment 2 of the invention.
Figure 17:
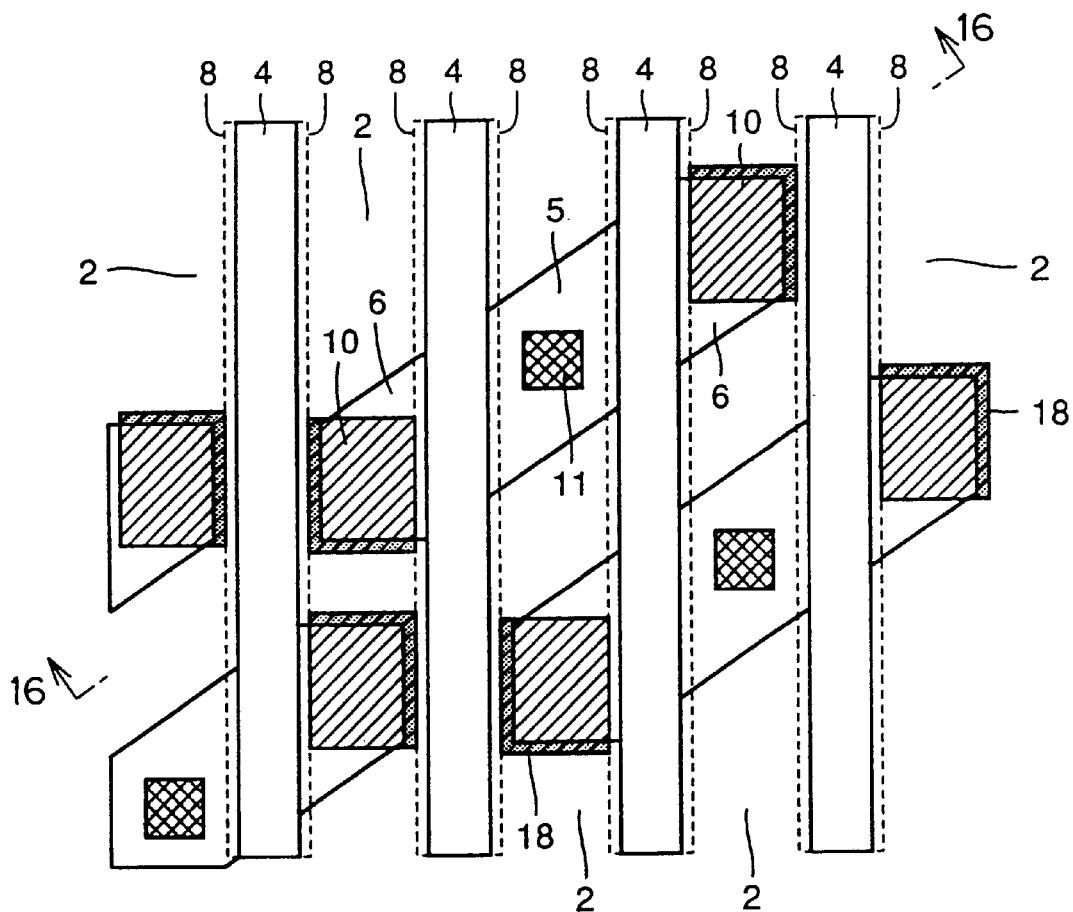
FIG. 17 is a plan showing the semiconductor device of Embodiment 2 of the invention.

A second embodiment of the invention will be described below with reference to FIGS. 16 and 17. FIG. 16 is a cross section of a memory cell of the embodiment, and FIG. 17 is a plan of the same. FIG. 16 shows a section taken along line 16—16 in FIG. 17, and FIG. 17 shows a view taken along line 17—17 in FIG. 16.

Since the sectional structure of the memory cell shown in FIG. 16 is substantially the same as that of the memory cell of the embodiment 1 shown in FIG. 1, the structure will not be detailed below except for distinctive portions of this embodiment.

The memory cell in this embodiment differs from that of the embodiment 1 in that storage node contact hole 10 accommodating storage node 12 includes groove 18. Owing to this structure, the pn junction formed of p type semiconductor substrate 1 and the $n^+$ impurity region, i.e., second impurity region 6 does not extend up to the end of isolating oxide film 2 containing many crustal defects in contrast to the prior art. Therefore, it is possible to eliminate a possibility of leak of a current from storage node 12 to semiconductor substrate 1 via second impurity region 6.

Therefore, the cycle of refresh operation of the memory cell can be increased, and the memory cell can have high performance and high reliability. Further, a unit resistance of storage node 12 can be reduced.

Then, a method of manufacturing the memory cell of the second embodiment will be described below with reference to FIGS. 18 to 24. The process from the initial step to the step of forming high concentration impurity regions 5a and 6 is the same as that from the step in FIG. 3 to the step in FIG. 7 already described in connection with the first embodiment, and hence will not be described below.

Figure 18:
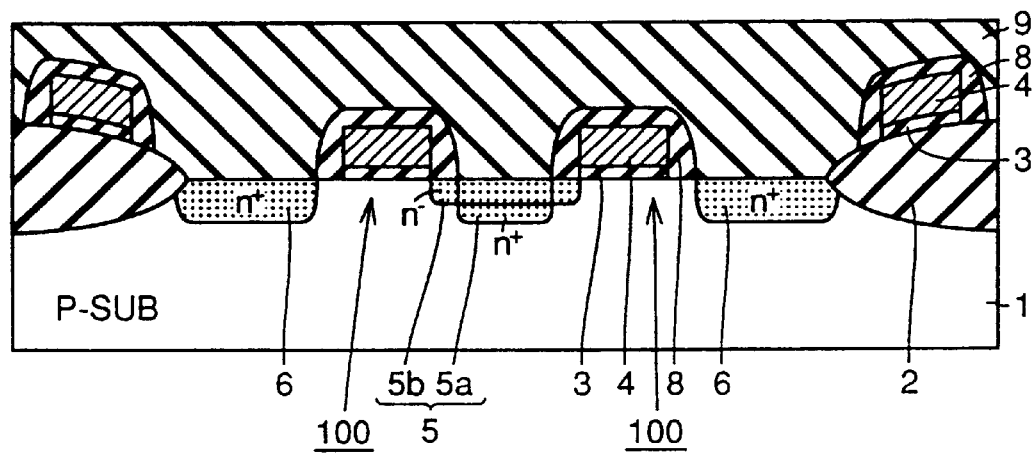
FIGS. 18–24 show 6th to 12th steps in a method of manufacturing the semiconductor device of Embodiment 2 of the invention, respectively.

Referring to FIG. 18, first interlayer oxide film 9 made of, e.g., $SiO_2$ and having a thickness of about 8000 Å is deposited over semiconductor substrate 1 by the CVD method.

Figure 19:
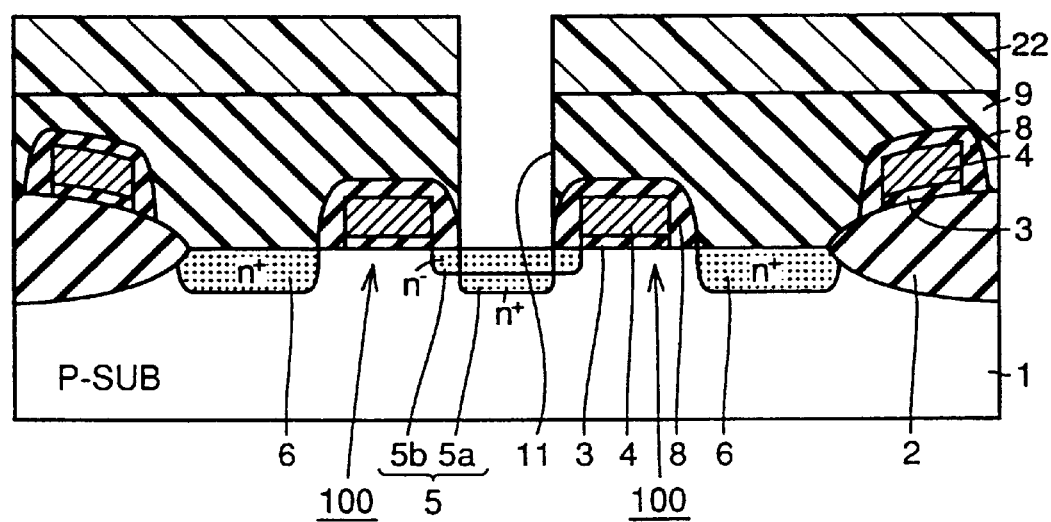

Referring to FIG. 19, resist film 22 having an opening located above first impurity region 5 is formed on first interlayer oxide film 9. Using resist film 22 as a mask, bit line contact hole 11 is formed by the self-align contact method.

Figure 20:
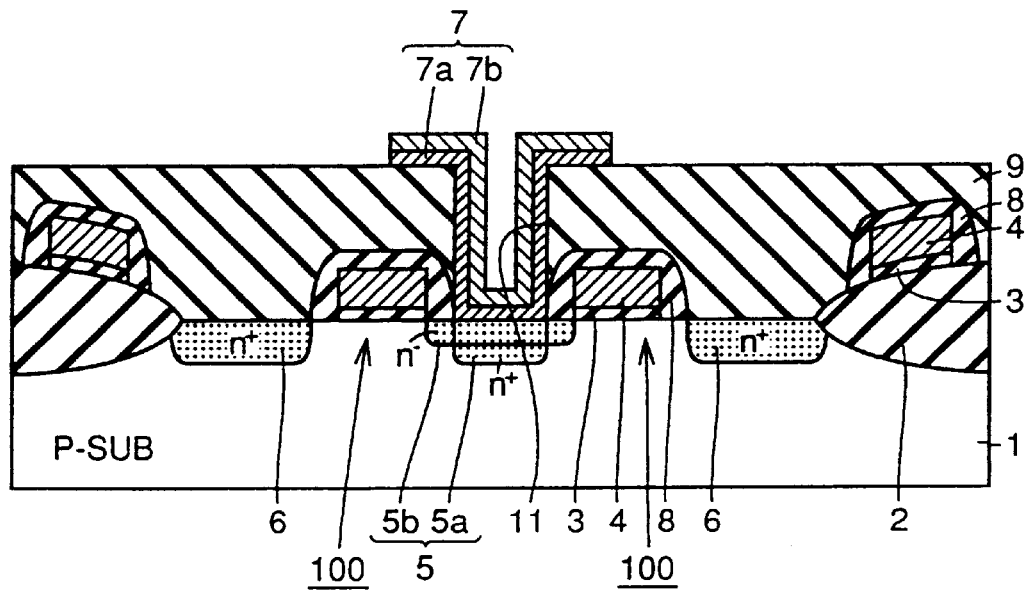

Referring to FIG. 20, after removing resist film 22, doped polycrystalline silicon film 7a of about 1000 Å in thickness and tungsten silicide film 7b of about 1000 Å in thickness are deposited in bit line contact hole 11 and are patterned into a predetermined configuration to form bit line 7.

Figure 21:
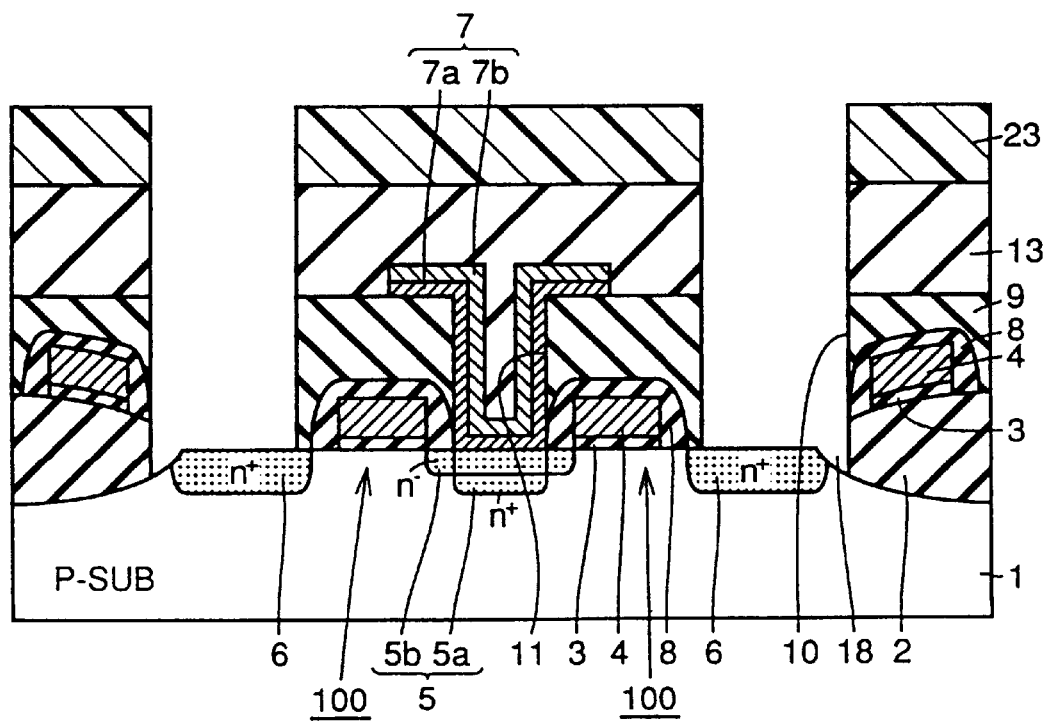

Referring to FIG. 21, second interlayer oxide film 13 of about 10000 Å in thickness made of, e.g., $SiO_2$ is formed on first interlayer oxide film 9. Thereafter, resist film 23 having openings each located above second impurity region 6 and an end of the isolating oxide film 2 is formed on second interlayer oxide film 13. Using resist film 23 as a mask, anisotropic etching is performed in a gas atmosphere of $C_4F_8$. Self-align contact method is employed. Thereby, storage node contact hole 10 is formed at first and second interlayer oxide films 9 and 13, and further the end of isolating and insulating film 2 is removed to form groove 18.

Figure 22:
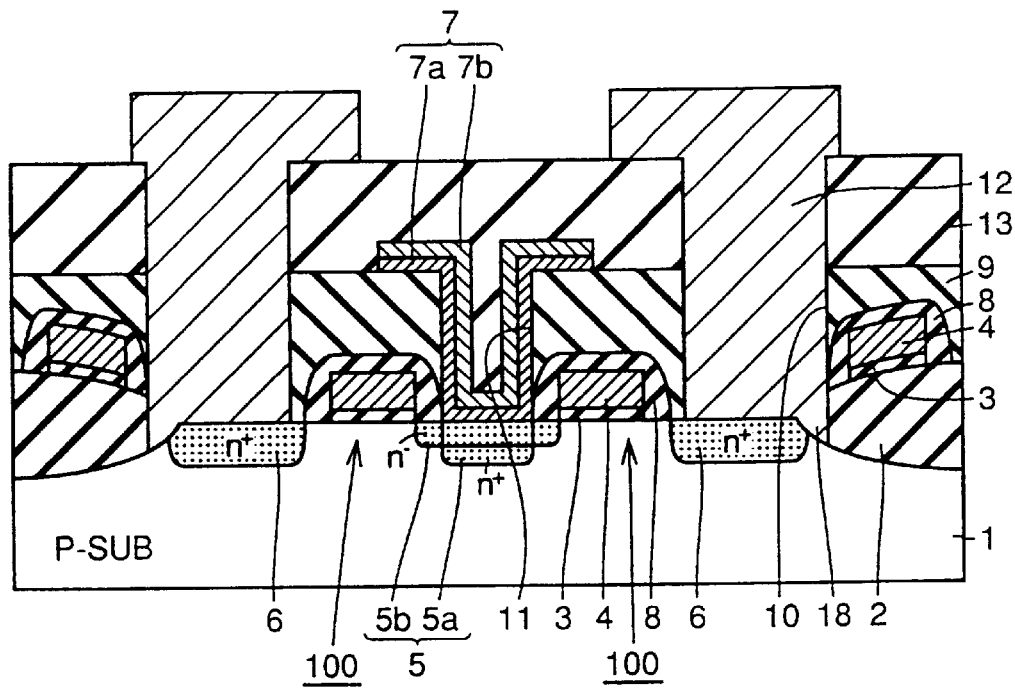

Referring to FIG. 22, after removing resist film 23, polycrystalline silicon or the like is deposited in storage node contact hole 10 to form storage node 12 having the portion of about 6000 Å in thickness located on second interlayer oxide film 13. In this step, a portion of storage node 12 is formed in groove 18.

Figure 23:
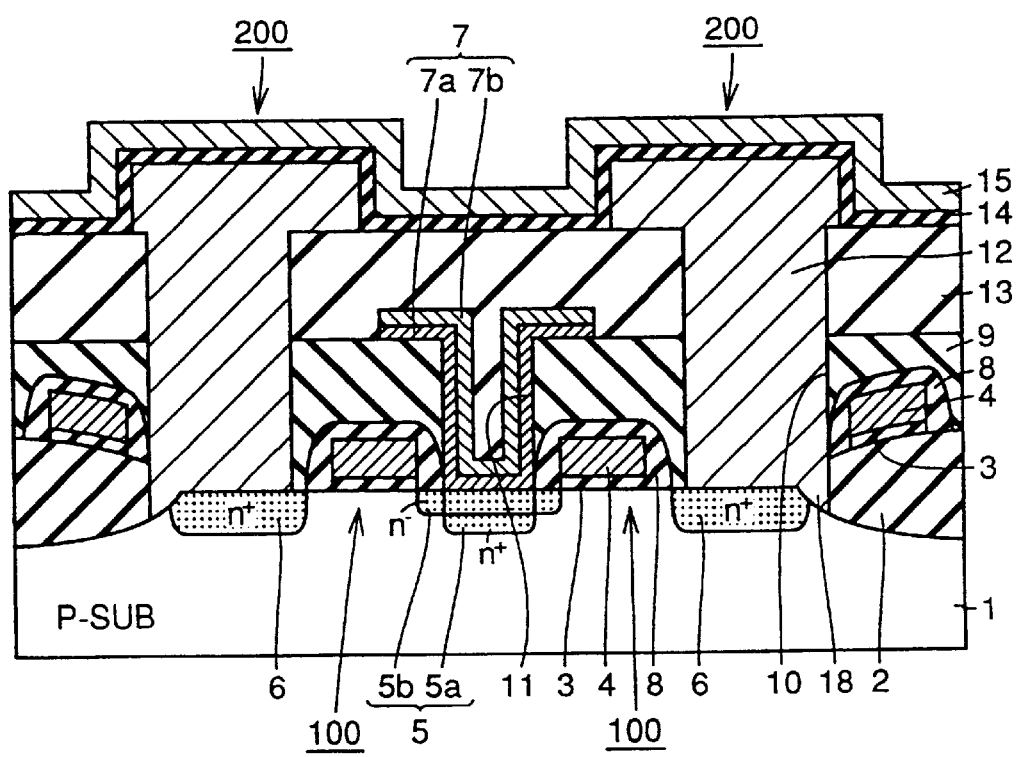

Referring to FIG. 23, dielectric film 14 and cell plate 15 are deposited over storage node 12. Thereby, stacked type capacitor 200 formed of storage node 12, dielectric film 14 and cell plate 15 is completed.

Figure 24:
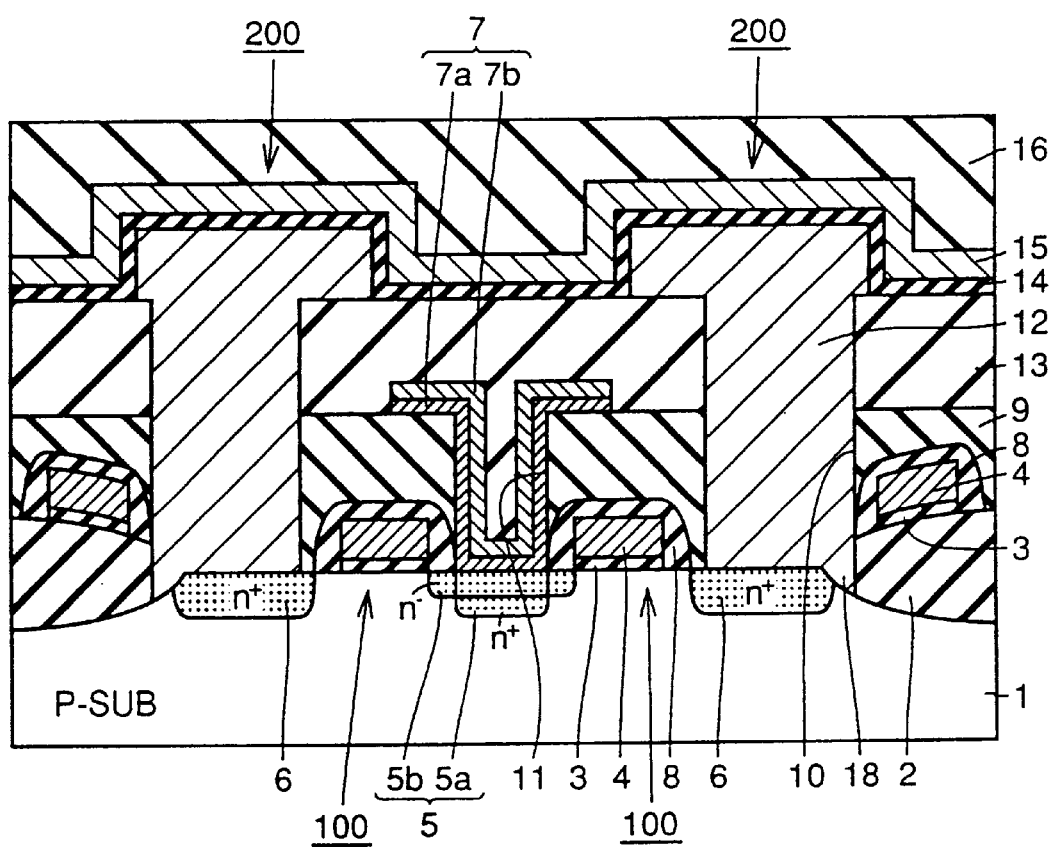

Referring to FIG. 24, third interlayer oxide film 16 made of, e.g., $SiO_2$ is then formed on cell plate 15, and interconnection layers 17 having a predetermined configuration are formed on third interlayer oxide film 16, whereby the memory cell of the embodiment shown in FIG. 16 is completed.

According to the method of manufacturing the memory cell of this second embodiment, groove 18 is formed simultaneously with formation of storage node contact hole 10. Therefore, the number of manufacturing steps can be smaller than that of the manufacturing method of the embodiment 1, and thus a cost for the manufacturing steps can be reduced.

Embodiment 3

Figure 25:
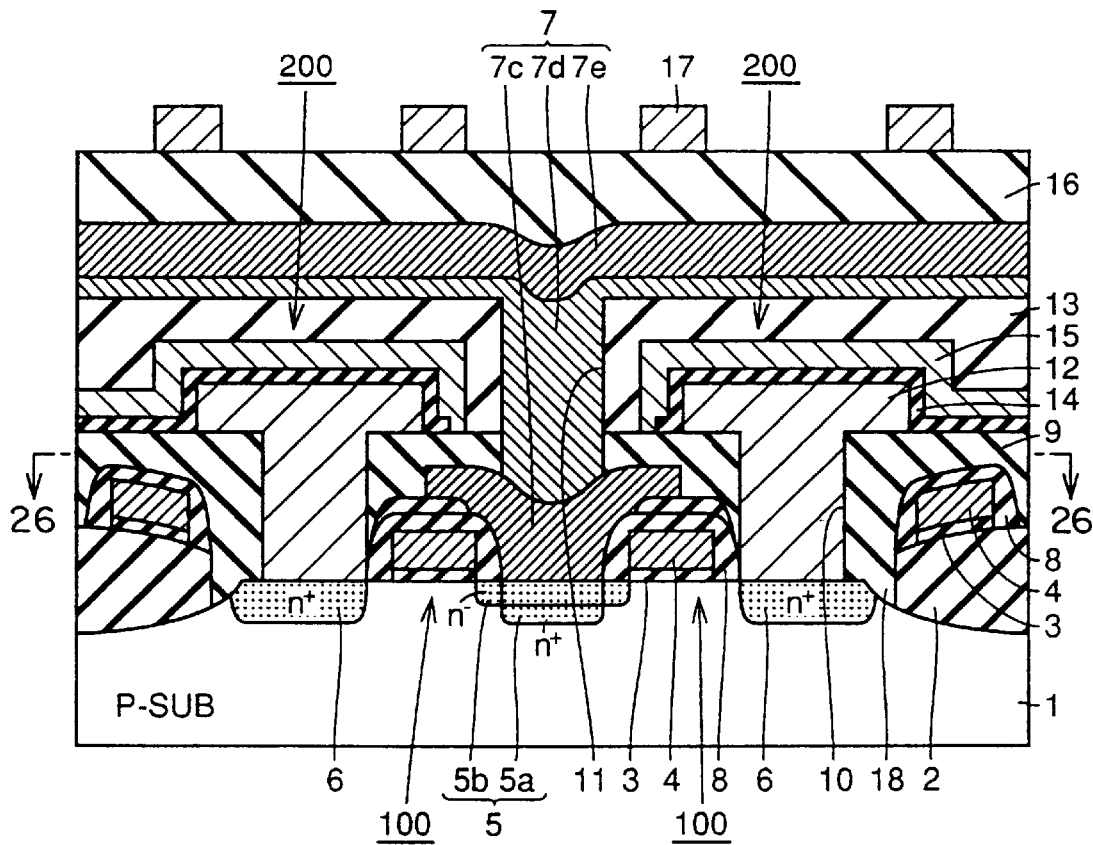
FIG. 25 is a cross section showing a semiconductor device of Embodiment 3 of the invention.
Figure 26:
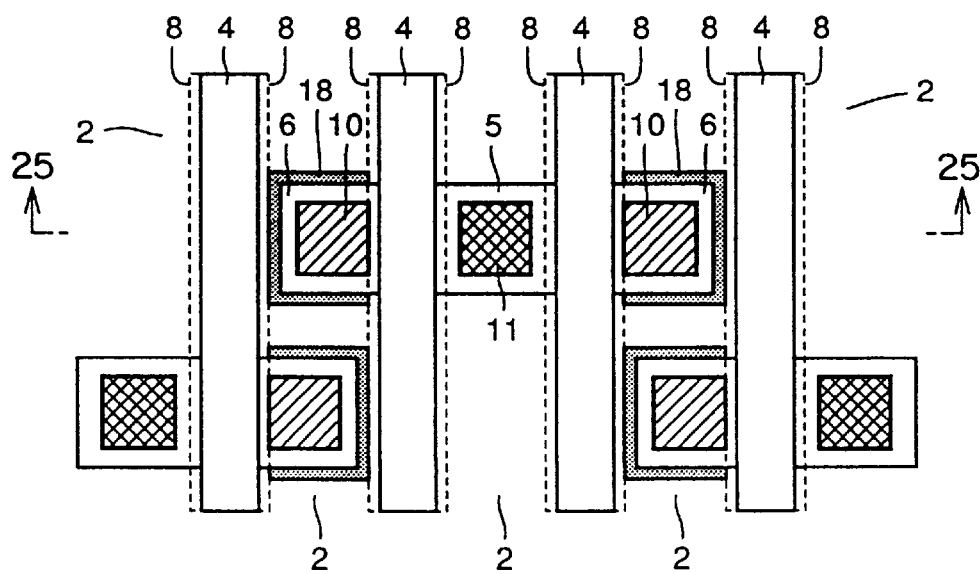
FIG. 26 is a plan showing the semiconductor device of Embodiment 3 of the invention.
Figure 27:
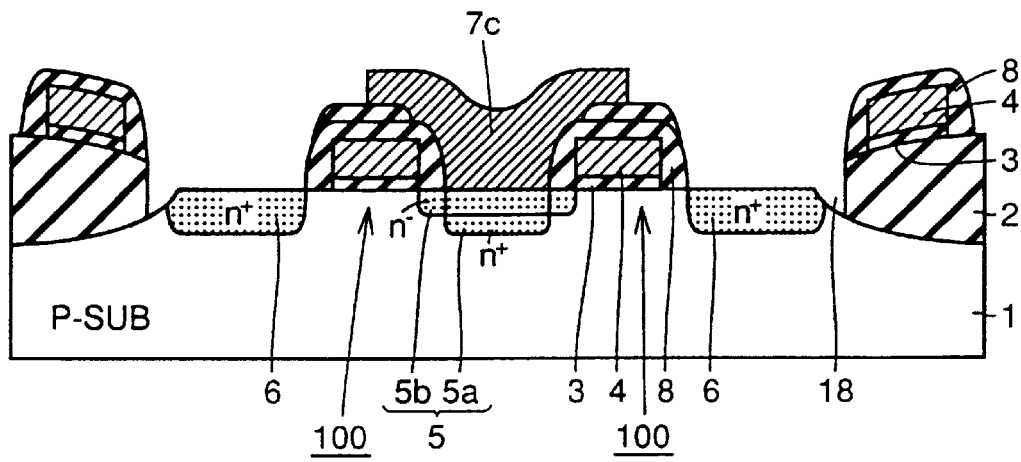
FIGS. 27–34 show 7th to 14th steps in a method of manufacturing the semiconductor device of Embodiment 3 of the invention, respectively.

A third embodiment of the invention will be described below with reference to FIGS. 25 and 26. Although the first and second embodiments have been described in connection with the memory cells of the buried bit line stacked type, the third embodiment will be described below in connection with a memory cell of the stacked type. FIG. 25 is a cross section of the memory cell of the third embodiment, and FIG. 26 is a plan of the same. FIG. 25 shows a section taken along line 25—25 in FIG. 26, and FIG. 26 shows a view taken along line 26—26 in FIG. 25.

Referring to these figures, the memory cell of the third embodiment has the same structure as that of the first embodiment except for that bit line 7 is formed above stacked type capacitor 200. Similarly to the first embodiment, groove 18 is formed at the end of isolating oxide film 2 neighboring to second impurity region 6. Bit line 7 is formed of a polypad 7c made of, e.g., polycrystalline silicon, a barrier metal layer 7d made of, e.g., tungsten and a metal layer 7e made of, e.g., aluminum.

As described above, the memory cell structure of the third embodiment is provided with groove 18 at the end of isolating oxide film 2 similarly to the first embodiment. Owing to this structure, the pn junction formed of p type semiconductor substrate 1 and the $n^+$ impurity region, i.e., second impurity region 6 does not extend up to the end of isolating oxide film 2 containing many crystal defects in contrast to the prior art. Therefore, it is possible to eliminate a possibility of leak of a current from storage node 12 to semiconductor substrate 1 via second impurity region 6.

Therefore, the cycle of refresh operation of the memory cell can be increased, and the memory cell can have high performance and high reliability.

Then, a method of manufacturing the memory cell of the third embodiment will be described below with reference to FIGS. 27 to 34.

The process from the initial step to the step of forming groove 18 is the same as that from the step in FIG. 3 to the step in FIG. 8 already described in connection with the first embodiment, and hence will not be described below.

Figure 28:
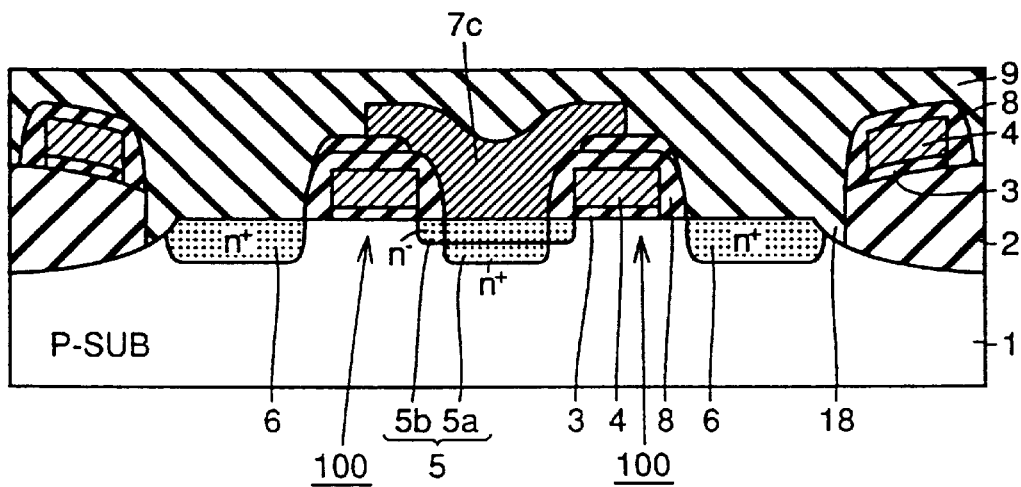

Referring to FIG. 28, polypad 7c made of, e.g., polycrystalline silicon and connected to first impurity region 5 is formed on semiconductor substrate 1. Then, first interlayer oxide film 9 made of, e.g., $SiO_2$ and having a thickness of about 8000 Å is deposited over semiconductor substrate 1 by the CVD method.

Figure 29:
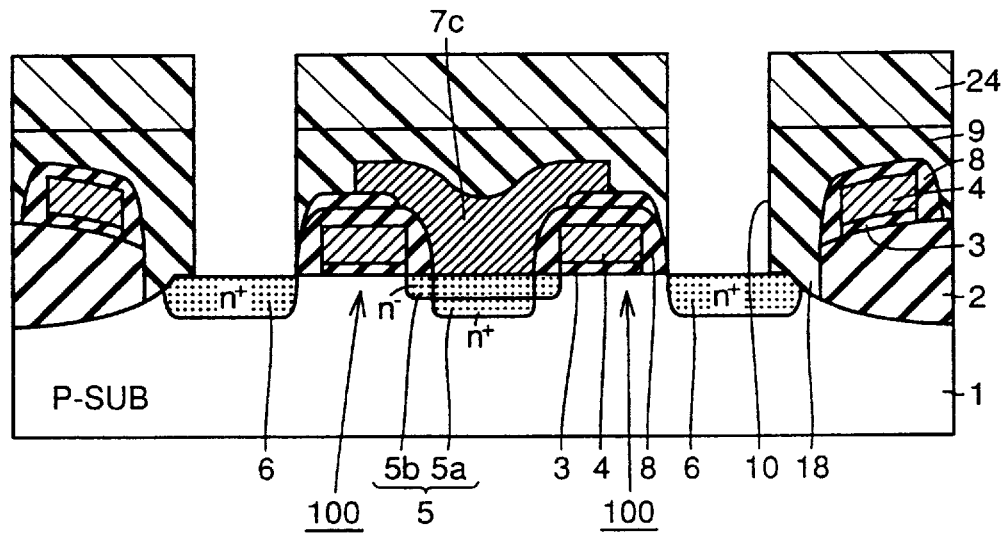

Referring to FIG. 29, a resist film 24 having openings each located above second impurity region 6 is formed on first interlayer oxide film 9. Using resist film 24 as a mask, storage node contact hole 10 is formed on first interlayer oxide film 9 by the self-align contact method.

Figure 30:
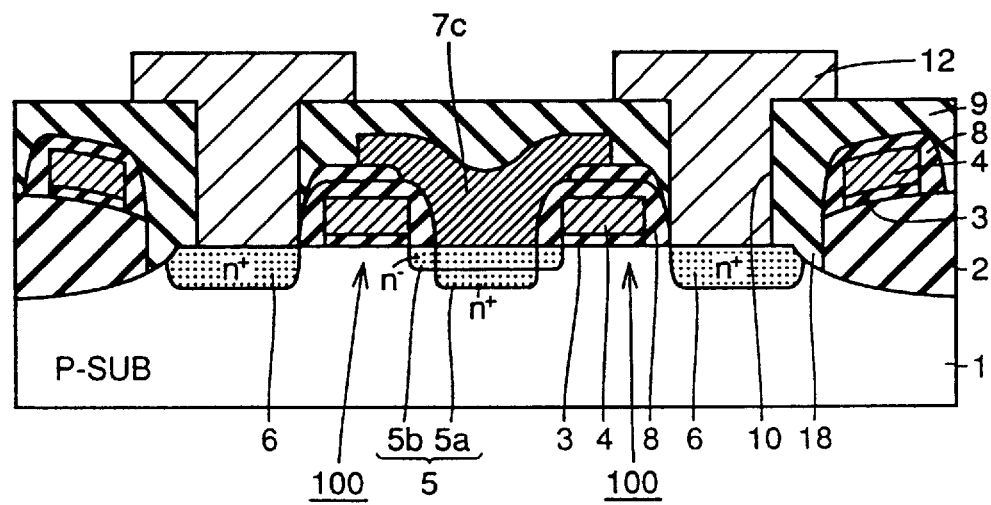

Referring to FIG. 30, after removing resist film 24, polycrystalline silicon is deposited in storage node contact hole 10 to form storage node 12 having a thickness of about 6000 Å on first interlayer oxide film 9.

Figure 31:
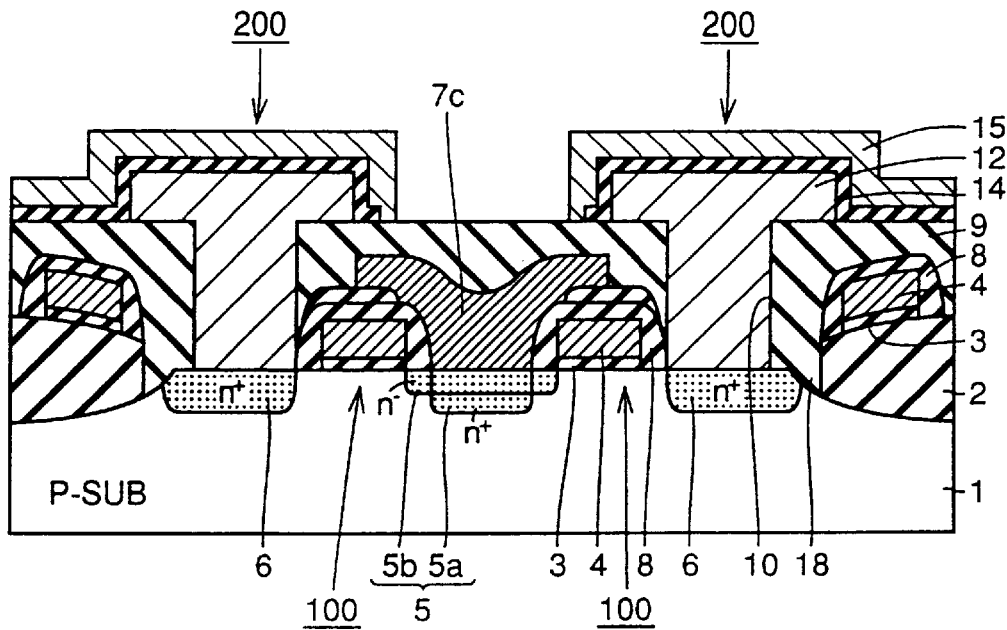

Referring to FIG. 31, dielectric film 14 and cell plate 15 are deposited over storage node 12. Thereby, stacked type capacitor 200 formed of storage node 12, dielectric film 14 and cell plate 15 is completed.

Figure 32:
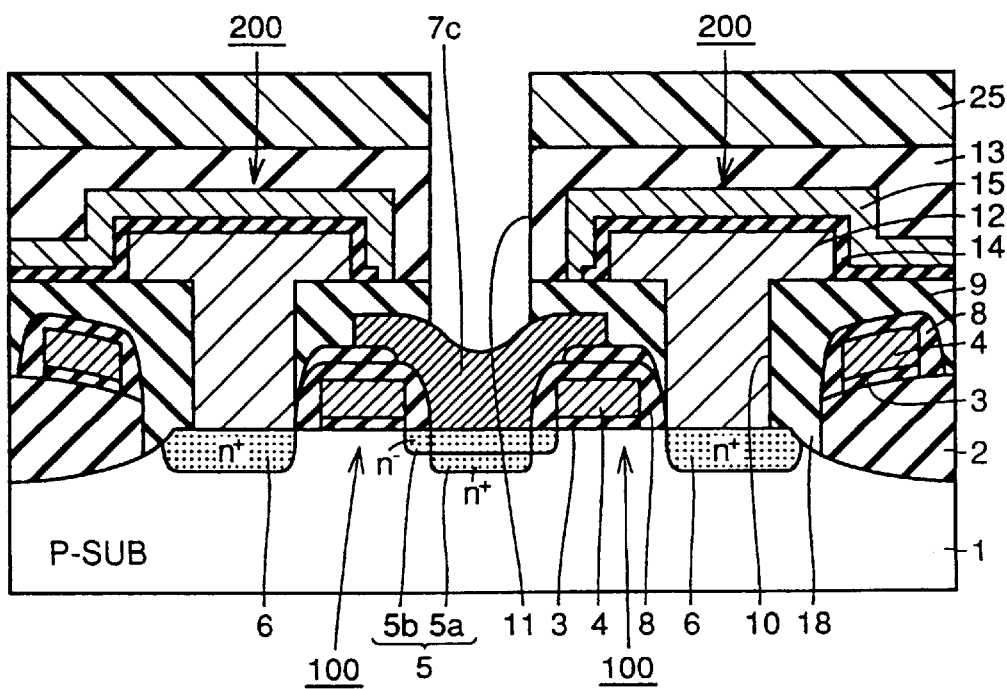

Referring to FIG. 32, second interlayer oxide film 13 of about 10000 Å in thickness made of, e.g., $SiO_2$ is formed on cell plate 15. Thereafter, a resist film 25 having an opening located above first impurity region 5 is formed on second interlayer oxide film 13. Using resist film 25 as a mask, bit line contact hole 11 communicated with polypad 7c is formed at first and second interlayer oxide films 9 and 13 by the self-align contact method.

Figure 33:
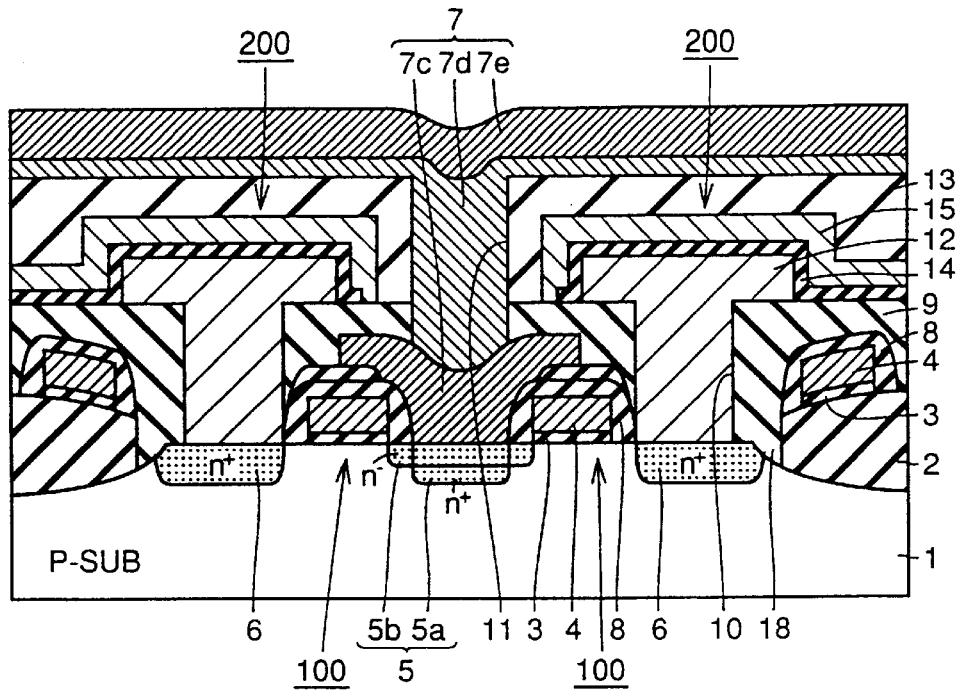

Referring to FIG. 33, after removing resist film 25, barrier metal layer 7d made of, e.g., tungsten is deposited in storage contact hole 11, and metal layer 7e made of, e.g., aluminum is deposited on barrier metal layer 7d. Thereby, bit line 7 formed of polypad 7c, barrier metal layer 7d and metal layer 7e is completed.

Figure 34:
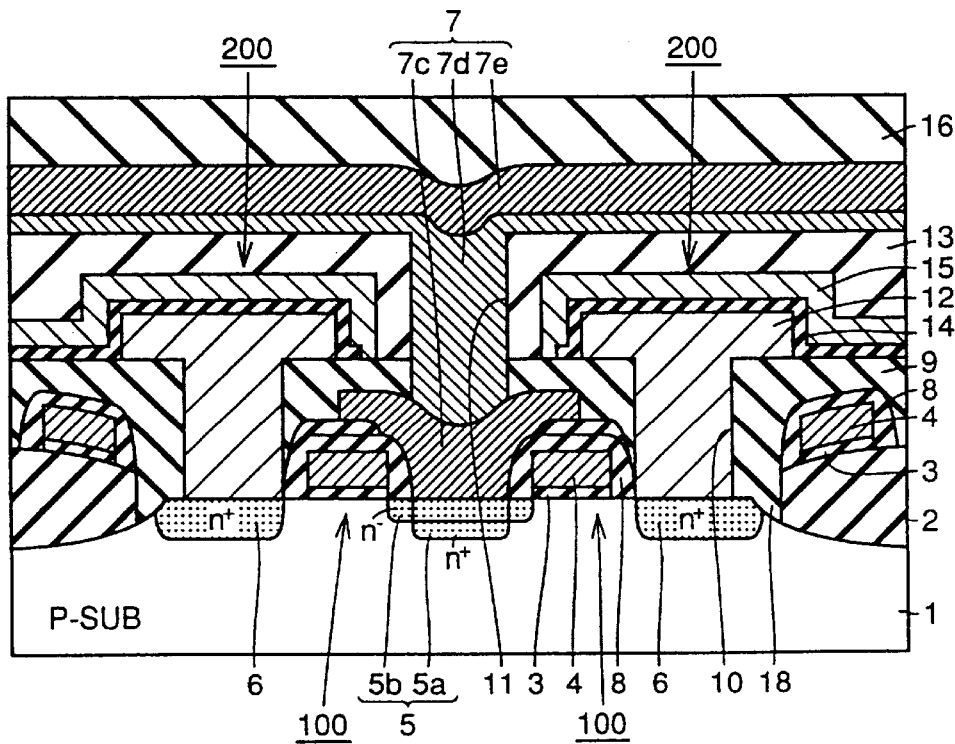

Referring to FIG. 34, third interlayer oxide film 16 made of, e.g., $SiO_2$ is formed on metal layer 7c, and further interconnection layers 17 of a predetermined configuration are formed on third interlayer oxide film 16, so that the memory cell shown in FIG. 25 is completed.

According to the method of manufacturing the memory cell of this third embodiment, crystal defects can be removed simultaneously with the processing of removing the end of isolating oxide film 2 neighboring to the second impurity region 6 for forming groove 18. Consequently, the memory cell structure can reduce crystal defects in the pn junction formed of p type semiconductor substrate 1 and the $n^+$ impurity region, i.e., second impurity region 6 in contrast to the prior art, in which many crystal defects are generated in the end of isolating oxide film 2.

Embodiment 4

Figure 35:
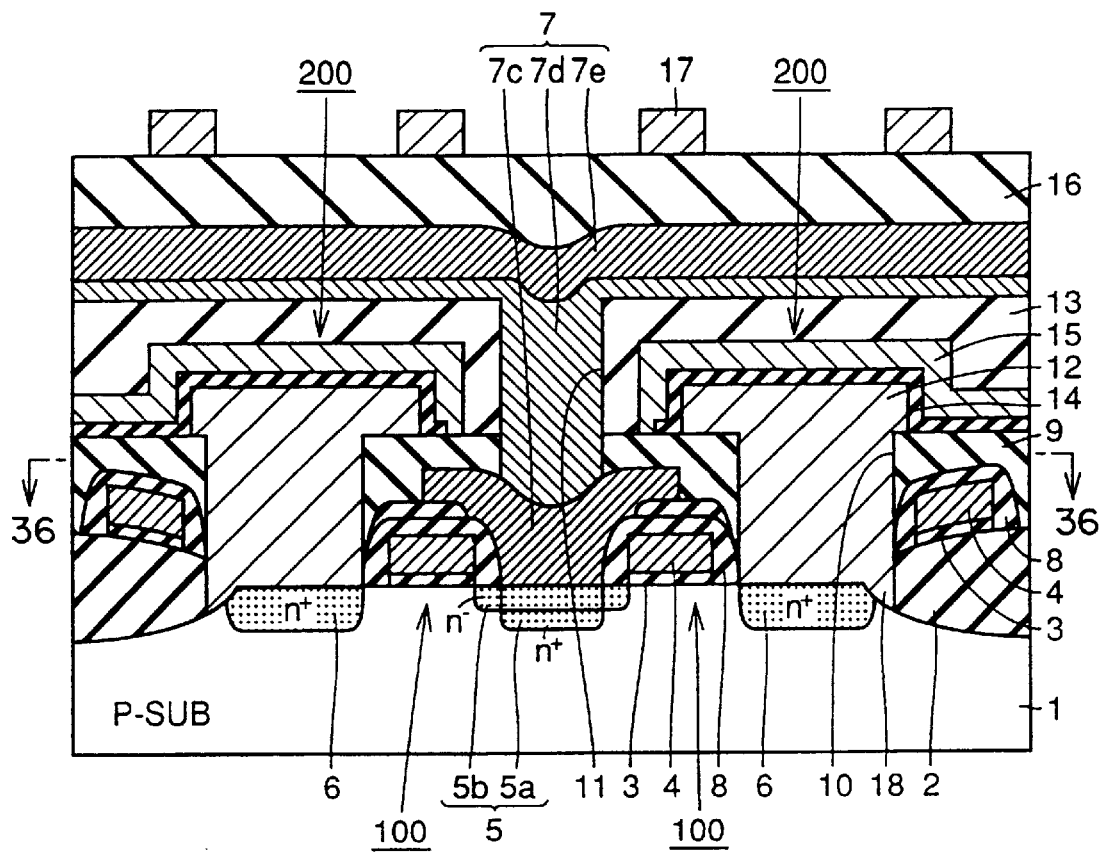
FIG. 35 is a cross section showing a semiconductor device of Embodiment 4 of the invention.
Figure 36:
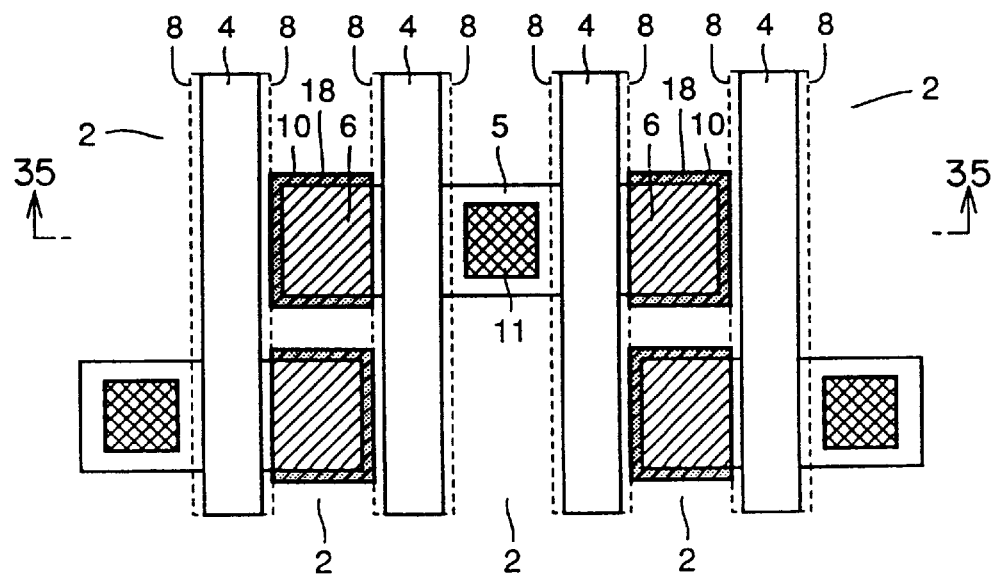
FIG. 36 is a plan showing the semiconductor device of Embodiment 4 of the invention.

A fourth embodiment of the invention will be described below with reference to FIGS. 35 and 36. Similarly to the third embodiment, the fourth embodiment will be described below in connection with a memory cell of the stacked type. FIG. 35 is a cross section of the memory cell of the fourth embodiment, and FIG. 36 is a plan of the same. FIG. 35 shows a section taken along line 35—35 in FIG. 36, and FIG. 36 shows a view taken along line 36—36 in FIG. 35.

Referring to these figures, the structure of the memory cell of the fourth embodiment differs from that of the third embodiment in that storage contact hole 10 accommodating storage node 12 includes groove 18. Owing to this structure, similarly to the second embodiment, the junction formed of p type semiconductor substrate 1 and the n⁺ impurity region, i.e., second impurity region 6 does not extend up to the end of isolating oxide film 2 containing many crystal defects in contrast to the prior art. Therefore, it is possible to eliminate a possibility of leak of a current from storage node 12 to semiconductor substrate 1 via second impurity region 6. Consequently, the cycle of refresh operation of the memory cell can be increased, and the memory cell can have high performance and high reliability. Also, the unit resistance of storage node 12 can be reduced.

Then, a method of manufacturing the memory cell of the fourth embodiment will be described below with reference to FIGS. 37 to 44. The process from the initial step to the step of forming high concentration impurity regions 5a and 6 is the same as that from the step in FIG. 3 to the step in FIG. 7 already described in connection with the first embodiment, and hence will not be described below.

Figure 37:
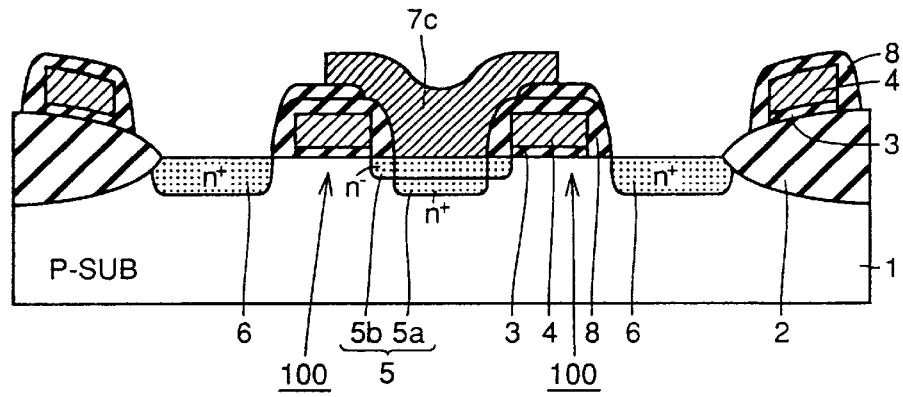
FIGS. 37–44 show 6th to 13th steps in a method of manufacturing the semiconductor device of Embodiment 4 of the invention, respectively.
Figure 38:
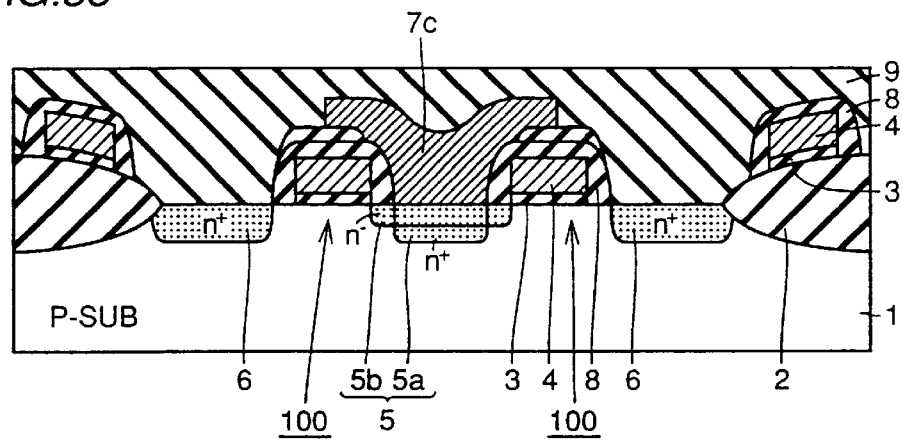

Referring to FIG. 37, polypad 7c made of, e.g., polycrystalline silicon and connected to first impurity region 5 is formed on semiconductor substrate 1. Referring to FIG. 38, first interlayer oxide film 9 made of, e.g., SiO$_2$ and having a thickness of about 8000 Å is then deposited over semiconductor substrate 1 by the CVD method.

Figure 39:
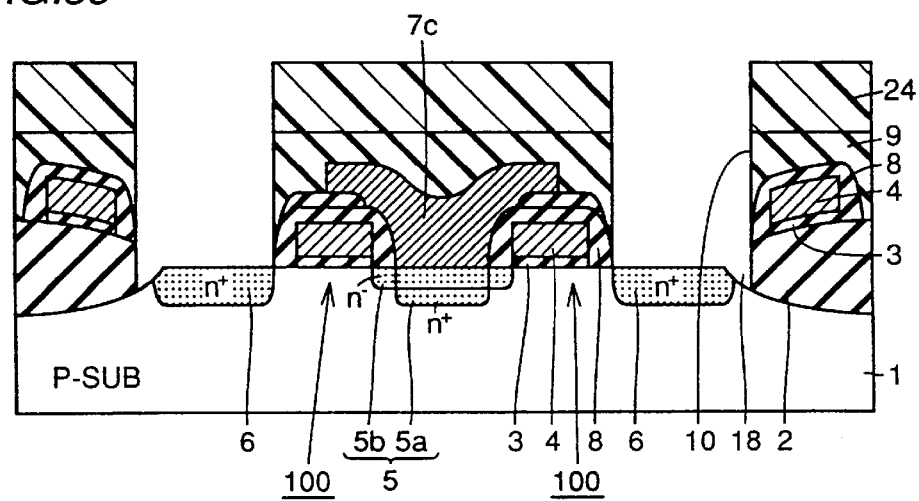

Referring to FIG. 39, a resist film 24 having openings each located above second impurity region 6 and the end of isolating oxide film 2 is formed on first interlayer oxide film 9. Using resist film 24 as a mask, anisotropic etching is performed in a gas atmosphere of C$_4$F$_8$ gas to form simultaneously storage node contact hole 10 and groove 18 by the self-align contact method.

Figure 40:
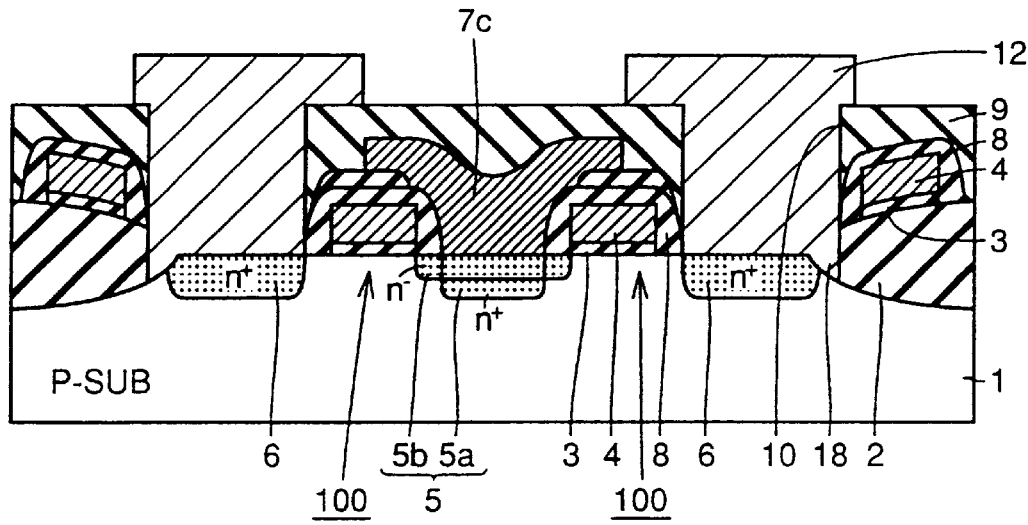

Referring to FIG. 40, polycrystalline silicon is deposited in storage node contact hole 10 to form storage node 12 having a thickness of about 6000 Å on first interlayer oxide film 9. At the same time, polycrystalline silicon fills groove 18.

Figure 41:
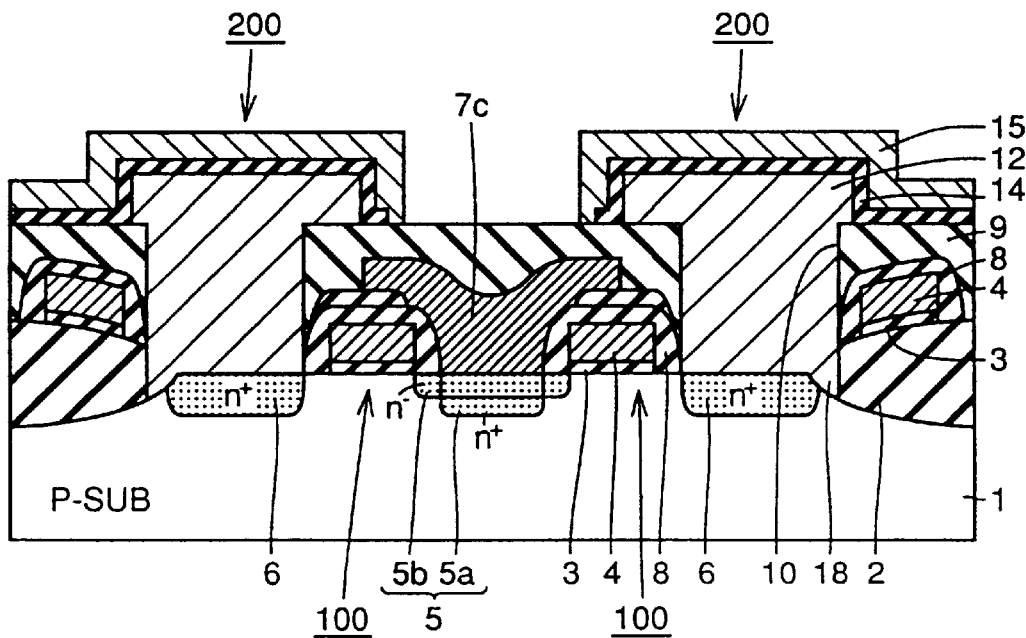

Referring to FIG. 41, dielectric film 14 and cell plate 15 are deposited over storage node 12. Thereby, stacked type capacitor 200 formed of storage node 12, dielectric film 14 and cell plate 15 is completed.

Figure 42:
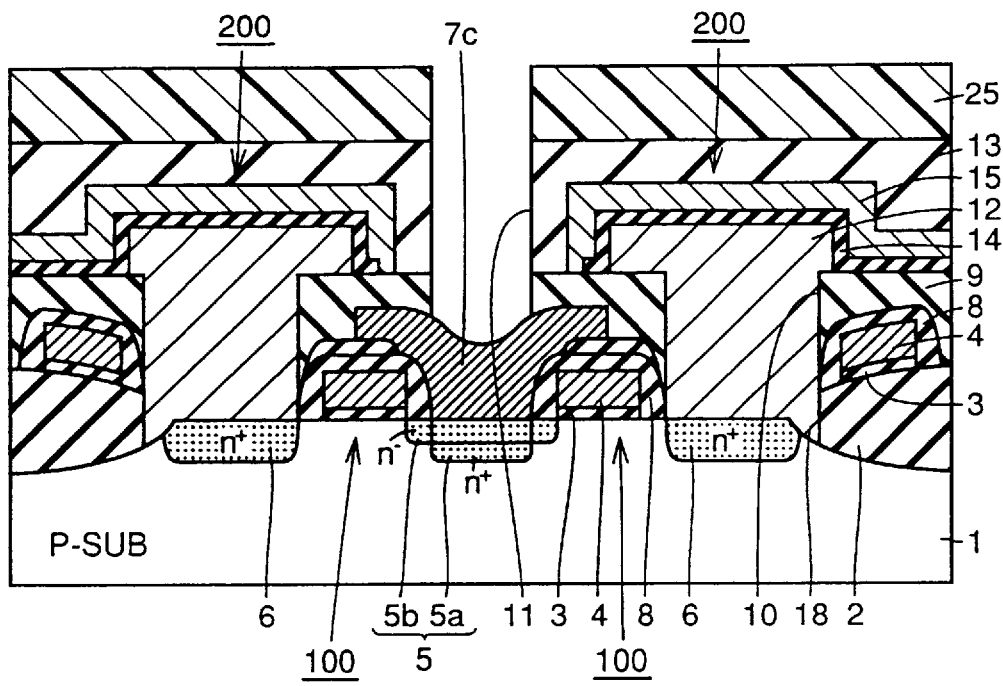

Referring to FIG. 42, second interlayer oxide film 13 of about 10000 Å in thickness made of, e.g., SiO$_2$ is formed on cell plate 15. Thereafter, a resist film 25 having an opening located above first impurity region 5 is formed on second interlayer oxide film 13. Using resist film 25 as a mask, bit line contact hole 11 is formed at first and second interlayer oxide films 9 and 13 by the self-align contact method.

Figure 43:
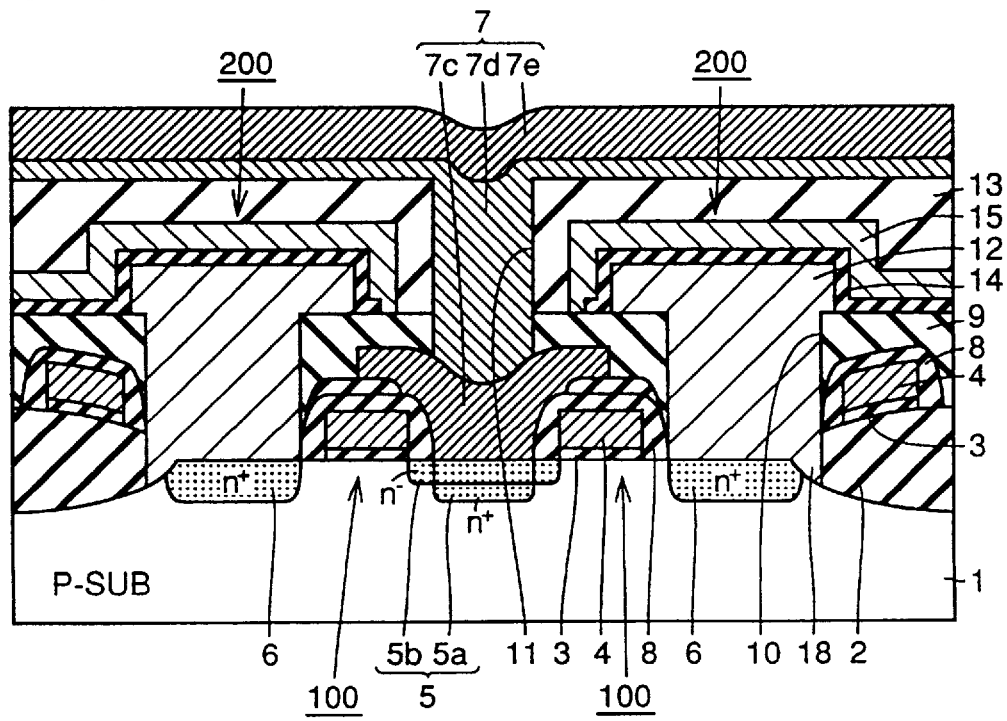

Referring to FIG. 43, after removing resist film 25, barrier metal layer 7d made of, e.g., tungsten is deposited in bit line contact hole 11, and metal layer 7e made of, e.g., aluminum is deposited on barrier metal layer 7d. Thereby, bit line 7 formed of polypad 7c, barrier metal layer 7d and metal layer 7e is completed.

Figure 44:
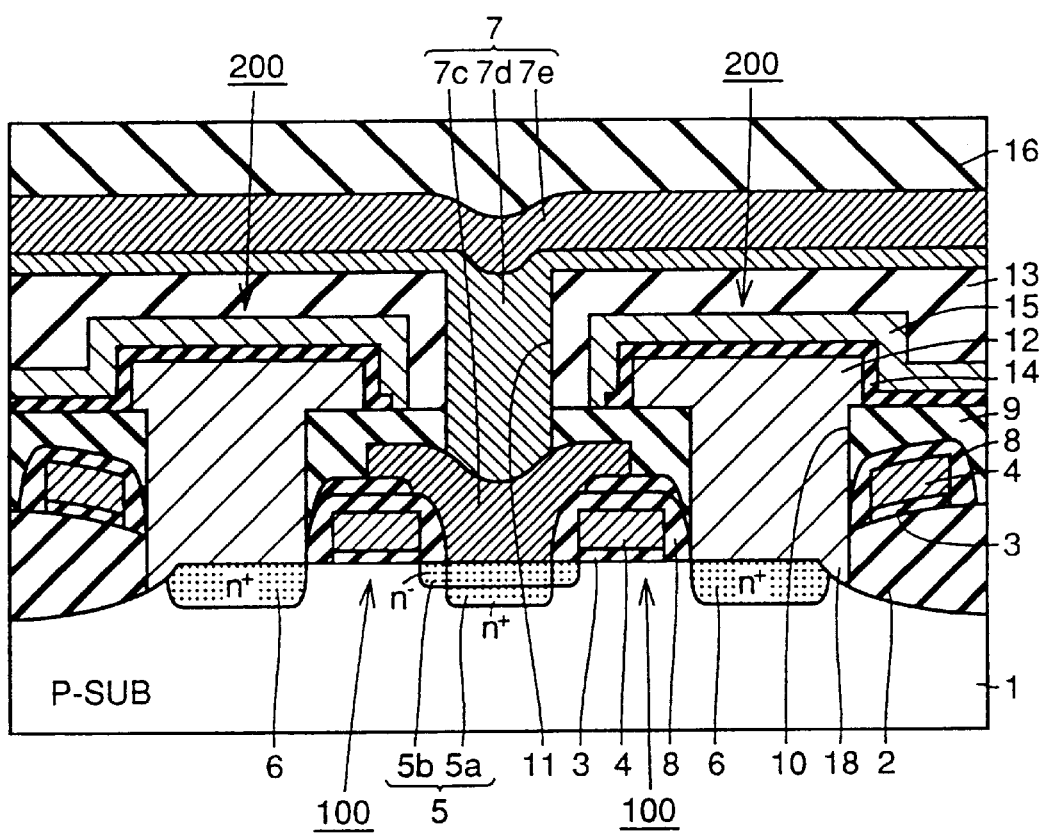

Referring to FIG. 44, third interlayer oxide film 16 made of, e.g., SiO$_2$ is formed on metal layer 7e, and further interconnection layers 17 of a predetermined configuration are formed on third interlayer oxide film 16, so that the memory cell shown in FIG. 35 is completed.

According to this fourth embodiment, formation of storage node contact hole 10 and formation of groove 18 are performed at the same step similarly to the second embodiment. Therefore, the number of manufacturing steps can be smaller than that in the manufacturing method of the first embodiment, and thus a cost for the manufacturing steps can be reduced.

In the second and fourth embodiments described above, it is necessary to take into consideration that p type semiconductor substrate 1 and n type second impurity region 6 would become short owing to storage node 12, as shown in FIGS. 16 and 35.

A technique for preventing the short circuit between n type second impurity region 6 and p type semiconductor substrate 1 is shown in, for example, U.S. Pat. No. 5,208, 470. In this document, a method is disclosed in which an impurity region is formed to cover the bottom wall of contact hole 10 by implanting impurity through contact hole 10 after its formation.

Figure 45:
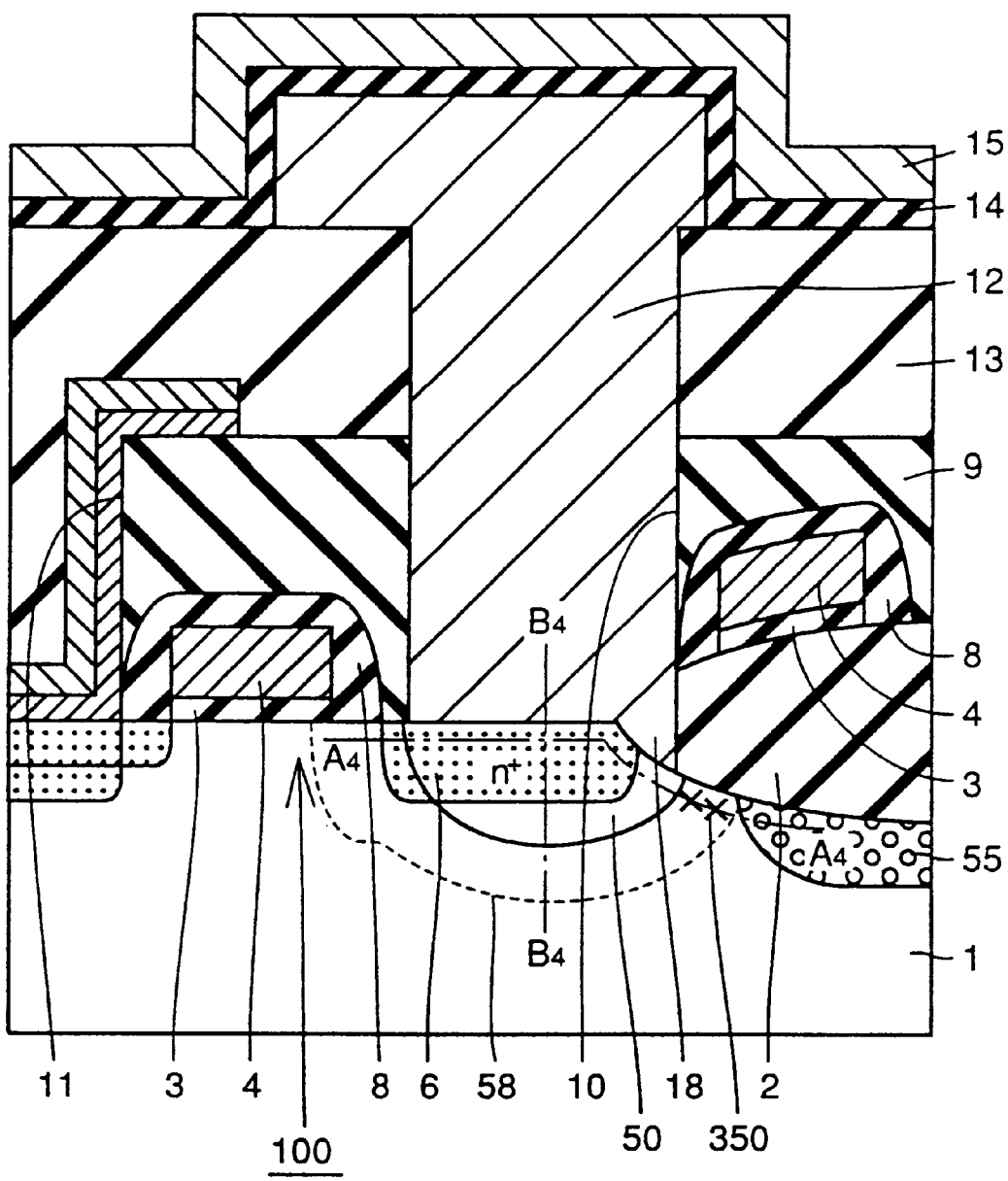
FIG. 45 is a schematic cross section showing a conventional structure for preventing occurrence of short-circuit between a source/drain region and a substrate.

FIG. 45 is a schematic cross section for showing a structure in which the method as described in the above-mentioned document is applied to the structure shown in FIG. 16. Referring to FIG. 45, an n type impurity region 50 can be formed so as to cover the bottom wall of contact hole 10 by utilizing this method. By thus forming n type impurity region 50, occurrence of short circuit between n type second impurity region 6 and p type semiconductor substrate 1 due to storage node 12 is prevented. Accordingly, the semiconductor device in which this n type impurity region 50 is formed will operate normally.

Figure 46:
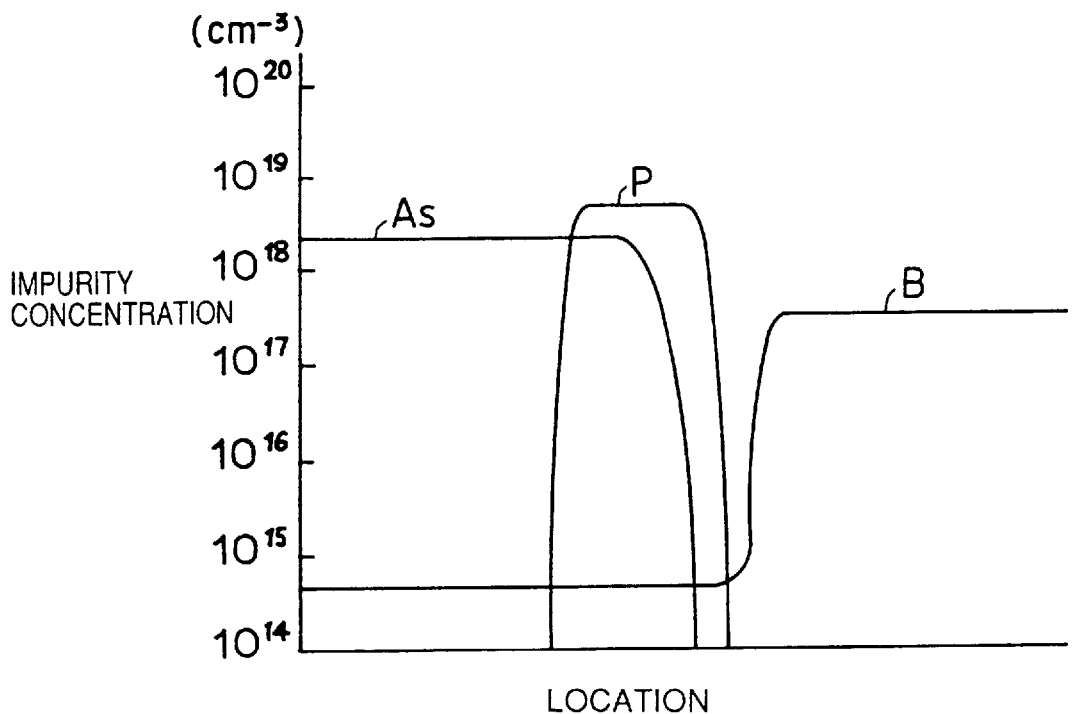
FIG. 46 is a graph showing a distribution of impurity concentration at various portions along $A_4$—$A_4$ of FIG. 45.
Figure 47:
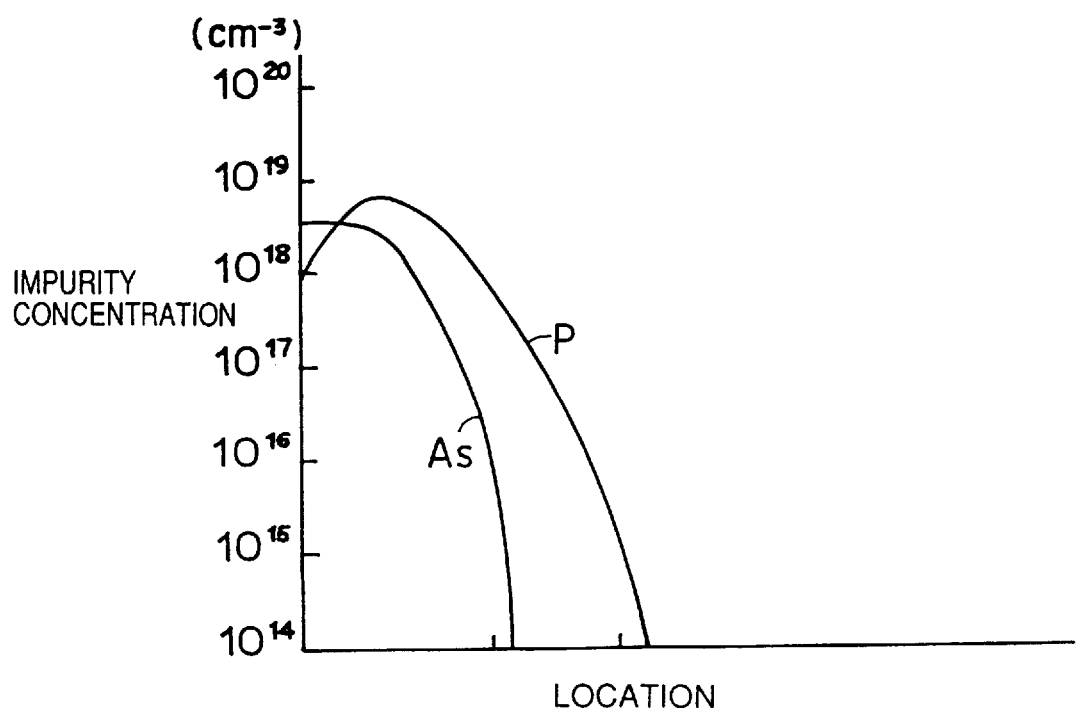
FIG. 47 is a graph showing a distribution of impurity concentration at various portions along $B_4$—$B_4$ of FIG. 45.

Impurity concentrations at various portions of this semiconductor device are shown in FIGS. 46 and 47.

FIGS. 46 and 47 are graphs showing the distribution of impurity concentration in various portions along lines A$_4$—A$_4$ and B$_4$—B$_4$ of FIG. 45.

Referring to FIGS. 45 to 47, arsenic (As) is introduced to n type second impurity regions 6 at a concentration of $1 \times 10^{18}$ to $1 \times 10^{19}$ cm$^{-3}$, and phosphorous (P) is introduced to n type impurity region 50 at a concentration of $1 \times 10^{18}$ to $1 \times 10^{19}$ cm$^{-3}$. In addition, boron (B) is introduced to p type semiconductor substrate 1 at a concentration of $1 \times 10^{14}$ to $1 \times 10^{15}$ cm$^{-3}$ and to element isolation impurity region 55 at a concentration of $1 \times 10^{17}$ to $1 \times 10^{18}$ cm$^3$.

Since the structure of the portions other than what is described above is substantially similar to that of FIG. 16, the same components are denoted by the same reference characters and descriptions thereof are not given.

In the semiconductor device as shown in FIG. 45, prevention of narrow channel effect has resulted in increase of junction leak current. The following is a detailed description of this problem.

In the semiconductor device as shown in FIG. 45, element isolation impurity region 55 is provided so as to increase the effect of electrical isolation between the adjacent elements. This element isolation impurity region 55 is formed such that it does not extend excessively toward the side of the element region. This is to prevent the narrow channel effect of the transistor caused by diffusion of impurity in element isolation impurity region 55 to the side of the element region. Accordingly, at region S between element isolation impurity region 55 and n type impurity region 50, p type semiconductor substrate 1 with a relatively low impurity concentration is distributed.

Also, as an effective method for preventing the narrow channel effect, formation of a retrograde well disclosed in, for example, Nishihara et al., IEDM '88 Tech. Digest. pp. 100–103 (1988) can be employed. However, when the retrograde well is formed, region S between n type impurity region 50 and the retrograde well would be larger than in the structure shown in FIG. 45.

Crystal defects which could not be removed completely by the second and fourth embodiments remain within this region S between n type impurity region 50 and element isolation impurity region 55.

When the semiconductor device is operated, voltage is applied between n type impurity regions 6, 50 and p type semiconductor substrate 1. As a result, a depletion layer 58 is formed at the pn junction including n type impurity regions 6, 50 and p type semiconductor substrate 1. Since the concentration of impurity in p type semiconductor substrate 1 is set relatively low as described above, this depletion layer 58 spreads widely especially to the side of p type semiconductor substrate 1. Accordingly, crystal defects 350 which are left at region S between element isolation impurity region 55 and n type impurity region 50 is incorporated into this depletion layer 58.

In general, when defects of crystal exist within the depletion layer, it is known that carrier is generated in the defects of crystal which causes generation of junction leak current. As a result, crystal defects 350 incorporated into depletion layer 58 would produce junction leak current such that charge holding characteristics of the carrier is degraded. Since the charge of the capacitor is thus not likely to be maintained, the rewrite cycle of the stored content of the memory cell must be made shorter when DRAM is employed, which degrades the refreshing characteristics. Also, the soft error resistance which cancels the electron-hole pair due to irradiation of α-particle with respect to the stored charge of the capacitor is also degraded.

The following descriptions are made for semiconductor devices in which leak current owing to remaining crystal defects is suppressed, implemented as Embodiments 5 to 7.

Embodiment 5

Figure 48:
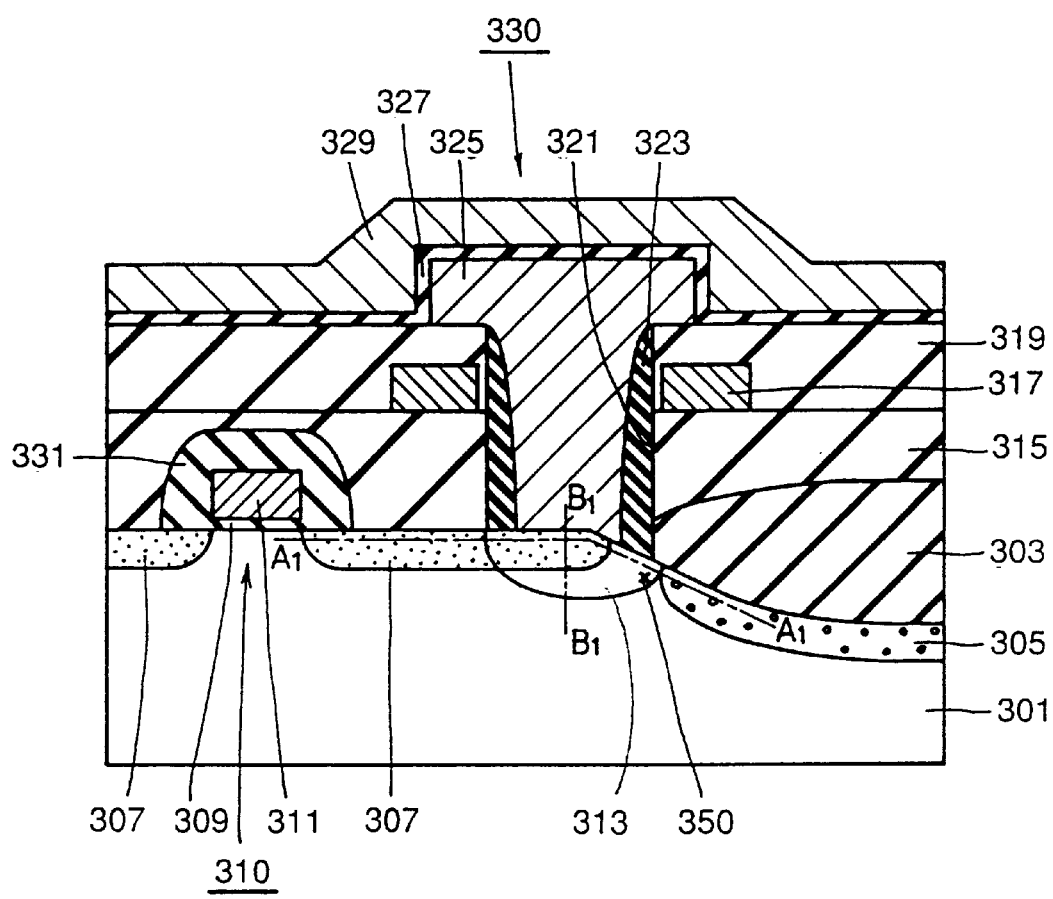
FIG. 48 is a schematic cross section showing a structure of a semiconductor device according to Embodiment 5 of the invention.

Referring to FIG. 48, an element isolation oxide film 303 is formed so as to isolate the surface of a p type silicon substrate 301. An element isolation impurity region 305 is formed at p type silicon substrate 301 to be in contact with the underside of this element isolation oxide film 303. At a region of p type silicon substrate 301 isolated by element isolation oxide film 303, an nMOS transistor 10 is formed.

The nMOS transistor 310 has a pair of n type source/drain regions 307 and 307, a gate oxide film 309, and a gate electrode layer 311. The pair of n type source/drain regions 307 and 307 are formed at the surface of p type silicon substrate 301 with a predetermined distance between each other. Gate electrode layer 311 is formed on the region between this pair of n type source/drain regions 307 and 307 with a gate oxide film 309 therebetween. An insulating layer 331 is formed to cover the side and top surfaces of gate electrode layer 311.

A first interlayer insulating layer 315 is formed entirely on the surface of p type silicon substrate 301, covering this nMOS transistor 310. On a predetermined region of this first interlayer insulating layer 315, a plurality of bit line interconnections 317 are formed extending parallel to one another. Covering these bit line interconnections 317, a second interlayer insulating layer 319 is formed on the first interlayer insulating layer 315.

At first and second interlayer insulating layers 315 and 319, a contact hole 321 reaching a portion of a surface of n type source/drain region 307 is formed, passing between the paired bit line interconnections 317, 317. The diameter of the opening of this contact hole 321 is set so that it is larger than the diameter of the opening of contact hole 10 shown in FIG. 45.

An n type impurity region 313 is formed to cover the bottom surface of contact hole 321. This n type impurity region 313 has a region which partially overlaps n source/drain region 307, and is formed to be in contact with element isolation impurity region 305. A side wall insulating layer 323 is formed to cover the side wall of contact hole 321. A capacitor 330 is formed to be electrically connected to n type source/drain region 307 via this contact hole 321.

Capacitor 330 has a storage node 325, a capacitor dielectric film 327, and a cell plate 329. Storage node 325 is in contact with n type source/drain region 307 and n type impurity region 313 via contact hole 321 and is formed to extend over second interlayer insulating layer 319. Cell plate 329 is formed on second interlayer insulating layer 319 so as to cover storage node 325 with capacitor dielectric film 327 therebetween.

Figure 49:
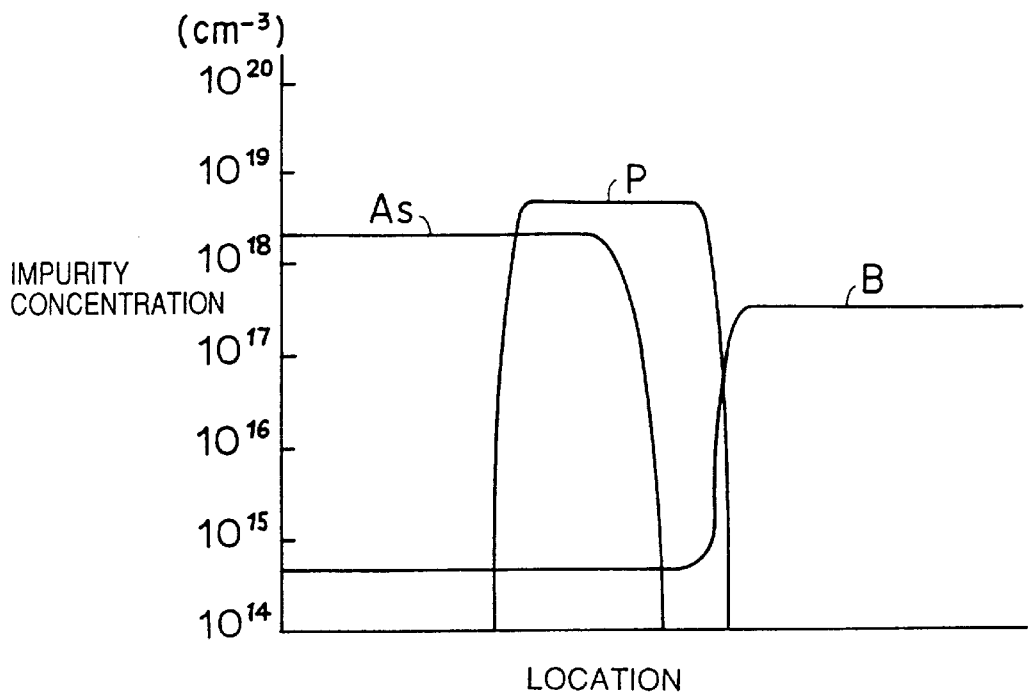
FIG. 49 is a graph showing a distribution of impurity concentration at various portions along line $A_1$—$A_1$ of FIG. 48.
Figure 50:
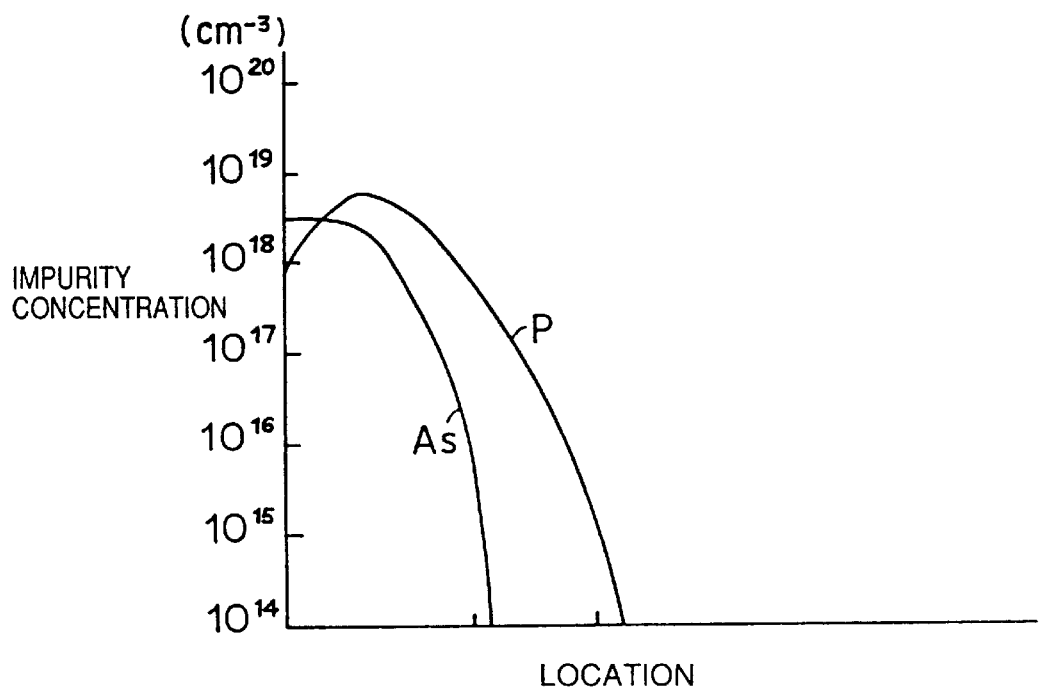
FIG. 50 is a graph showing a distribution of impurity concentration at various portions along line $B_1$—$B_1$ of FIG. 48.

Referring to FIGS. 48 to 50, boron is introduced to p type silicon substrate 301 at a concentration not lower than $1 \times 10^{14}$ cm$^{-3}$ and not higher than $1 \times 10^{15}15$ cm$^{-3}$. To element isolation impurity region 305, boron is introduced at a concentration not lower than $1 \times 10^{17}$ cm$^{-3}$ and not higher than $1 \times 10^{18}$ cm$^{-3}$. To n type source/drain regions 307, arsenic is introduced at a concentration not lower than $1 \times 10^{18}$ cm$^{-3}$ and not higher than $1 \times 10^{19}$ cm$^{-3}$. In addition, phosphorous is introduced to n type impurity region 313 at a concentration not lower than $1 \times 10^{18}$ cm$^{-3}$ and not higher than $1 \times 10^{19}$ cm$^{-3}$.

A method of manufacturing the semiconductor device according to the present embodiment will be described next.

Figure 51:
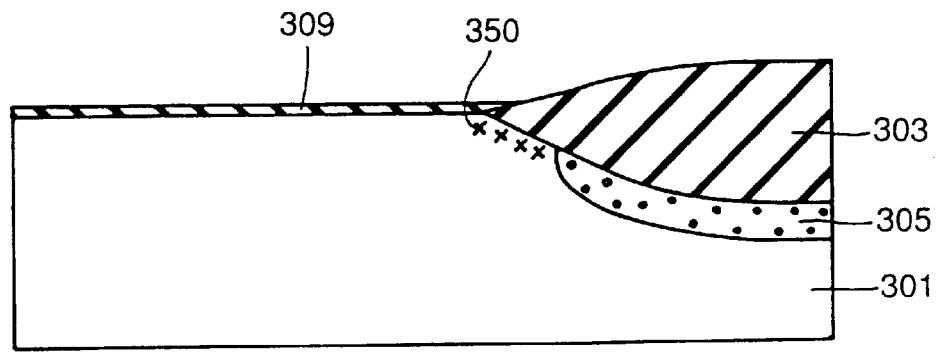
FIGS. 51–64 are schematic cross sections showing the process in the method of manufacturing the semiconductor device according Embodiment 5 of the invention in the order of the steps performed.

Referring first to FIG. 51, an element isolation region including element isolation oxide film 303 and element isolation impurity region 305 is formed by ordinary LOCOS. Due to this LOCOS, crystal defects 350 is formed at the underside of the end portion of element isolation oxide film 303 when element isolation region is formed. Thereafter, gate oxide film 309 is formed either by oxidation of p type substrate 301 or by CVD (Chemical Vapor Deposition).

Figure 52:
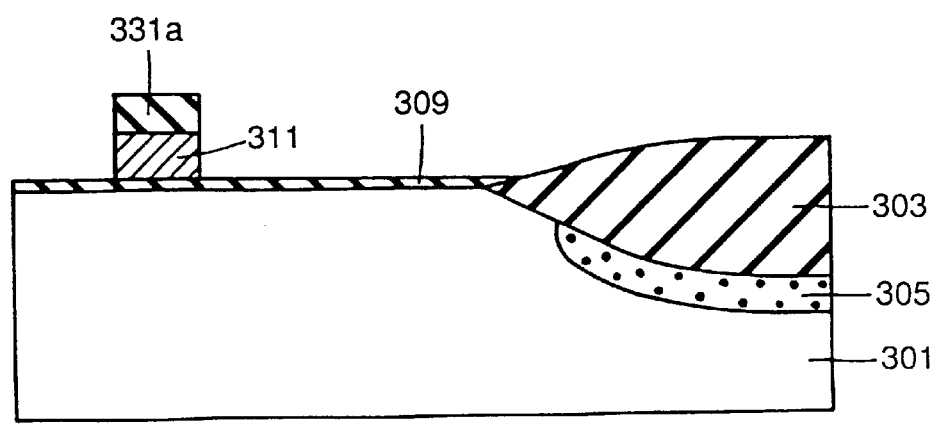

Referring to FIG. 52, conductive layer 311 of polycrystalline silicon to which an impurity is introduced (hereinafter referred to as doped polycrystalline silicon) or of a metal such as Al (aluminum), W (tungsten), Ti (titanium) or alloys thereof and an insulating film 331a of silicon oxide film, silicon nitride film or the like on this conductive layer 311 are formed as a stack. Thereafter, conductive layer 311 and insulating layer 331a are patterned by dry etching by photolithography, RIE (Reactive Ion Etching) or the like to form gate electrode layer 311.

Figure 53:
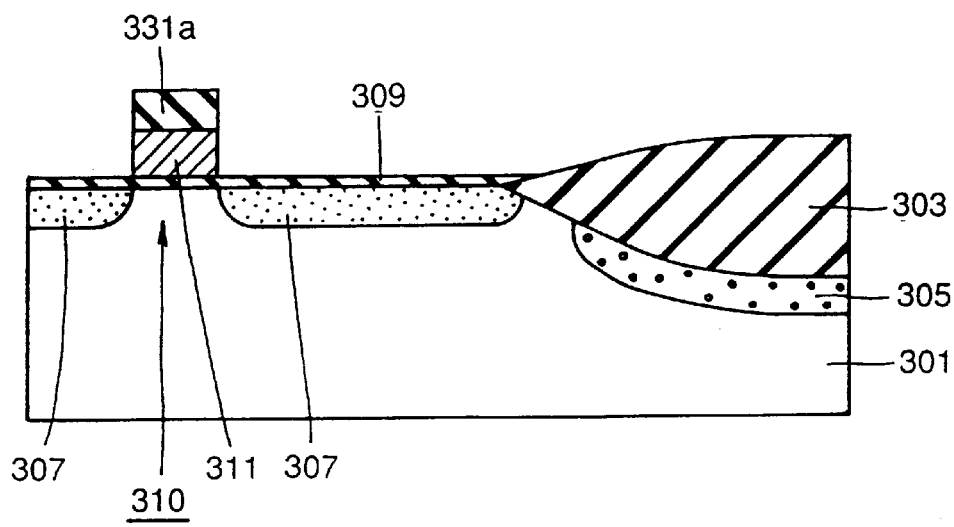

Referring to FIG. 53, using gate electrode layer 311 and element isolating oxide film 303 as masks, implantation of arsenic is performed with an acceleration voltage of 30 keV and a dose of $5 \times 10^{13}$ cm$^{-2}$. As a result, pair of n type source/drain regions 307, 307 are formed so as to sandwich the lower portion of gate electrode layer 311. This pair of n type source/drain regions 307, 307, gate insulating layer 309, and gate electrode layer 311 form an nMOS transistor 310.

The above-described condition for ion plantation of arsenic may range from 5 to 50 keV in acceleration voltage and $1 \times 10^{13}$ to $5 \times 10^{14}$ cm$^{-2}$ in dosage, meaning that is not limited to the condition as defined above.

Figure 54:
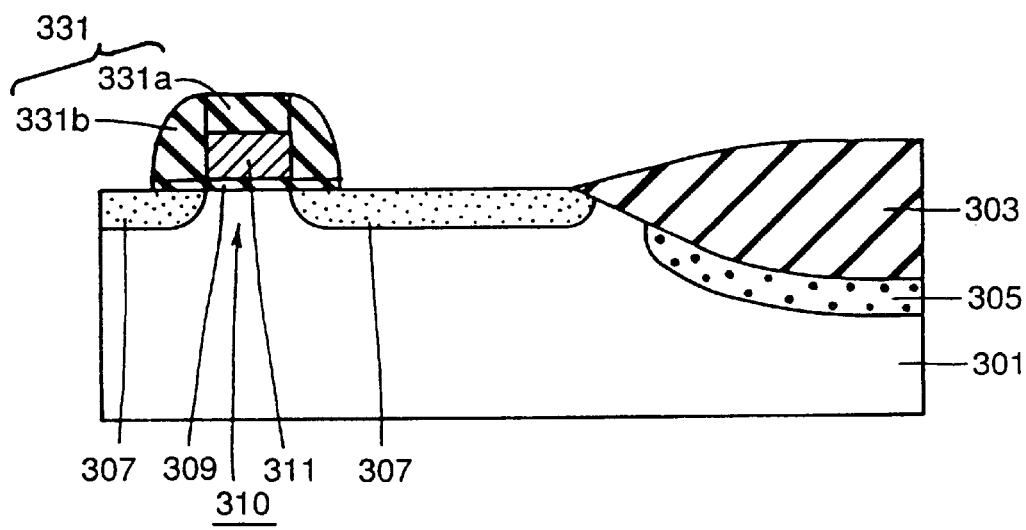

Referring to FIG. 54, an insulating layer of silicon oxide film, silicon nitride film or the like is deposited entirely on the surface by CVD, and then an anisotropical etching is performed on the entire surface by RIE. As a result, a side wall insulating layer 331b covering the side wall of gate electrode layer 311 is formed. Insulating layer 331a and side wall insulating layer 331b form insulating layer 331 which surrounds the periphery of gate electrode layer 311.

Figure 55:
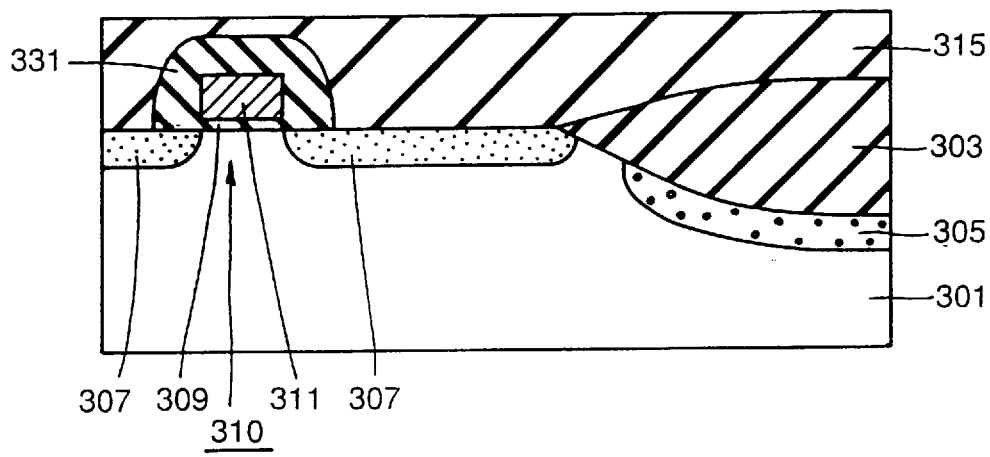

Referring to FIG. 55, a first interlayer insulating layer 315 of silicon oxide film, silicon nitride film or the like is formed entirely on the surface by CVD. The upper surface of this first interlayer insulating layer 315 can be made relatively flat by methods such as forming a thick film and then making it thinner to obtain a desired thickness, or heating the film after it is stacked (i.e., performing a reflow).

Furthermore, a resist pattern (not shown) for forming a bit line contact hole is formed by photolithography. Using this resist pattern as a mask, dry etching by RIE or the like is performed to form a bit line contact hole (not shown) at first interlayer insulating layer 315. Thereafter, the resist pattern is removed.

Figure 56:
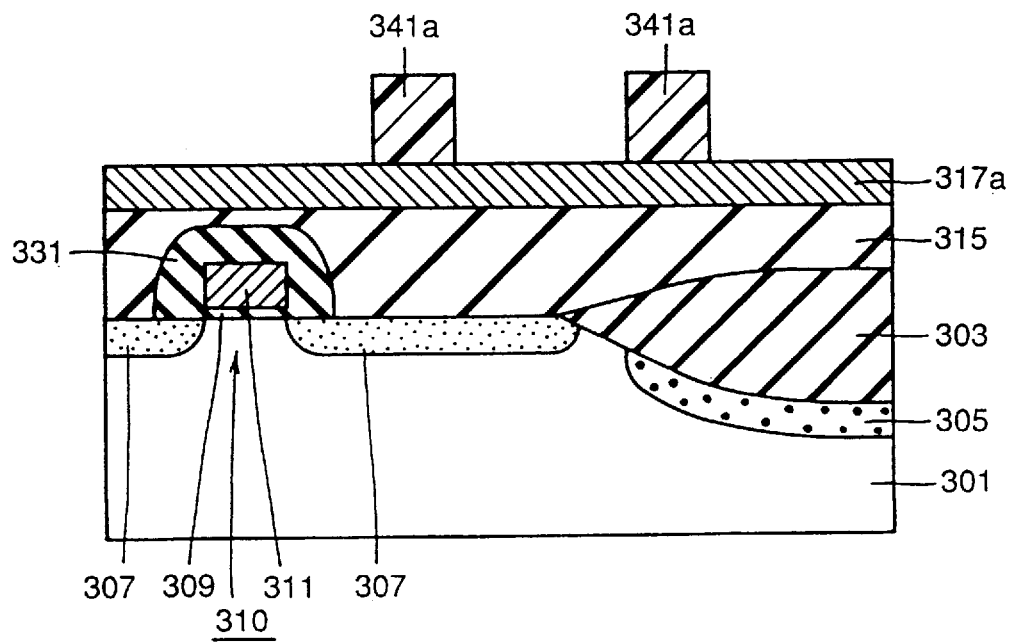

Referring to FIG. 56, a conductive layer 317a which is to be the bit line is formed on first interlayer insulating layer 315. On this conductive layer 317a, a resist pattern 341a having a desired shape is formed by photolithography. Using this resist pattern 341a as a mask, an anisotropical etching such as RIE is performed to conductive layer 317a.

Figure 57:
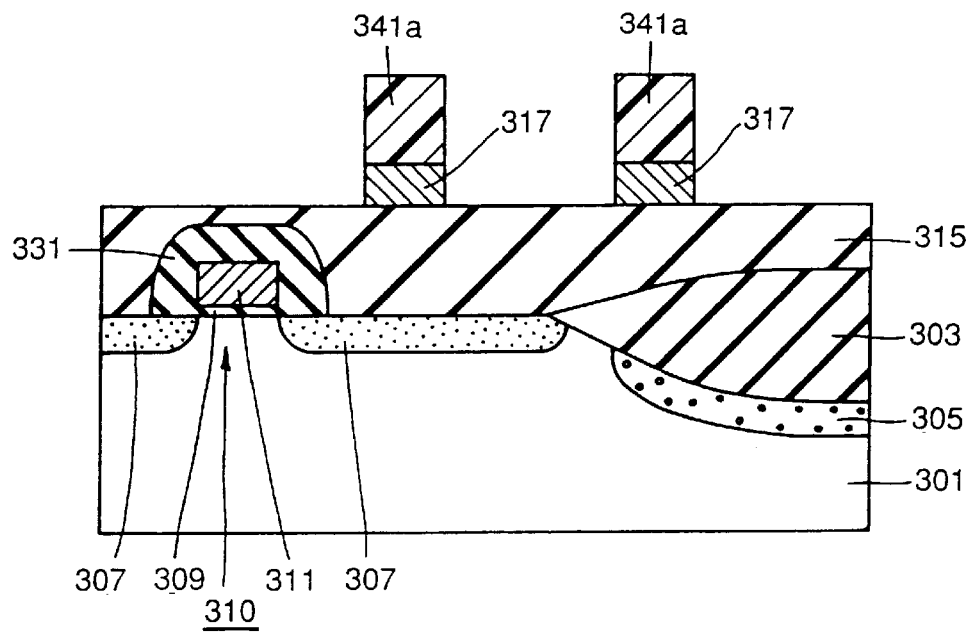

Referring to FIG. 57, bit line interconnections 317 is formed by this anisotropical etching. Thereafter, resist pattern 341a is removed either by ashing in the plasma of an oxygen ($O_2$) atmosphere or dipping into $H_2SO_2$ solution.

Figure 58:
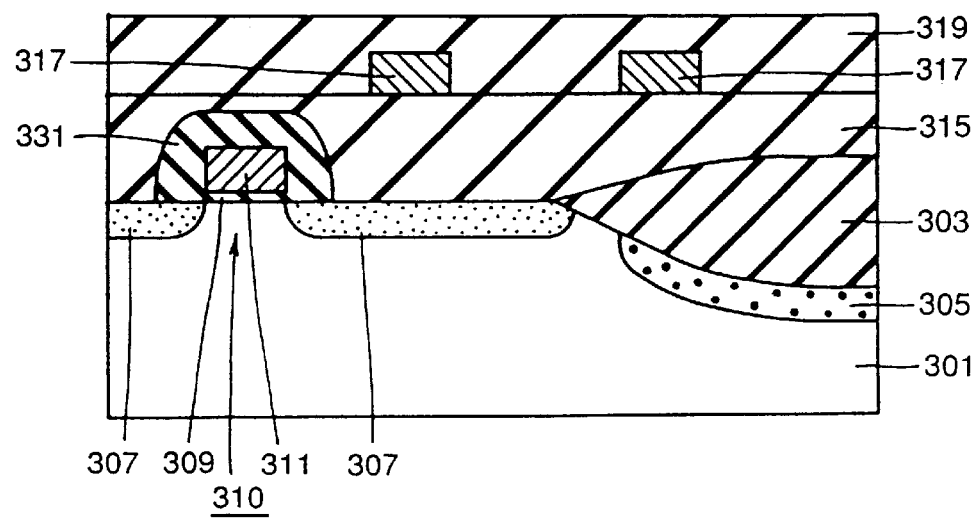

Referring to FIG. 58, a second interlayer insulating layer 319 of silicon oxide film, silicon nitride film or the like is formed by CVD. The upper surface of this second interlayer insulating layer 319 can also be made relatively flat by the methods such as forming a thick film and then making it thinner to obtain a desired thickness or heating the film after it is stacked, as in the case of first interlayer insulating layer 315.

Figure 59:
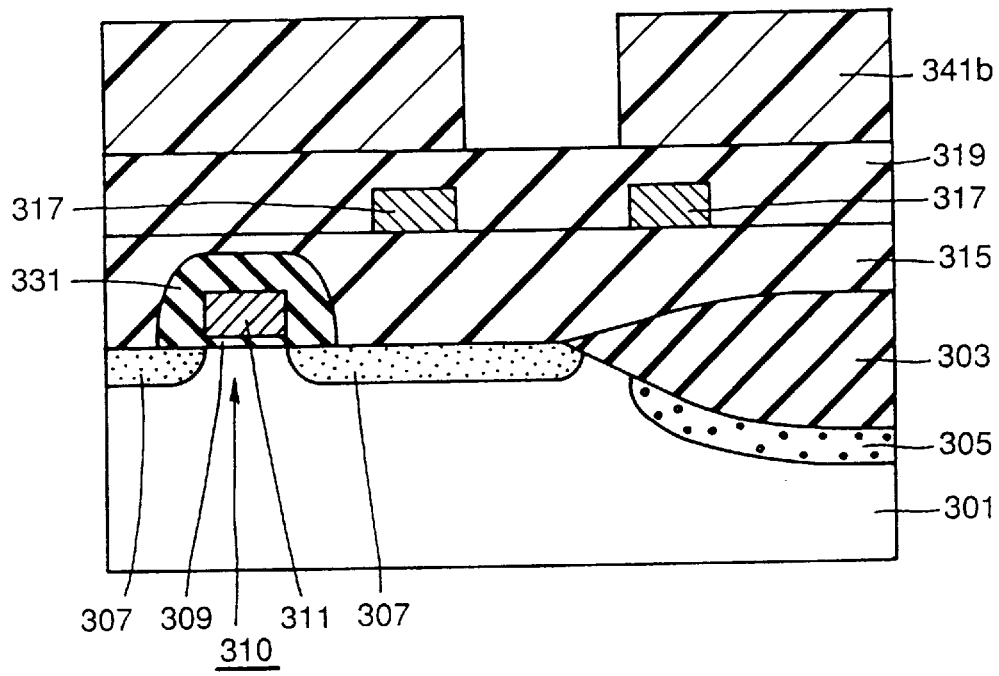

Referring to FIG. 59, a resist pattern 341b having a desired shape is formed on second interlayer insulating layer 319 by photolithography. Using this resist pattern 341b as a mask, first and second interlayer insulating layers 315 and 319 are subjected to an anisotropical dry etching by RIE. The resist pattern 341b is then removed.

Figure 60:
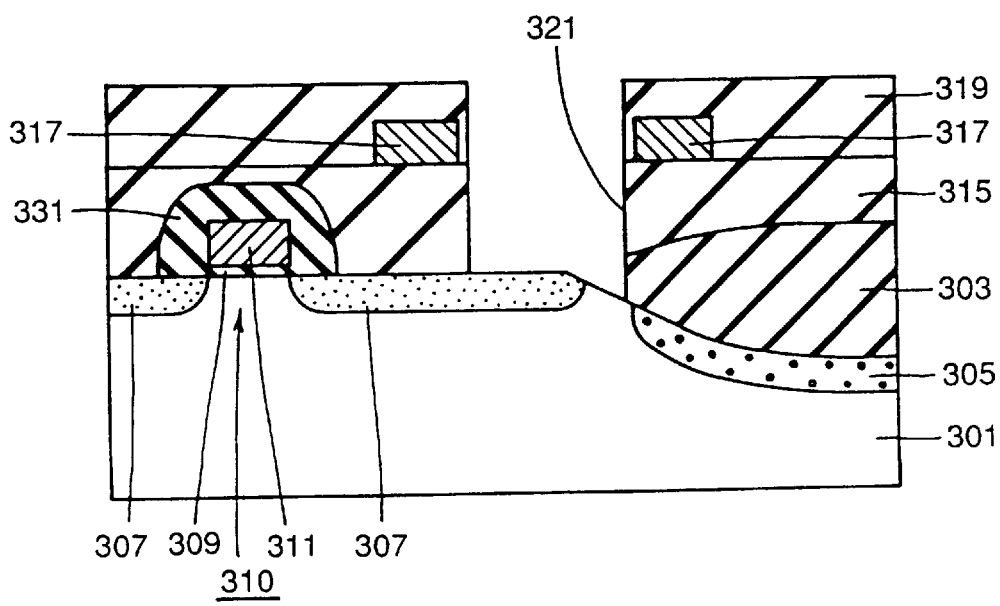

Referring to FIG. 60, a contact hole 321 is formed by the above-described etching, passing between the bit lines 317 extending parallel to one another and reaching a portion of a surface of n type source/drain region 307 and a portion of a surface of p type silicon substrate 301.

When this contact hole 321 is formed, an end portion of element isolation oxide film 303 is removed.

Figure 61:
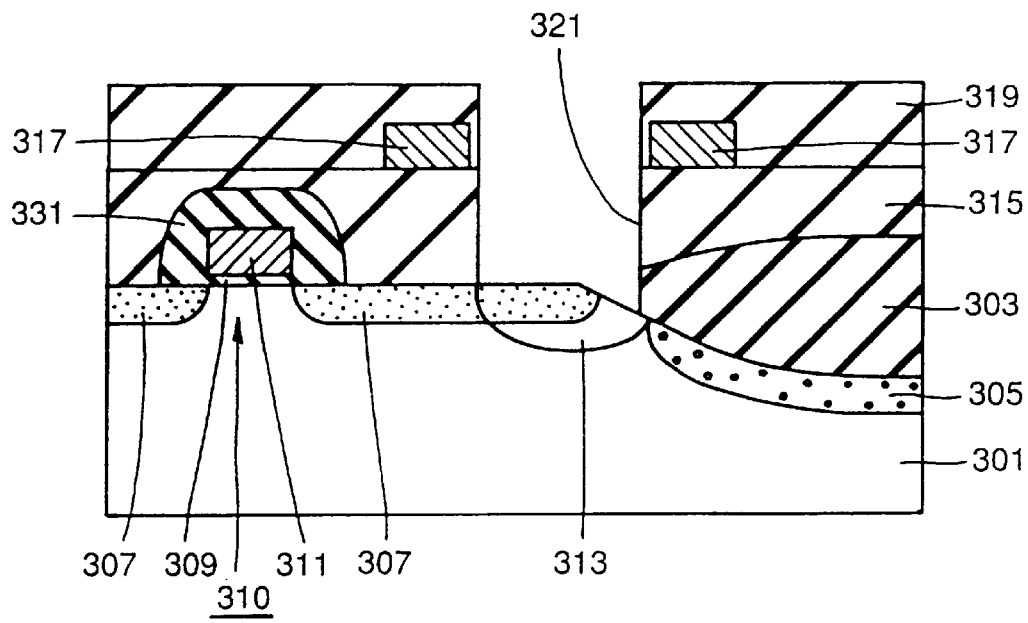

Referring to FIG. 61, an ion implantation of phosphorous is performed entirely to the surface at an acceleration voltage of 70 keV and dose of $8 \times 10^{13}$ cm$^{-2}$. Thus, ions of phosphorous is implanted in a self-aligned manner to form n type impurity region 313 covering the bottom surface of contact hole 321. This n type impurity region 313 is formed to have a region which partially overlaps n type source/drain region 307 and to be in contact with element isolation impurity region 305.

The condition for implanting phosphorous described above ranges from 20 to 200 keV in acceleration voltage and from $1 \times 10^{13}$ to $1 \times 10^{15}$ cm$^{-2}$ in dose, meaning that it is not limited to the above-described condition. In addition, not only phosphorous but arsenic may also be applied as the impurity seed.

Figure 62:
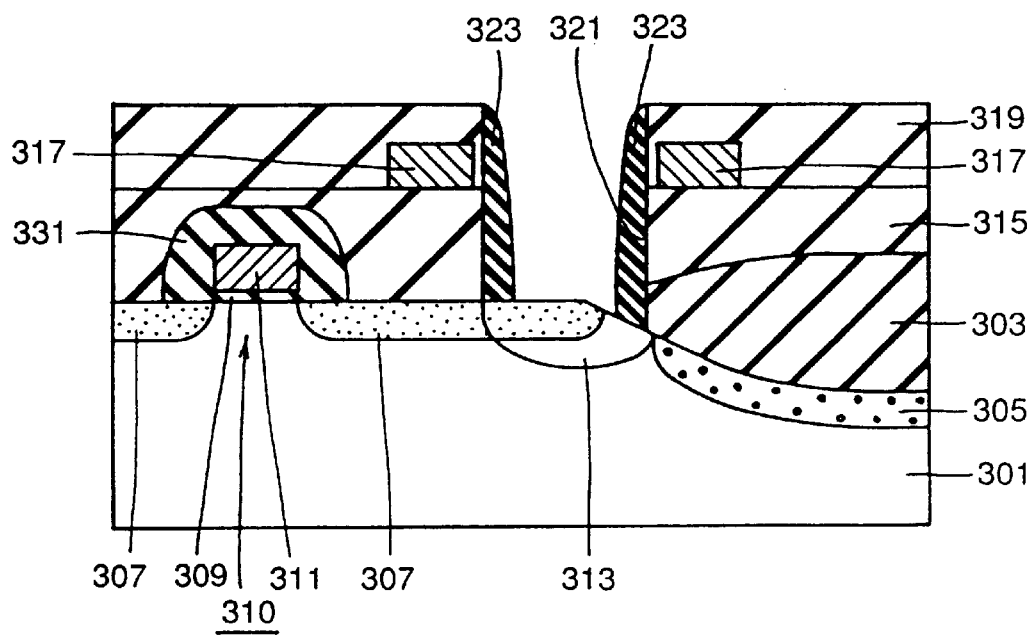

Referring to FIG. 62, an insulating layer of silicon oxide film, silicon nitride film or the like is formed to cover the inner wall surface of contact hole 321 and second interlayer insulating layer 319. An anisotropical dry etching by RIE or the like is performed entirely onto the surface of this insulating layer until at least the bottom wall of contact hole 321 is exposed. Thus, side wall insulating layer 323 is formed at the side wall of contact hole 321 in a self-aligned manner.

Even when the side surface of bit line interconnection 317 is exposed from the side wall of contact hole 321, formation of this side wall insulating layer 323 allows the exposed side wall of bit line interconnection 317 to be covered with this side wall insulating layer 323.

Figure 63:
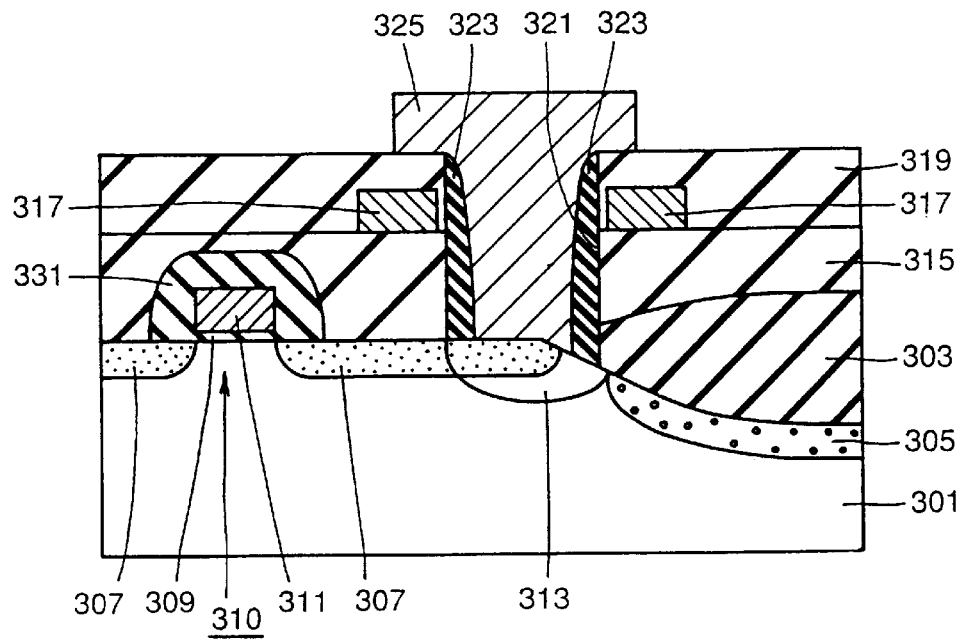

Referring to FIG. 63, a conductive layer formed of doped polycrystalline silicon layer or metal such as Al, W, Ti, Pt (platinum), Cu (copper), Ag (silver) or alloys thereof is formed entirely on the surface. On this conductive layer, a resist pattern (not shown) having a desired shape is formed by photolithography. Using this resist pattern as a mask, the conductive layer is subjected to etching by RIE or the like. By this etching, storage node 25 is formed which is in contact with a portion of a surface of n type source/drain region 307 and n type impurity region 313 through contact hole 321 and which extends over second interlayer insulating layer 319. The resist pattern is then removed.

Figure 64:
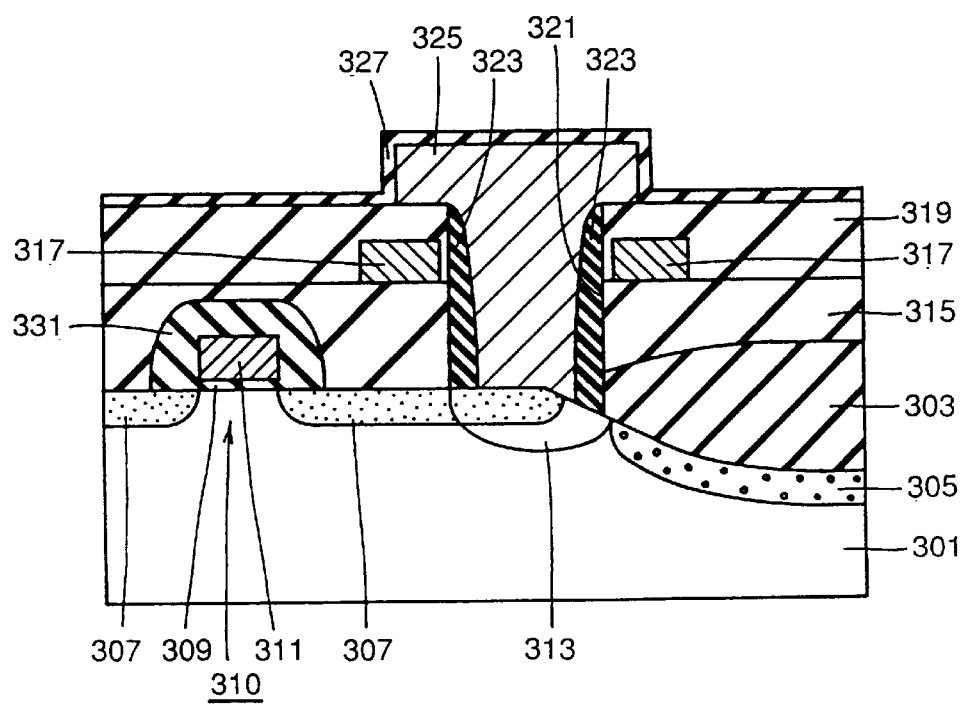

Referring to FIG. 64, capacitor dielectric film 327 is formed to cover the surface of storage node 325. Thereafter, on capacitor dielectric film 327, a conductive layer formed of doped polycrystalline silicon or metal such as Al, W, Ti, Pt, Cu, Ag or alloys thereof is formed. On this conductive layer, a resist pattern having a desired shape is formed by photolithography. Using this resist pattern as a mask, the conductive layer is subjected to etching by RIE or the like. As a result, as shown in FIG. 48, a cell plate 329 is formed which is opposite to storage node 325 with capacitor dielectric film 327 therebetween. Storage node 325, capacitor dielectric film 327, and storage node 329 form capacitor 330.

As described above, in this embodiment, n type impurity region 313 is formed such that it is in contact with element isolation impurity region 305 as shown in FIG. 48. Therefore, the defects 350 formed at the underside of the end portion of element isolation oxide film 303 will exist in n type impurity region 313. These n type impurity region 313 and element isolation impurity region 305 have a relatively high impurity concentration as compared to p type silicon substrate 301. Accordingly, the extension of depletion layer at pn junction portion formed of n type impurity region 313 and element isolation impurity region 305 is suppressed significantly. Thus, the number of defects in crystal 350 incorporated in this depletion layer is also reduced significantly as compared to the case of the conventional example in FIG. 45. Accordingly, the leak current generated by the defects of crystal incorporated in this depletion layer is reduced.

Since this generation of leak current can be reduced, the charge holding characteristics of capacitor 330 is made satisfactory so that the refreshing characteristics and the soft error resistance of the memory cell formed of nMOS transistor 310 and capacitor 330 are made satisfactory.

Also, in this embodiment, the diameter of the opening of contact hole 321 must be set larger than in the example shown in FIG. 45 since n type impurity region 313 and element isolation impurity region 305 have to be in contact with each other while preventing the narrow channel effects. This contact hole 321 is formed to pass between bit lines 317 which extend parallel to one another. Accordingly, when the diameter of the opening of contact hole 321 is made larger, the side walls of the bit lines 317 might be exposed from the side wall of contact hole 321.

In this embodiment, however, side wall insulating layer 323 is provided to cover the side wall of contact hole 321.

Therefore, even when the side walls of bit lines 317 are exposed from the side wall of contact hole 321, the exposed side walls of bit lines 317 would be covered by side wall insulating layer 323. Accordingly, occurrence of short-circuit between storage node 325 and bit line 317 is prevented.

Embodiment 6

Figure 65:
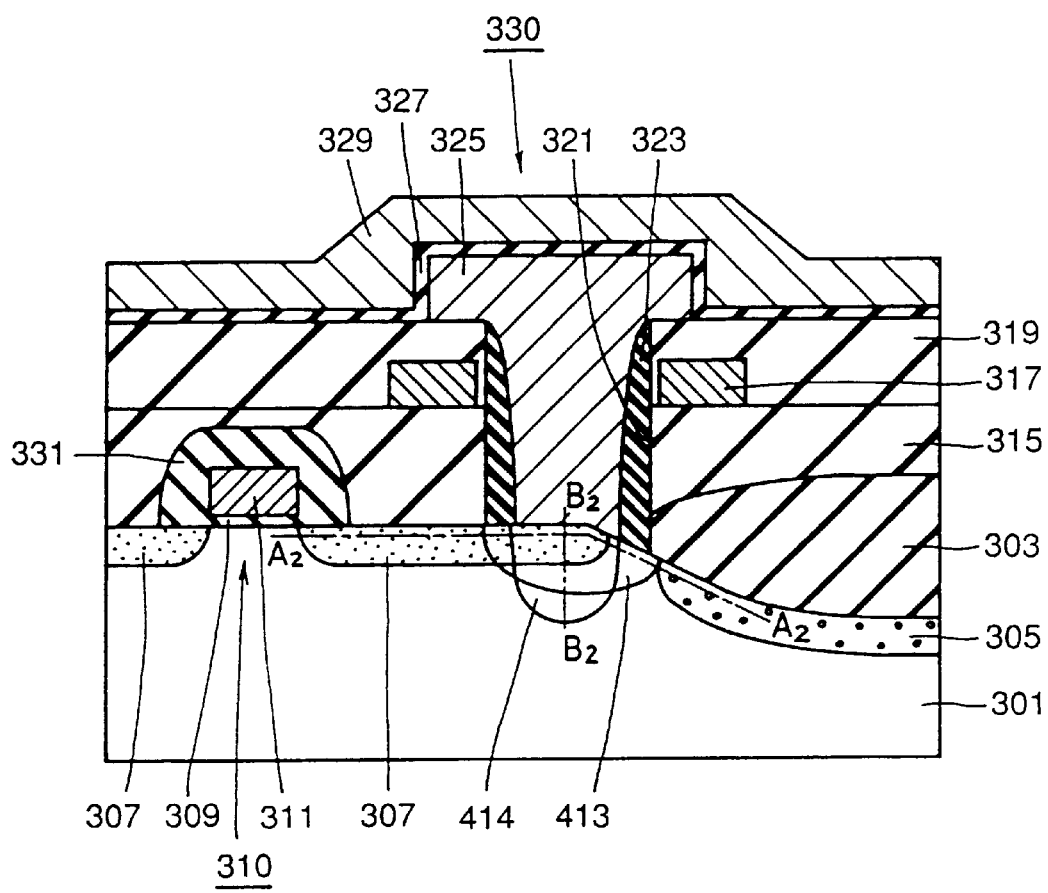
FIG. 65 is a schematic cross section showing a structure of a semiconductor device according Embodiment 6 of the invention.
Figure 66:
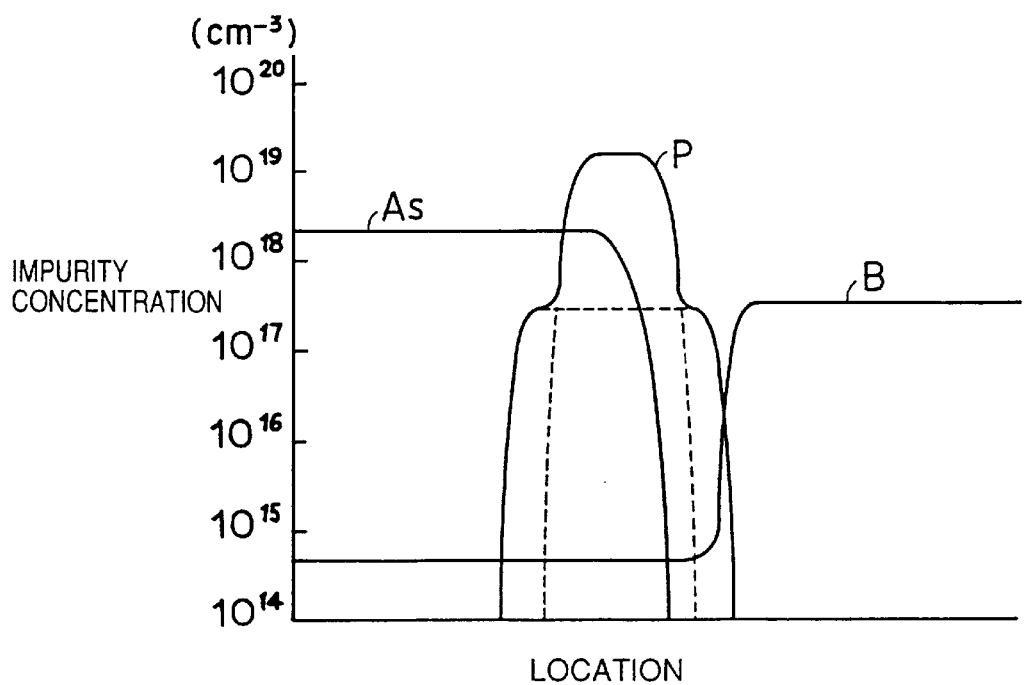
FIG. 66 is a graph showing a distribution of impurity concentration at various portions along line $A_2$—$A_2$ of FIG. 65.
Figure 67:
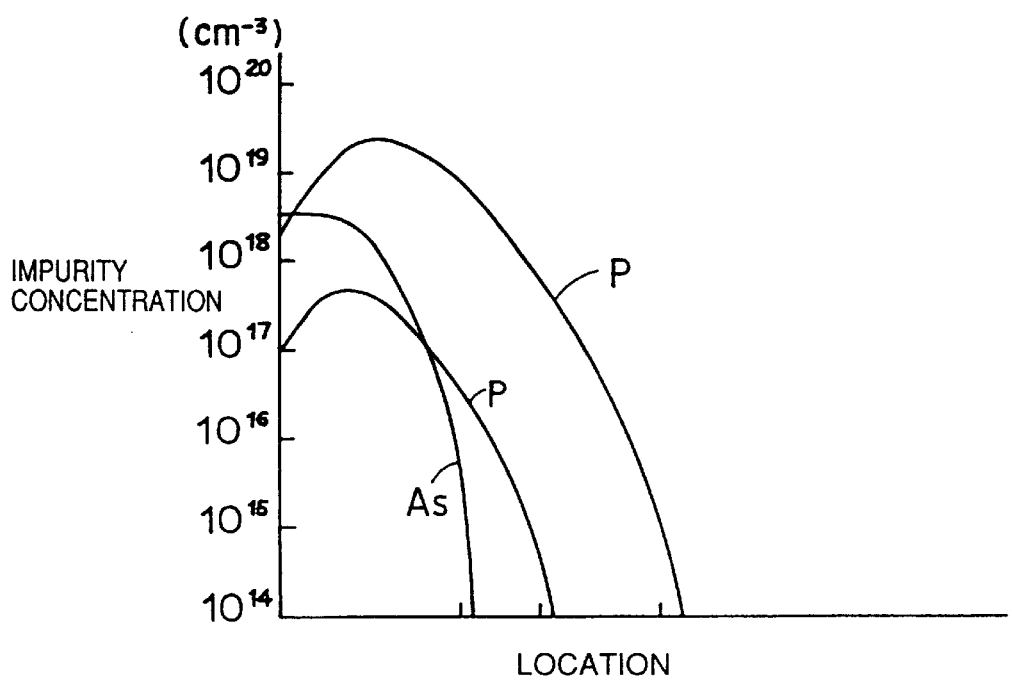
FIG. 67 is a graph showing a distribution of impurity concentration at various portions along line $B_2$—$B_2$ in FIG. 65.
Figure 68:
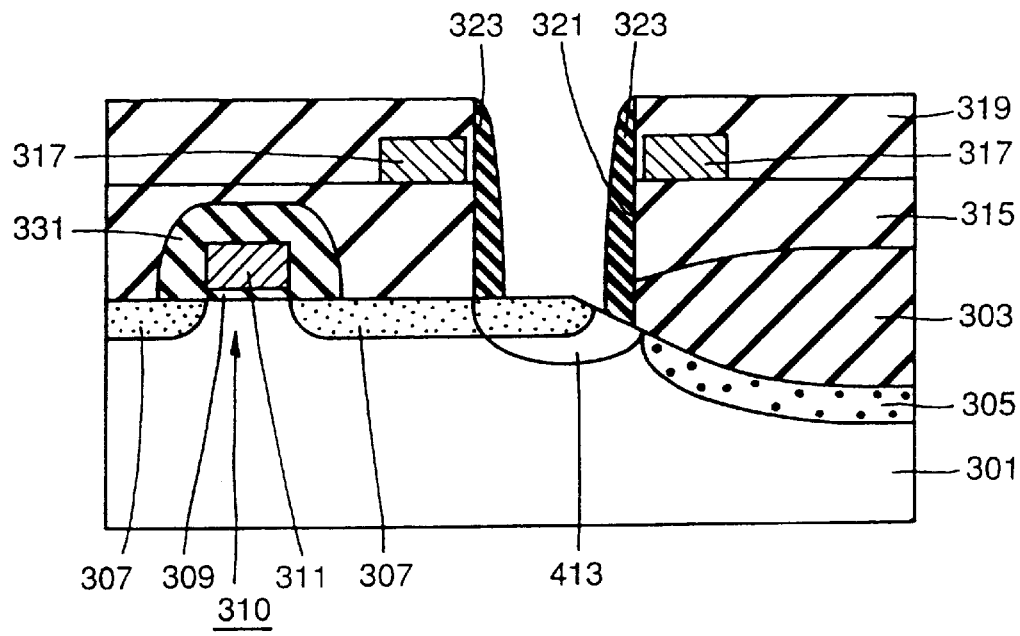
FIGS. 68 and 69 are schematic cross sections showing the process in the method of manufacturing the semiconductor device according to Embodiment 6 of the invention in the order of the steps performed.

Referring first to FIG. 65, a semiconductor device according to the present embodiment differs from the device of Embodiment 5 in that the concentration of n type impurity region 413 is different and that it additionally has an n type impurity region 414.

In particular, referring to FIGS. 65 to 69, an n type impurity region 413 contains phosphorous at a concentration not lower than $1 \times 10^{17}$ cm$^{-3}$ and not higher than $1 \times 10^{18}$ cm$^{-3}$. In addition, n type impurity region 414 is formed to cover the region which is in contact with a storage node 325 at the bottom wall of a contact hole 321. This n type impurity region 414 contains phosphorous at a concentration not lower than $1 \times 10^{18}$ cm$^{-3}$ and not higher than $1 \times 10^{20}$ cm$^{-3}$. That is, this n type impurity region 414 is formed such that it has a higher impurity concentration as compared to n type impurity region 313 of Embodiment 5.

Since other portions of the structure are substantially similar to those of Embodiment 5, the same components are denoted by the same reference characters and descriptions thereof are not given.

A method of manufacturing the semiconductor device according to the present embodiment will be described next.

In the manufacturing method according to the present embodiment, the same process as that of Embodiment 5 shown in FIGS. 51 to 60 is carried on first. Thereafter, referring to FIG. 68, ion implantation of phosphorous is performed entirely to the surface with an acceleration voltage of 60 keV and dose of $5 \times 10^{12}$ cm$^{-2}$. Thus, n type impurity region 413 is formed at the bottom surface of contact hole 321 in a self-aligned manner.

The condition for implanting this phosphorous ranges from 20 to 200 keV in acceleration voltage and $1 \times 10^{12}$ to $1 \times 10^{13}$ cm$^{-2}$ in dose, meaning that it is not limited to the above-described condition. Also, not only phosphorous but arsenic may also be applied as the impurity seed.

Thereafter, by performing a process similar to that of Embodiment 5, a side wall insulating layer 323 is formed at the side wall of contact hole 321.

Figure 69:
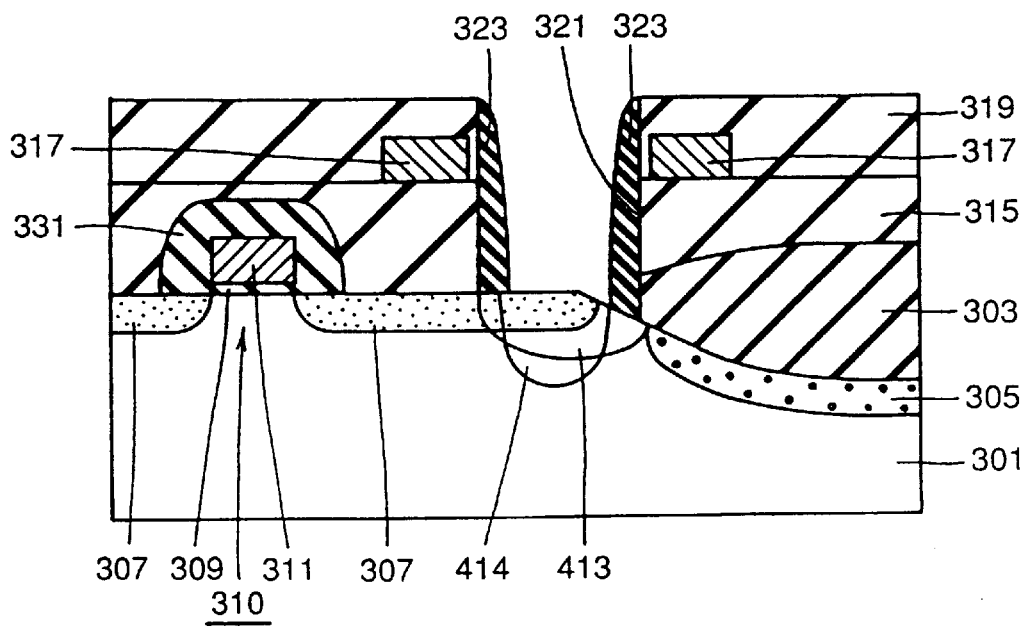

Referring to FIG. 69, an ion plantation of phosphorous is performed entirely to the surface at an acceleration voltage of 80 keV and dose of $5 \times 10^{14}$ cm$^{-2}$. As a result, n type impurity region 414 is formed at the bottom surface of contact hole 321 so as to cover the surface which is exposed from side wall insulating layer 323. This n type impurity region 414 has a region which partially overlaps n type source/drain region 307.

The above condition for implanting phosphorous ranges from 20 to 200 keV in acceleration voltage and $1 \times 10^{13}$ to $1 \times 10^{15}$ cm$^{-2}$ in dose, meaning that it is not limited to the condition described above. In addition, not only phosphorous but arsenic may also be applied as the impurity seed.

Thereafter, by performing the process as shown in FIGS. 63 and 64 according to Embodiment 5, the semiconductor device shown in FIG. 65 is manufactured.

As described above, in the present embodiment, n type impurity region 414 is newly added to the region which is in contact with storage node 325. This n type impurity region 414 has a relatively high impurity concentration as compared to n type impurity region 313 of Embodiment 5. Accordingly, the contact resistance between storage node 325 and n type impurity region 414 is reduced as compared to Embodiment 5.

Also, since n type impurity region 414 is provided, it is not necessary to set the concentration of impurity in n type impurity region 413 so high. The concentration of impurity can be set lower than in Embodiment 5. Accordingly, junction breakdown voltage at the junction portion of n type impurity region 413 and element isolation impurity region 305 can be improved. Therefore, it is possible to reduce the contact resistance with storage node 325 while improving the junction breakdown voltage.

Furthermore, the present embodiment has an effect other than what has been described above, which is similar to that of Embodiment 1.

Embodiment 7

Figure 70:
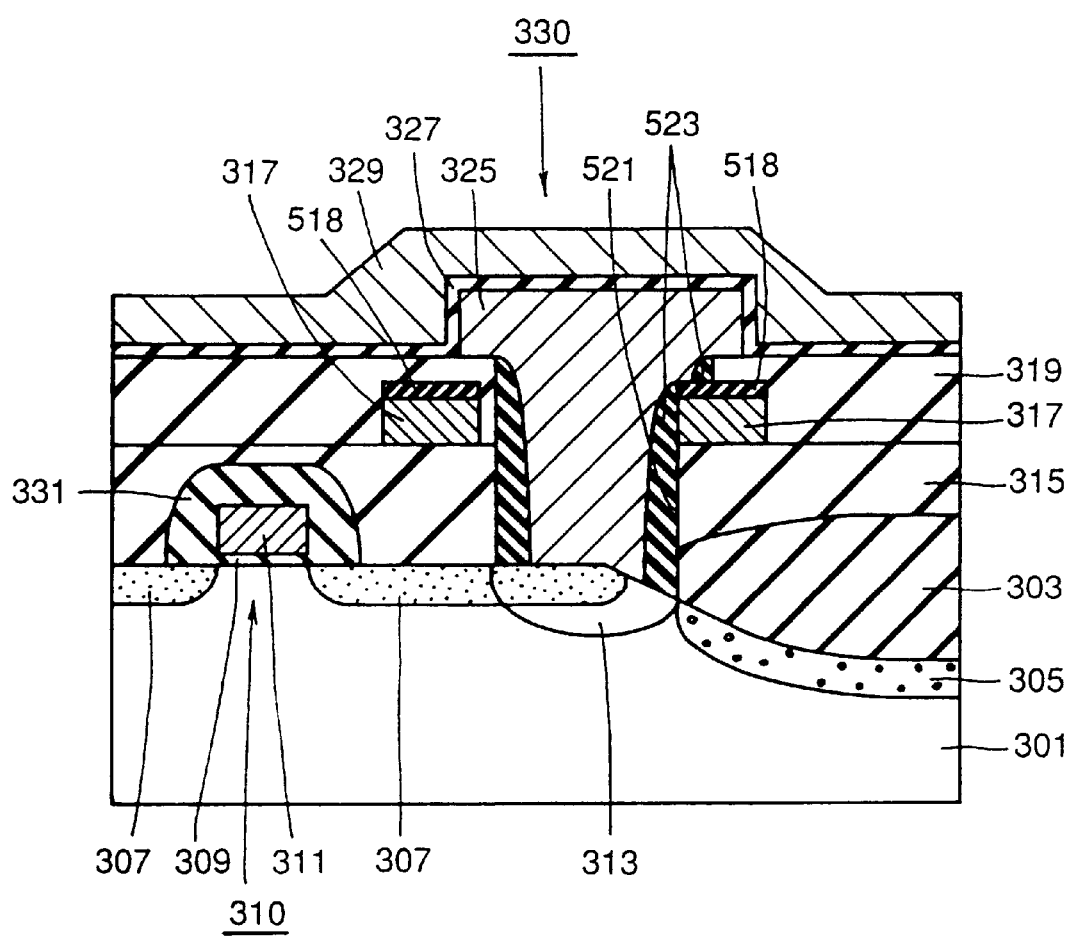
FIG. 70 is a schematic cross section showing a structure of a semiconductor device according to Embodiment 7 of the invention.

Referring to FIG. 70, a semiconductor device in accordance with the present embodiment differs from the device of Embodiment 5 in that it additionally has an etch stopping insulating layer 518. This etch stopping insulating layer 518 is formed on a bit line interconnection 317 and is formed of, for example, silicon nitride film.

The present embodiment also shows a structure in which the side wall of bit line interconnection 317 faces the side wall of a contact hole 521, and contact hole 521 reaches a portion of the upper surface of etch stopping insulating layer 518. In such a structure, the structure of a side wall insulating layer 523 formed at the side wall of contact hole 521 differs slightly from side wall insulating layer 323 of Embodiment 5.

Since the other portions of the structure are substantially similar to those of Embodiment 5, the same components are denoted by the same reference characters and descriptions thereof are not given.

A method of manufacturing the semiconductor device according to the present embodiment will now be described.

Figure 71:
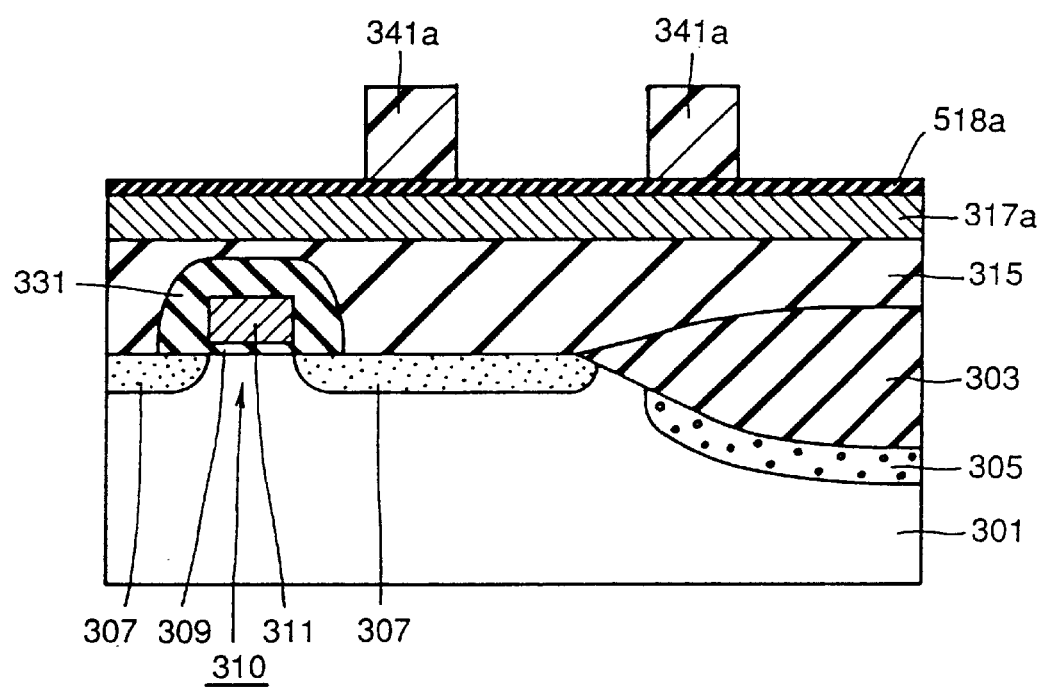
FIGS. 71–79 are schematic cross sections showing the process in the method of manufacturing the semiconductor device according to Embodiment 7 of the invention in the order of the steps performed.
Figure 72:
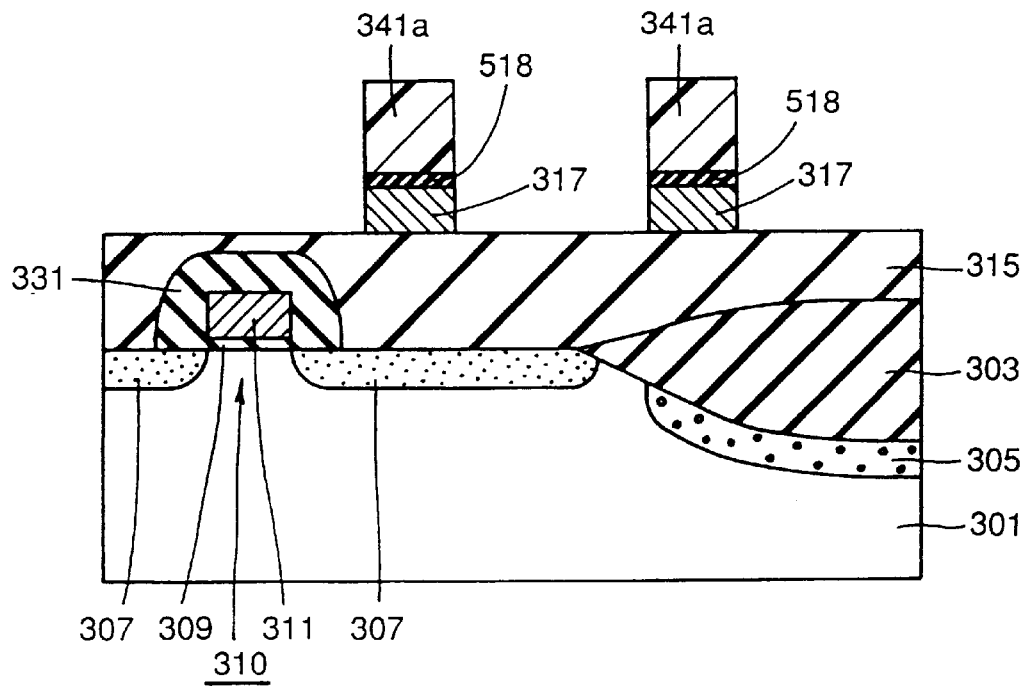

In the manufacturing method of the present embodiment, a process similar to that of Embodiment 5 shown in FIGS. 51 to 55 is carried on. Thereafter, referring to FIG. 71, a conductive layer 317a is formed on a first interlayer insulating layer 315. A silicon nitride film 518a, for example, is formed on this conductive layer 317a. On silicon nitride film 518a, a resist pattern 341a having a desired shape is formed by photolithography. Using this resist pattern 341a as a mask, silicon nitride film 518a and conductive layer 317a are subjected to an anisotropical dry etching by RIE or the like. Referring to FIG. 72, bit line interconnections 317 are formed from the conductive layer by this etching. Then, resist pattern 341a is removed either by ashing in plasma of oxygen ($O_2$) atmosphere or dipping into $H_2SO_2$ solution.

Figure 73:
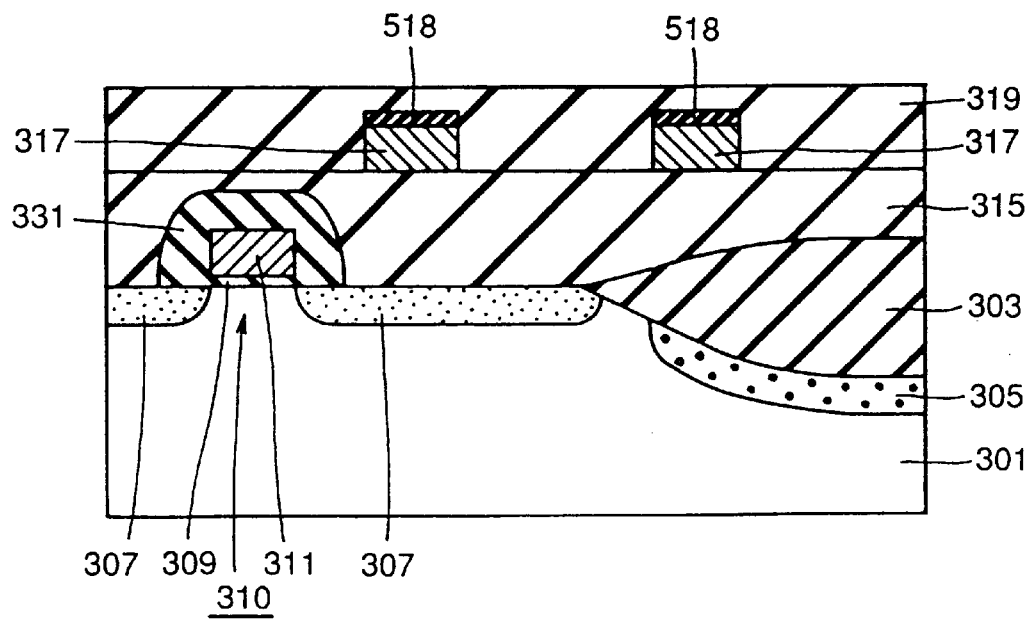

Referring to FIG. 73, a second interlayer insulating layer 319 of silicon oxide film or silicon nitride film is formed by CVD to cover bit line interconnections 317 and insulating layers 518. The upper surface of this second interlayer insulating layer 319 can be made relatively flat by methods such as depositing a thick film and then making it thinner to obtain a desired thickness or heating the film after it is deposited.

Figure 74:
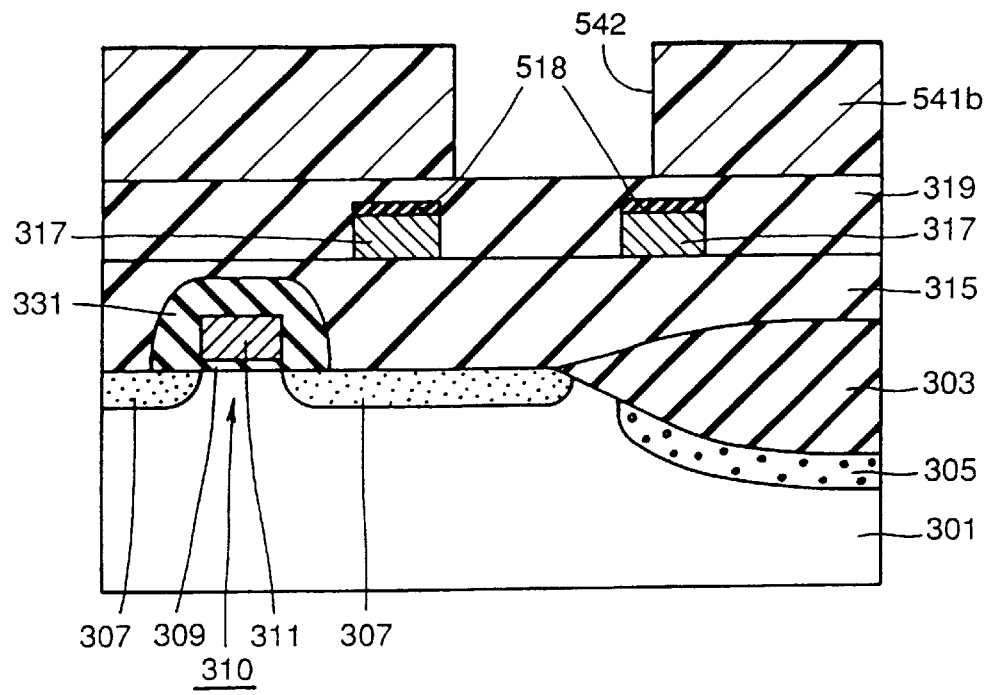

Referring to FIG. 74, a resist pattern 541b is formed on second interlayer insulating layer 319 by photolithography. At this time, a hole pattern 542 of resist pattern 541b may be located above bit line interconnection 317. Using this resist pattern 541b as a mask, second interlayer insulating layer 319 is first subjected to an anisotropical dry etching by RIE.

Figure 75:
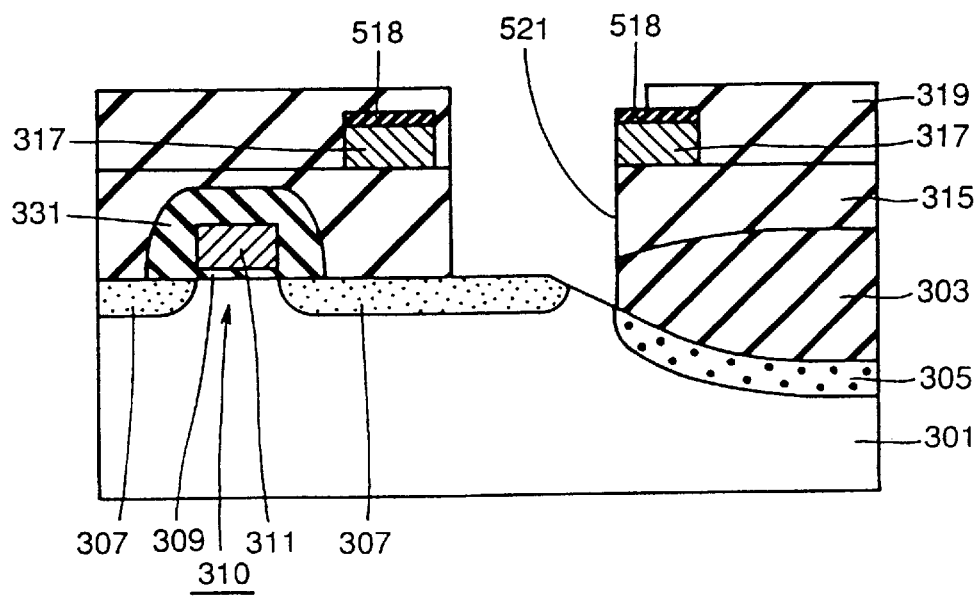

Referring to FIG. 75, this etching is performed by, for example, magnetron RIE apparatus in mixed gas of $CHF_3$ and CO plasma atmosphere. This method is shown in, for example, Proceedings of Spring Seminar of the Japan Society of Applied Physics, 1994, 29p-ZF-2 p. 537. By this method, an etching selectivity of 17 to 20 is obtained for silicon oxide film ($SiO_2$)/ silicon nitride film ($Si3N_4$) when the amount of CO added is set at 80%.

For example, if the etching depth measured from the point where contact hole 521 has reached the upper surface of etch stopping insulating layer 518 to the point where it reaches p type silicon substrate 301 is about 1.0 μm, and if the etching selectivity is 17, the thickness required for this insulating layer 518 is only about 0.06 to 0.07 μm. That is, when etch stopping insulating layer 518 is of this thickness, the upper surface of bit line 317 is not exposed by the etching performed when contact hole 521 is formed.

Also, the combination of high density plasma RIE apparatus and $C_2F_6$ gas as shown in the Monthly Semiconductor World 1993. 10, pp.68–75 may also provide an etching selectivity of 20 for silicon oxide film/silicon nitride film.

Figure 76:
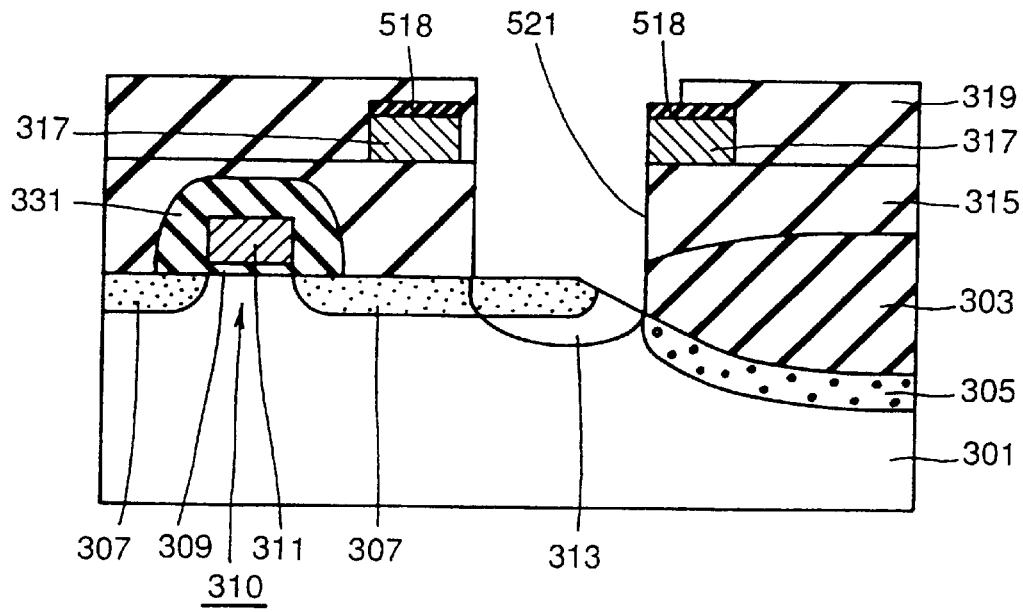

By performing the etching as described above, contact hole 521 is formed at first and second interlayer insulating layers 315 and 319. This contact hole 521 exposes the side wall of bit line 317 from its side wall and reaches the upper surface of insulating layer 518. Also, formation of this contact hole 521 has removed the end portion of element isolation oxide film 303. Referring to FIG. 76, ion implantation of phosphorous is performed entirely to the surface at an acceleration voltage of 70 keV and dose of $8\times10^{13}$ $cm^{-2}$. As a result, an n type impurity region 313 is formed at the bottom surface of contact hole 521 in a self-aligned manner. This n type impurity region 313 has a region which partially overlaps n type source/drain region 307 and is formed to be in contact with element isolation impurity region 305.

Figure 77:
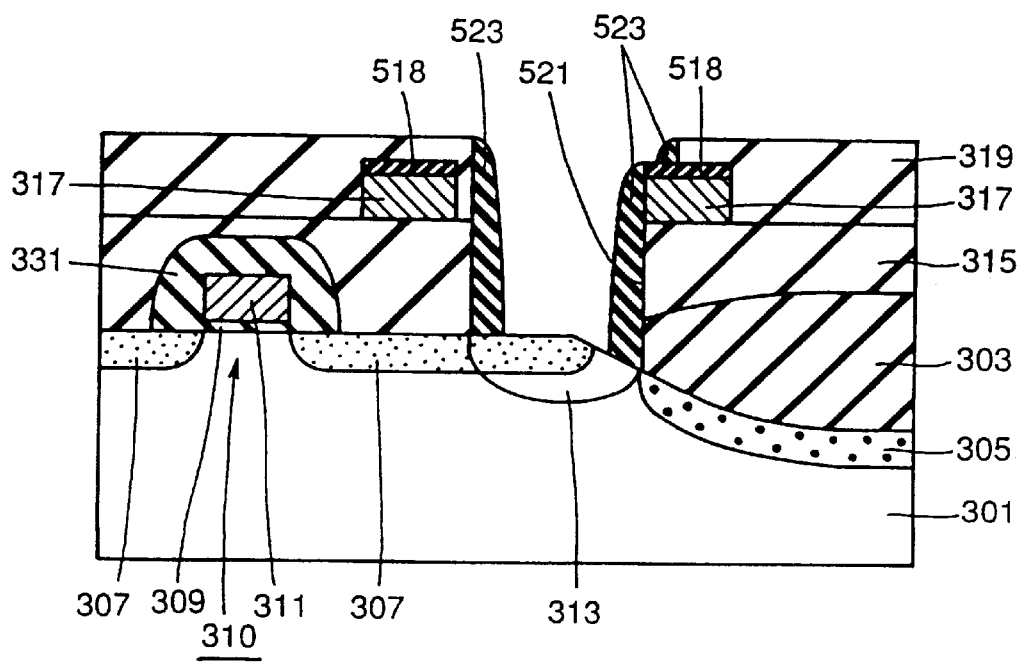

Referring to FIG. 77, an insulating film of silicon oxide film, silicon nitride film or the like is formed, and on the entire surface of this insulating film, an anisotropical dry etching is performed by, for example, RIE. Thus, a side wall insulating layer 523 is formed on the side wall of contact hole 521. This side wall insulating layer 523 covers the side wall of bit line interconnection 317 which has been exposed at the side wall of contact hole 521.

Figure 78:
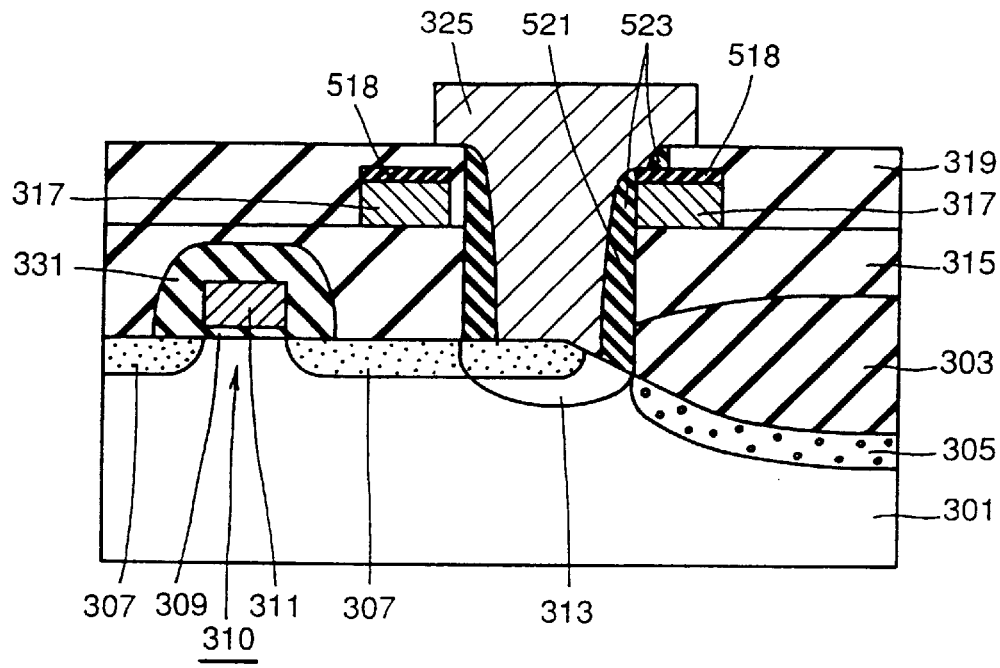

Referring to FIG. 78, a conductive layer including doped polycrystalline silicon or metal such as Al, W, Ti, Pt, Cu, Ag or alloys thereof is formed. On this conductive layer, a resist pattern (not shown) having a desired shape is formed by photolithography. Using this resist pattern as a mask, the conductive layer is subjected to etching by RIE or the like. Thus, a storage node 325 is formed, which storage node 325 being electrically connected to n type source/drain region 307 via contact hole 521 and extends over second interlayer insulating layer 319. Thereafter, the resist pattern is removed.

Figure 79:
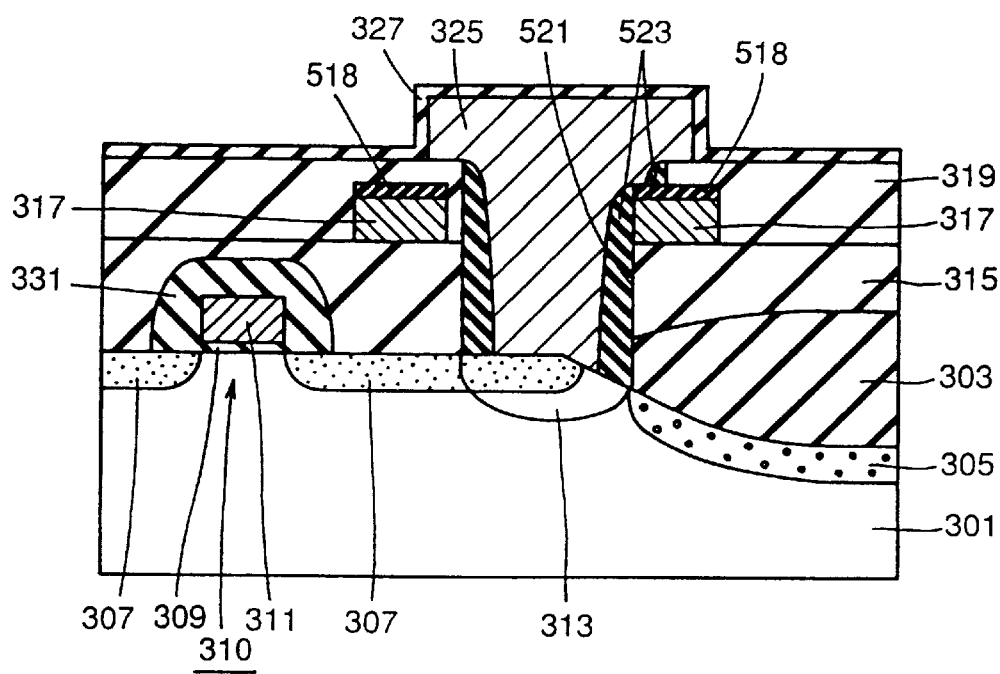

Referring to FIG. 79, a capacitor dielectric film 327 is formed to cover the surface of storage node 325. Then, a conductive layer including doped polycrystalline silicon or metal such as Al, W, Ti, Pt, Cu, Ag or alloys thereof is formed. On this conductive layer, a resist pattern (not shown) having a desired shape is formed by photolithography. Using this resist pattern as a mask, the conductive layer is subjected to etching by RIE or the like, and a cell plate 329 as shown in FIG. 70 is formed.

Storage node 325, capacitor dielectric film 327, and cell plate 329 constitute a capacitor 330.

As described above, in the present embodiment, etch stopping insulating layer 518 is provided on bit line interconnection 317. This etch stopping insulating layer 518 is formed of a material which has a different under etching characteristics as compared to first and second interlayer insulating layers 315 and 319. Accordingly, when etch stopping insulating layer 518 is subjected to etching for forming contact hole 521 in the first and second insulating layers, this insulating layer 518 is hardly etched. Thus, exposure of the upper surface of bit line interconnection 317 from contact hole 521 is prevented even when contact hole 521 is formed above bit line interconnection 317 owing to overlay layer of the mask or the like. Accordingly, occurrence of short-circuit between storage node 325 and bit line interconnection 317 is prevented.

Figure 80:
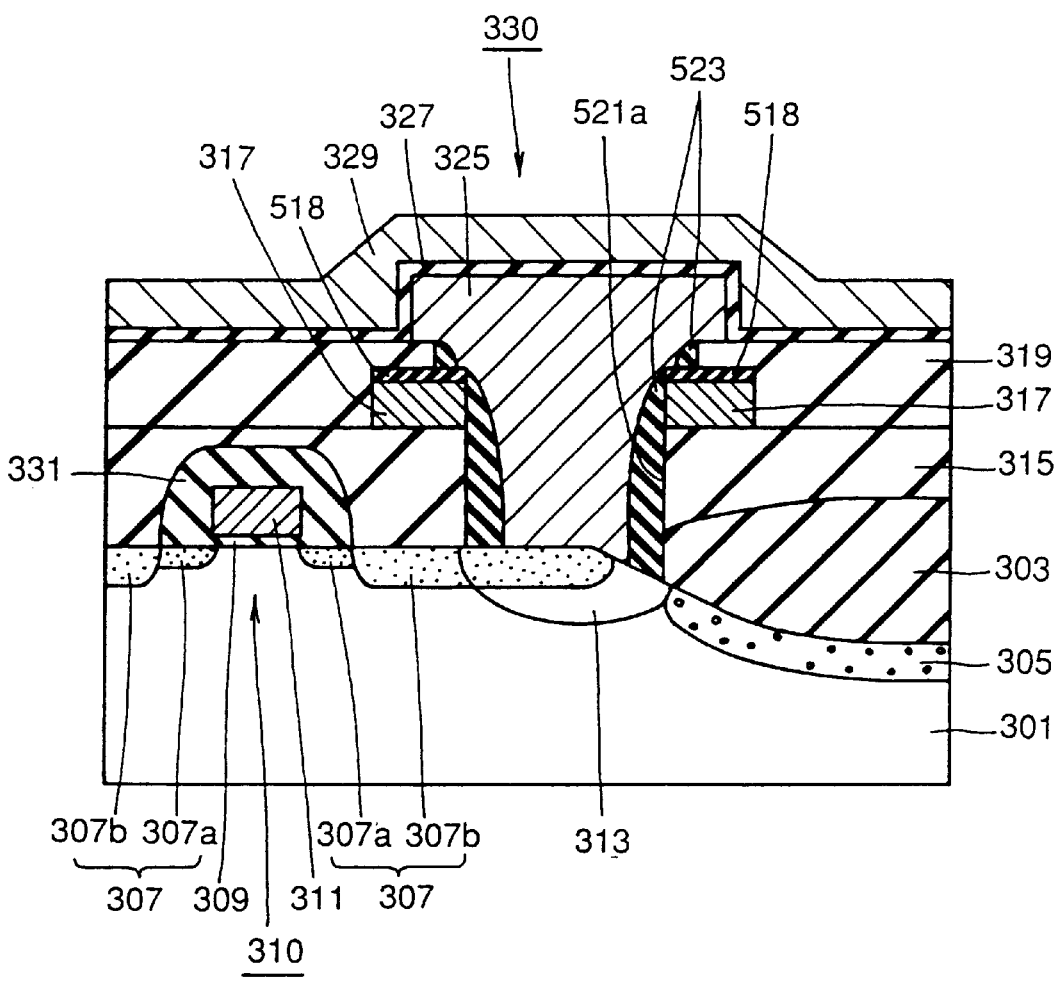
FIG. 80 is a schematic cross section showing how the side walls of both of the paired bit line interconnections are exposed from a contact hole.
Figure 81:
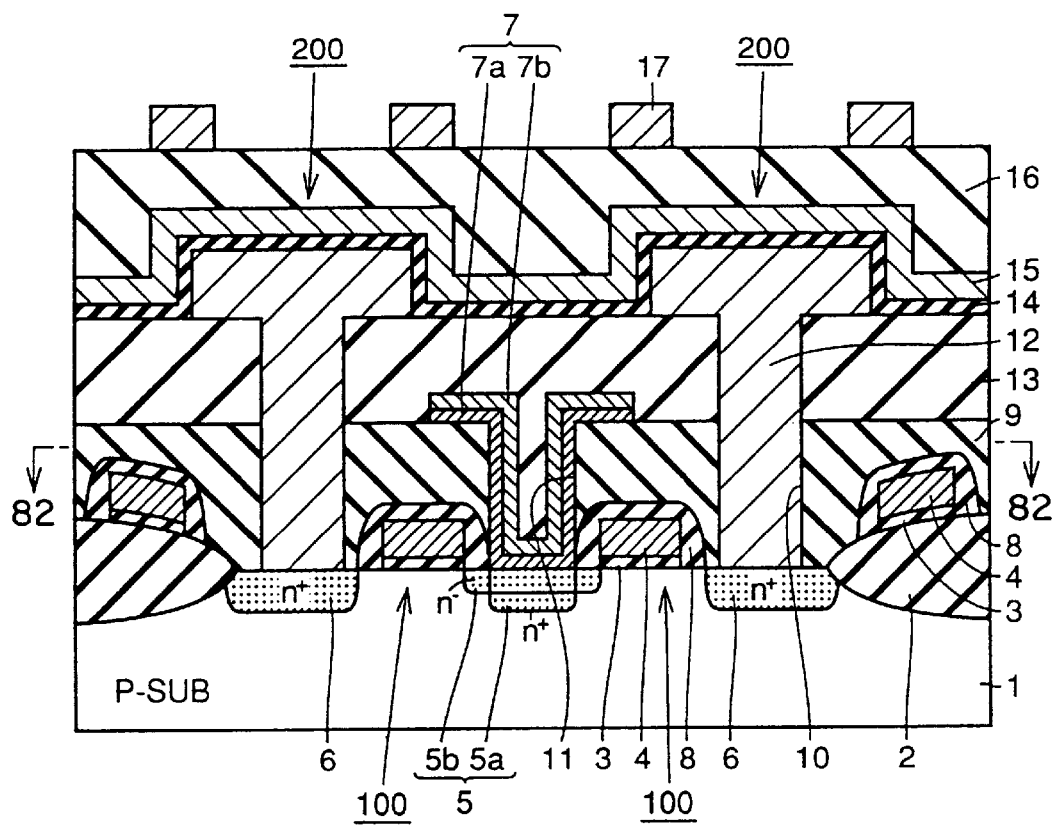
FIG. 81 is a cross section showing a semiconductor device in the prior art.
Figure 82:
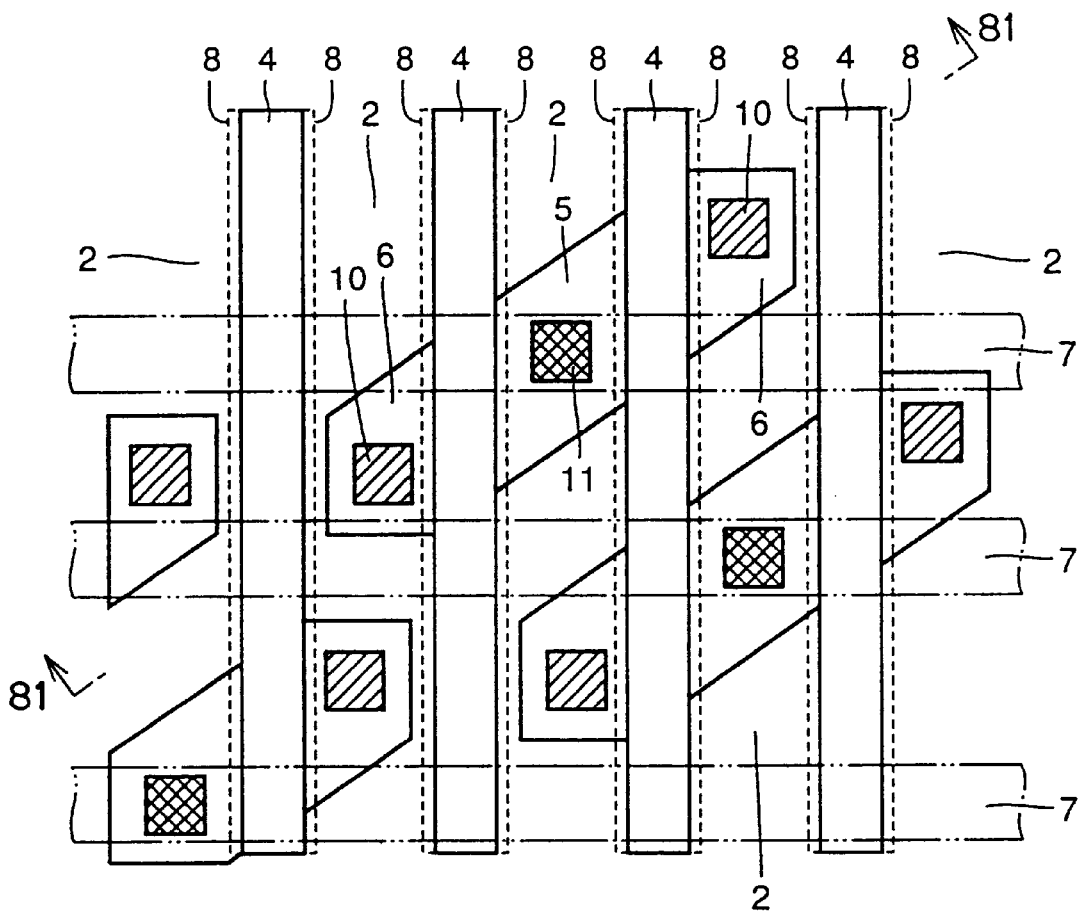
FIG. 82 is a plan showing the semiconductor device in the prior art.
Figure 83:
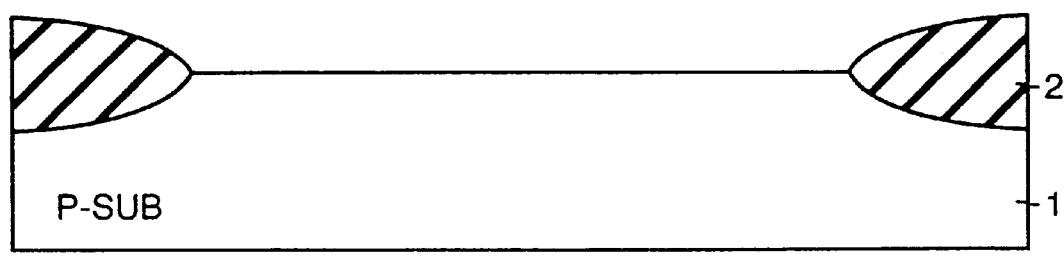
FIGS. 83–94 show 1st to 12th steps in a method of manufacturing the semiconductor device in the prior art, respectively.
Figure 84:
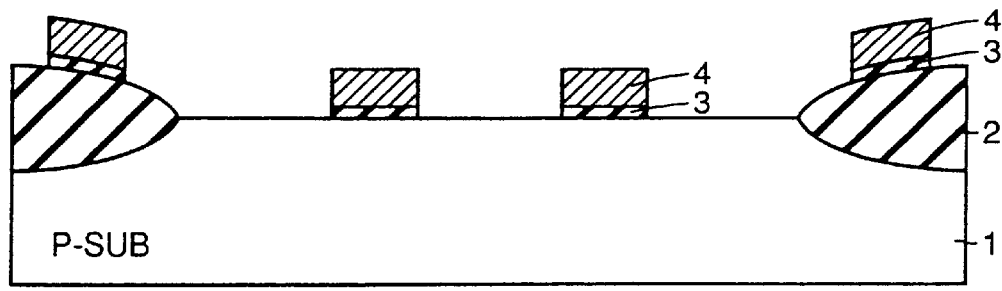
Figure 85:
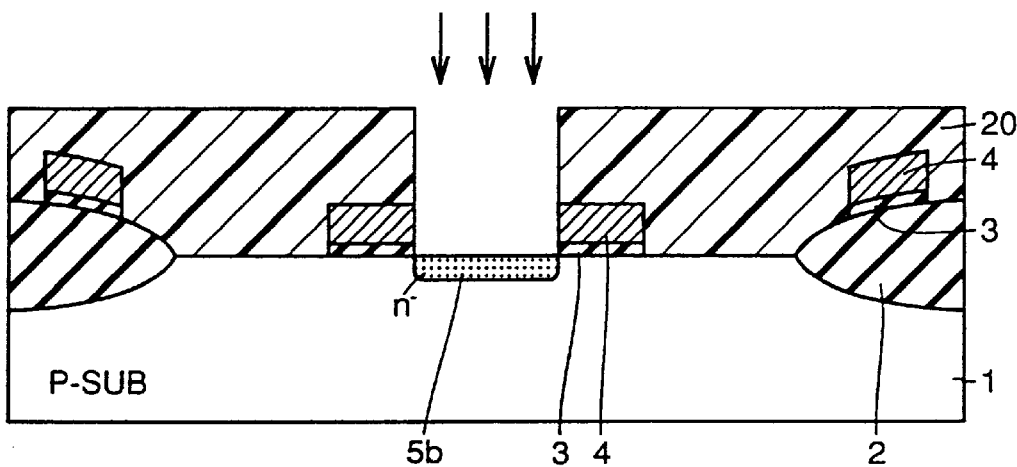
Figure 86:
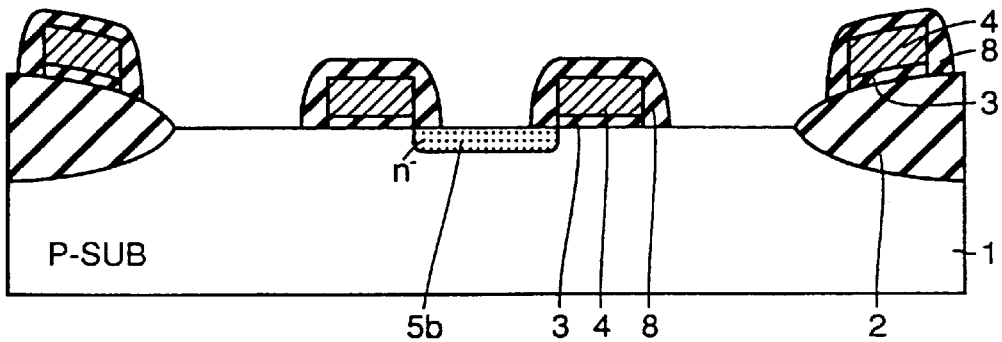
Figure 87:
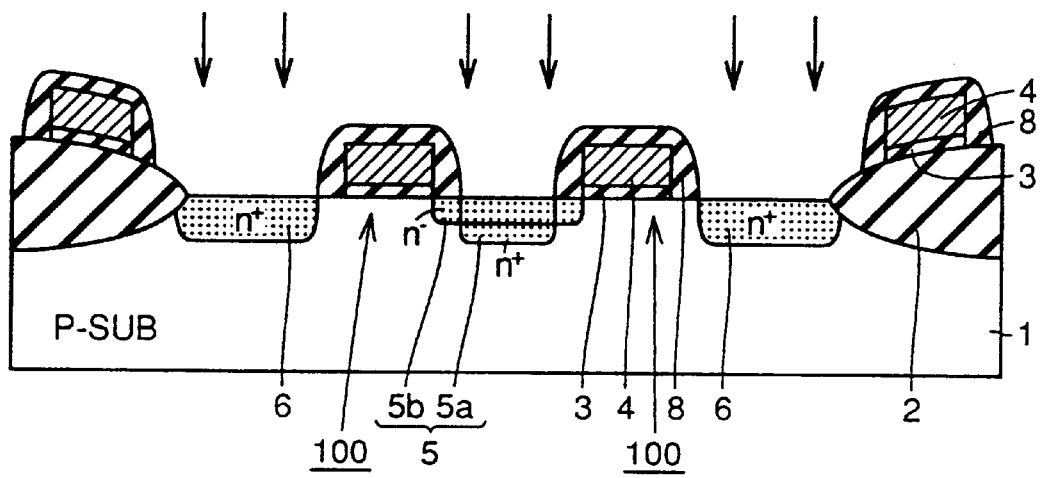
Figure 88:
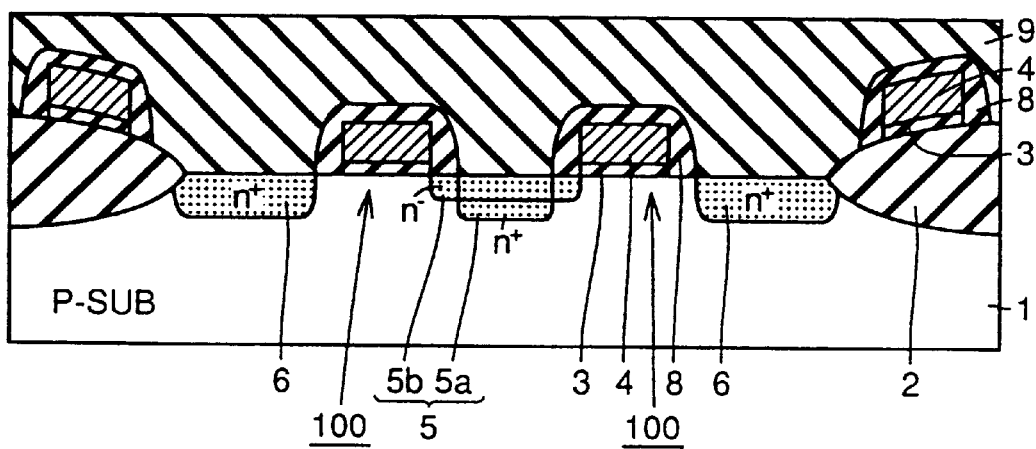
Figure 89:
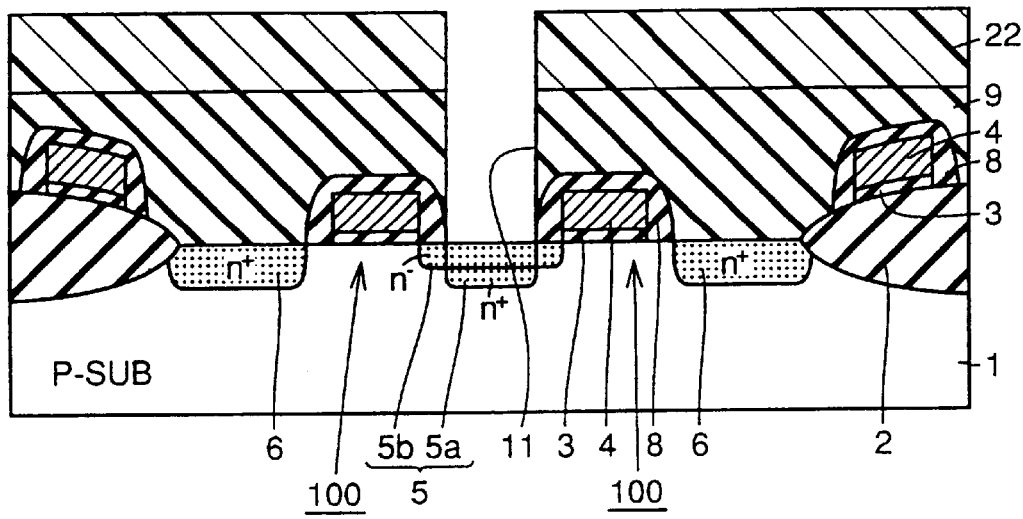
Figure 90:
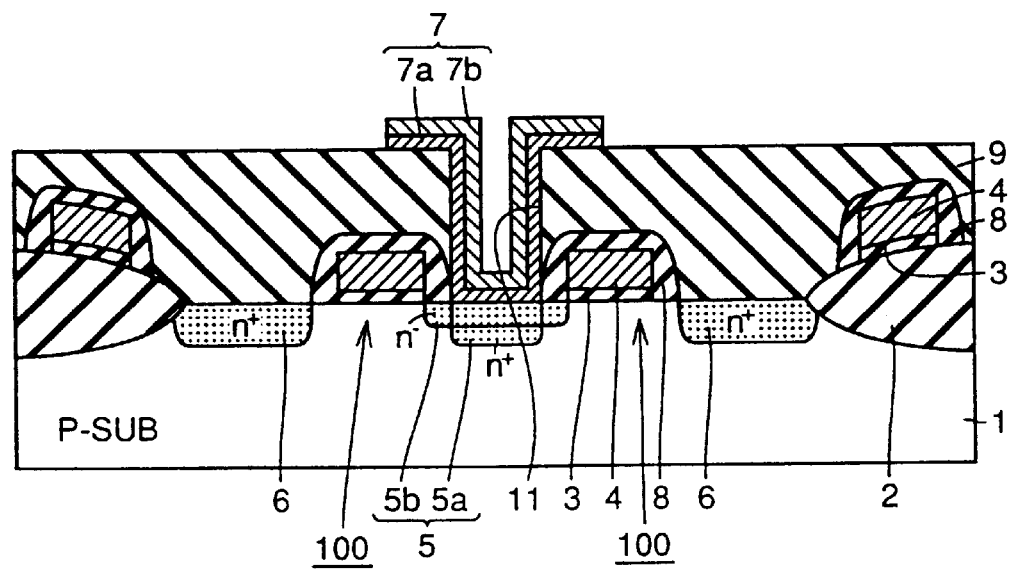
Figure 91:
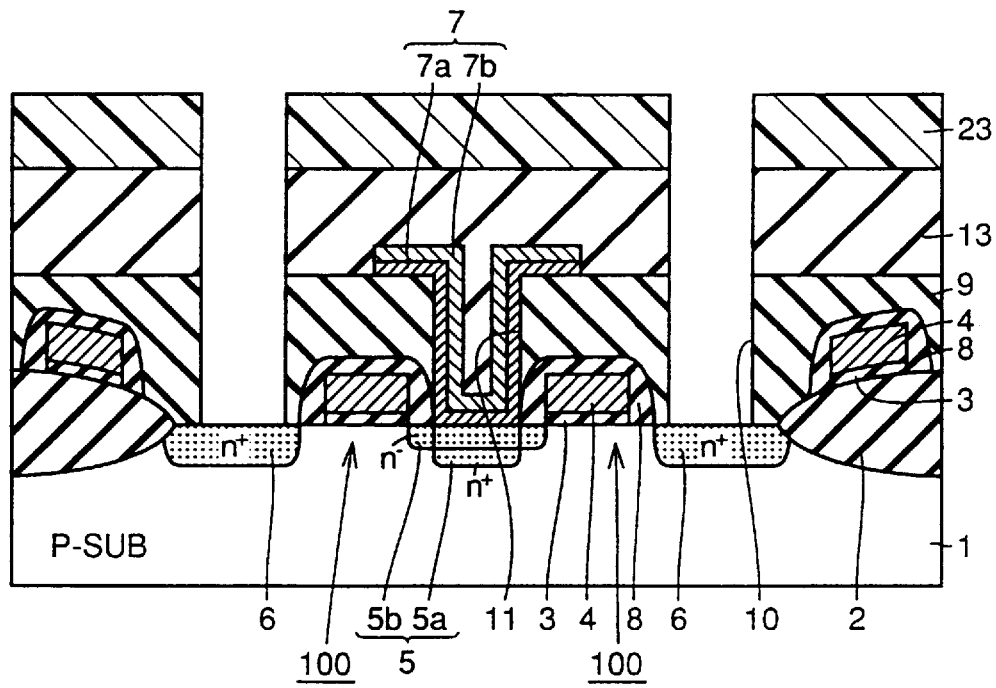
Figure 92:
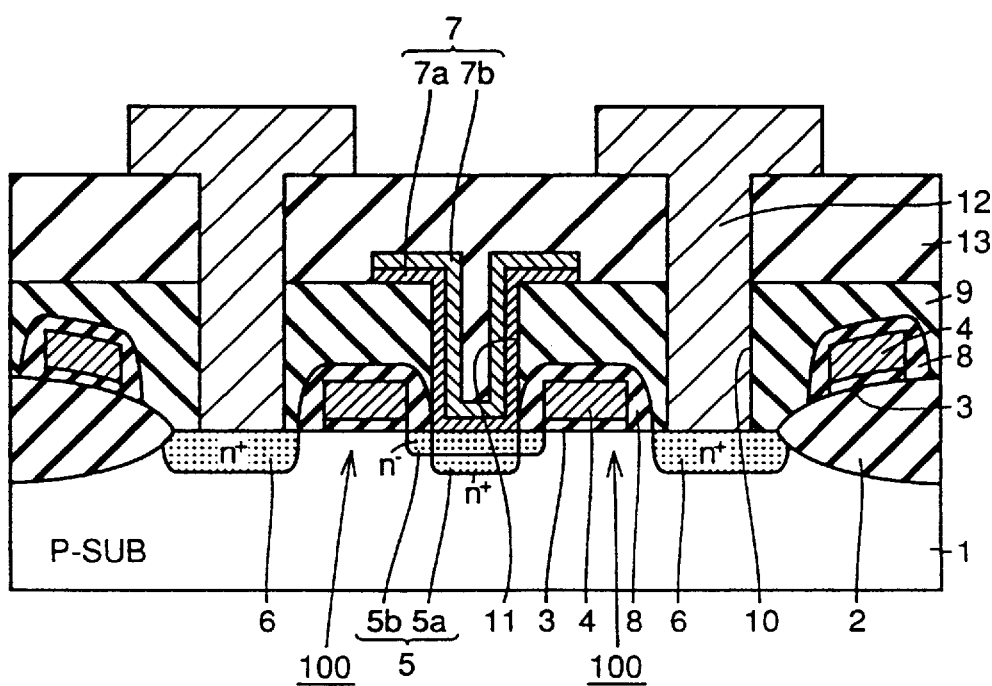
Figure 93:
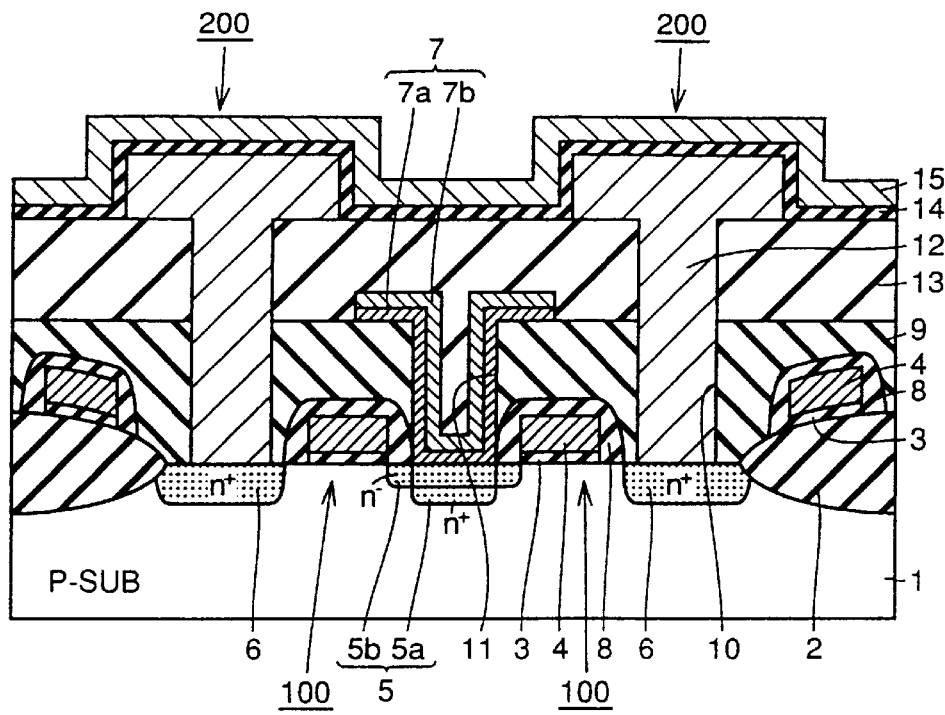
Figure 94:
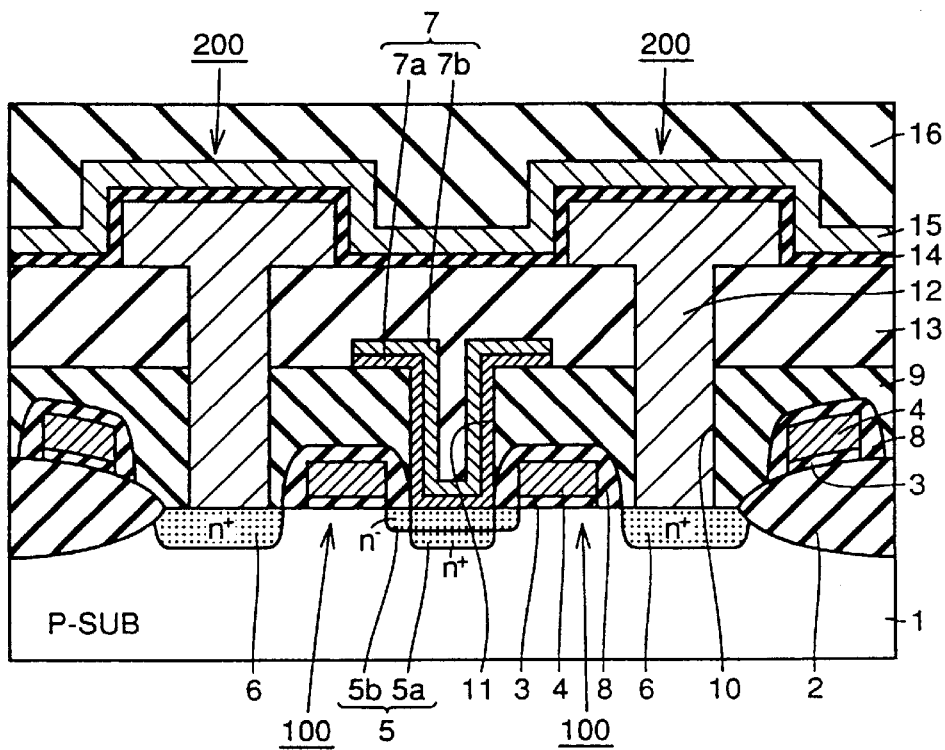
Figure 95:
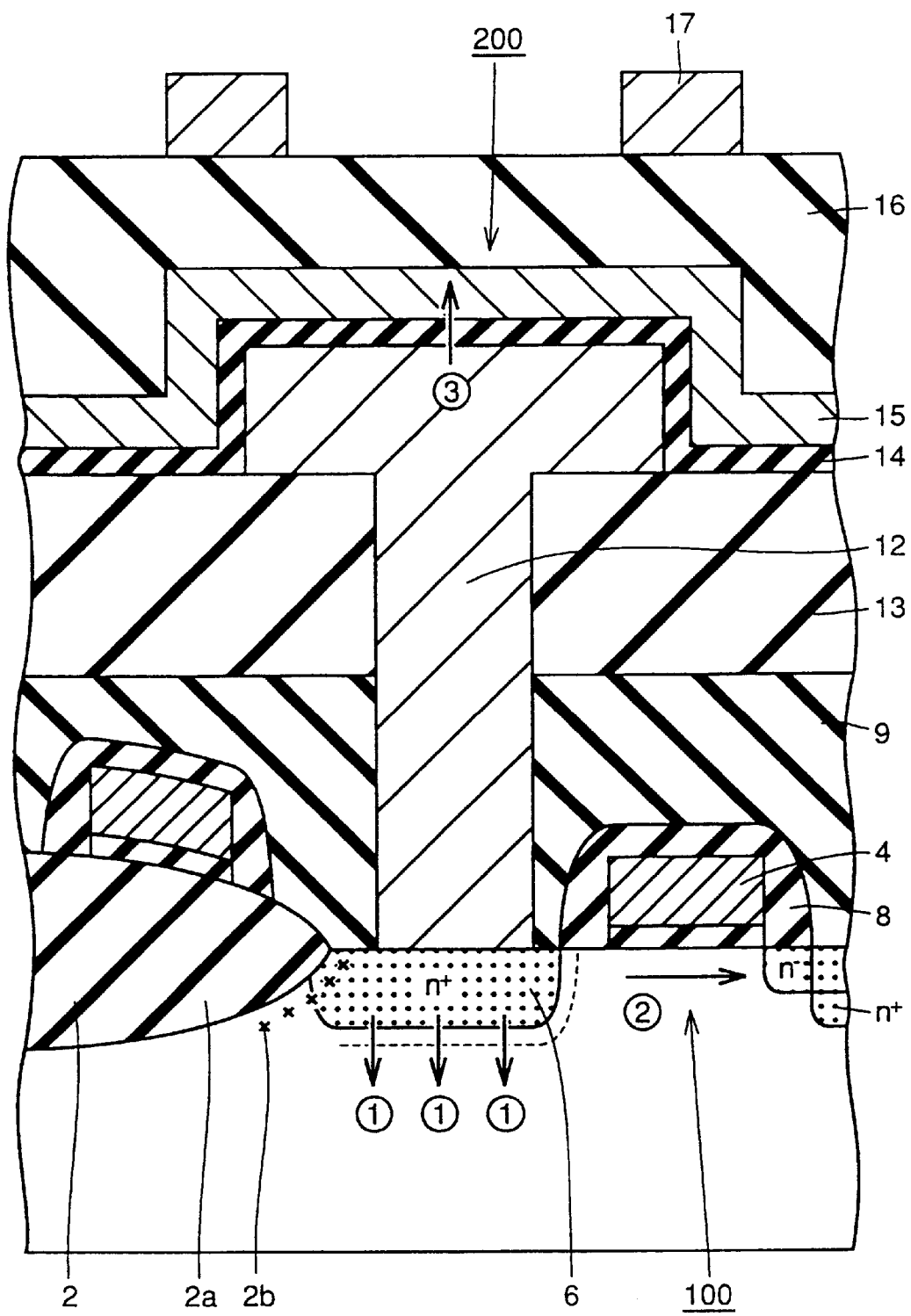
FIG. 95 schematically shows a disadvantage of the semiconductor device in the prior art.

In this embodiment, description was made on an example in which the side wall of either one of the paired bit line interconnections 317 and 317 faces the side wall of contact hole 521, but the side walls of both of the paired bit line interconnections 317, 317 may face the side wall of contact hole 521a, as shown in FIG. 80. In this case also, the side walls of both of the paired bit line interconnections 317, 317 are covered by side wall insulating layer 523. Thus, short-circuit between bit line interconnection 317 and storage node 325 is prevented.

Also, in this embodiment, description is made on an example in which silicon nitride film is employed as etch stopping insulating layer 518, but etch stopping insulating layer 518 may be of any material as long as sufficient etching selectivity is ensured with first and second interlayer insulating layers 315, 319.

In addition, etch stopping conductive layer 518 is not limited to one-layered structure but may be of a stacked structure of multiple layers. In this case, the upper layer is of a conductive material (such as doped polycrystalline silicon, TiSi, WSi, TiN or the like) and can ensure the etching selectivity with first and second interlayer insulating layers 315, 319. The lower layer may be of a material which can ensure an insulation like an oxide film.

Furthermore, in Embodiments 5 to 7, description was made on configurations in which source/drain region 7 of nMOS transistor 10 is not of an LDD (Lightly Doped Drain) structure, but it may be of a LDD structure as shown in FIG. 80. That is, n type source/drain region 307 is of a two-layered structure including $n^-$ impurity diffusion region 307a and $n^+$ impurity diffusion region 307b.

When such LDD structure is applied, a condition for performing an ion implantation at a higher concentration when forming n type source/drain region 307 is also considered. Such condition of ion implantation for forming an impurity region which constitute an LDD structure ranges from 30 to 80 keV in acceleration voltage and $5\times10^{14}$ to $1\times10^{16}$ $cm^{-2}$ in dose. Furthermore, not only arsenic but also phosphorous may also be applied as the impurity seed.

Although description was made on an nMOS transistor in which silicon oxide film was adopted as gate insulating layer in Embodiments 1 to 7, the gate insulating layer is not limited to silicon oxide film. It may be of any material as long as it is an insulating layer. Accordingly, transistor 10 is not limited to an MOS transistor but may also be an MIS (Metal Insulation Semiconductor) transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor substrate of a first conductivity type having a main surface;

an isolation insulating layer formed to surround an active region of said main surface;

a first conductive layer formed in said active region on said main surface with an insulating layer interposed;

a first impurity region of a second conductivity type formed at the main surface between said isolation insulating layer and said first conductive layer;

a first insulating layer formed on said main surface to cover said first conductive layer and having a first hole reaching said first impurity region;

a pair of second conductive layers formed on said first insulating layer on both sides of said first hole;

a pair of etch stopping insulating layers formed on said pair of second conductive layers respectively;

a second insulating layer covering said second conductive layer and said etch stopping insulating layers, having a second hole reaching said first hole and formed of a material different from said etch stopping insulating layers;

a sidewall insulating layer covering at least a sidewall of said first hole;

a third conductive layer electrically connected to said first impurity region through said first and second holes;

an element isolating impurity region of the first conductivity type formed in said semiconductor substrate to be in contact with a lower surface of said isolation insulating layer;

a second impurity region of the second conductivity type having a portion overlapping with said first impurity region positioned at a bottom surface of said first hole, and formed to be in contact with said element isolating impurity region; and a third impurity region of the second conductivity type formed at the main surface of said semiconductor substrate to cover that region of said semiconductor substrate which is in contact with said third conductive layer at the bottom surface of said first hole and to be electrically connected to said first impurity region; wherein, said third impurity region contains phosphorus at an impurity concentration higher than that of second impurity region; and said first impurity region contains arsenic and said second impurity region contains phosphorus.

2. The semiconductor according to claim 1, having a field effect transistor with a pair of source/drain regions, and said first impurity region is said source/drain region.

3. The semiconductor device according to claim 1, wherein a side surface of said second conductive layer forms a part of an inner wall surface of said second hole.

4. The semiconductor device according to claim 1, wherein said second conductive layer is a bit line.

5. The semiconductor device according to claim 1, having a capacitor having a lower electrode layer and an upper electrode layer insulated from each other; wherein said third conductive layer is said lower electrode layer.

* * * * *